United States Patent
Hashimoto

(10) Patent No.: US 7,149,609 B2
(45) Date of Patent: Dec. 12, 2006

(54) VEHICULAR ELECTRONIC CONTROL UNIT

(75) Inventor: Kohji Hashimoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 263 days.

(21) Appl. No.: 10/891,525

(22) Filed: Jul. 15, 2004

(65) Prior Publication Data

US 2005/0156580 A1 Jul. 21, 2005

(30) Foreign Application Priority Data

Jan. 15, 2004 (JP) ............................ P2004-008439

(51) Int. Cl.
- G05D 1/00 (2006.01)
- G05D 3/00 (2006.01)
- G05F 5/00 (2006.01)
- B60L 1/00 (2006.01)

(52) U.S. Cl. ............................ 701/1; 701/22; 701/102; 323/299

(58) Field of Classification Search ................ 323/266, 323/268, 271, 299, 303, 350, 351; 701/1, 701/22, 36, 102, 115; 191/2, 6; 123/319, 123/396
See application file for complete search history.

(56) References Cited

U.S. PATENT DOCUMENTS 4,843,555 A * 6/1989 Hattori et al. ............... 701/110
4,926,330 A * 5/1990 Abe et al. ..................... 701/33
5,757,605 A * 5/1998 Furukawa .................... 361/154
6,789,533 B1 * 9/2004 Hashimoto et al. ......... 123/672
6,985,074 B1 * 1/2006 Li ............................... 340/435
7,031,822 B1 * 4/2006 Hashimoto et al. ......... 701/103

FOREIGN PATENT DOCUMENTS

| JP | 10-169500 A | 6/1998 |
| JP | 11-214996 A | 8/1999 |
| JP | 2000-013227 A | 1/2000 |

* cited by examiner

Primary Examiner—Matthew V. Nguyen
(74) Attorney, Agent, or Firm—Sughrue Mion, PLLC

(57) ABSTRACT

A voltage generated by a variable analog signal source is input to first and second input terminals of a multi-channel A/D converter via an analog signal input circuit including an analog switch and first and second amplifiers, and a resulting digital conversion value is written to a data memory via a microprocessor. Digital conversion values corresponding to voltages at the first and second input terminals that are obtained when the analog switch is opened are stored as first and second error voltages and used for producing first and second correction voltages, respectively. When the input voltage is low, a value obtained by dividing, by a compensation gain, a second correction voltage corresponding to a second input voltage that is produced by the second amplifier and input to the second input terminal as an enlarged range input terminal is selected.

20 Claims, 18 Drawing Sheets

VEHICULAR ELECTRONIC CONTROL UNIT

BACKGROUND OF THE INVENTION

1. Field of the Invention

The present invention relates to a vehicular electronic control unit for an automobile or the like. In particular, the invention relates to an improved vehicular electronic control unit in which the accuracy is increased in a low voltage range or a particular intermediate zone for part of many analog signals by using a multi-channel A/D converter having an ordinary resolution.

2. Description of the Related Art

Vehicular electronic control units handle many analog signals. For example, analog signals are converted by two 16-channel A/D converters having a resolution of 10 bits into digital signals, which are input to a microprocessor for 16-bit or 32-bit computation.

However, there is a problem that the resolution of 10 bits cannot provide sufficient accuracy for part of the analog signals. Using high-resolution multi-channel A/D converters to solve this problem is excessive for ordinary analog signals that do not require high accuracy, and is also costly.

To solve this problem, JP-A-2000-13227 (patent document 1, paragraphs 0006-0011 and FIGS. 1–7) discloses a technique of increasing the accuracy of A/D conversion efficiently by using both of a first A/D converter covering all the voltage range and a second A/D converter covering a low voltage range for the same analog signal. Supplied with a reference voltage 5 V, for example, the first A/D converter converts an input voltage of 0 to 5 V into a digital value of 0 to 1,023. Supplied with a reference voltage 1.25 V, the second A/D converter converts an input voltage in a low voltage range of 0 to 1.25 V into a digital value of 0 to 1,023.

In the technique of patent document 1, to secure continuity between digital conversion values in the low voltage range of 0 to 1.25 V and those in the high voltage range of 1.25 to 5 V, the reference signal 1.25 V for the second A/D converter is supplied, as an input signal, to the first A/D converter and its digital conversion value ($1,024 \times 1.25/5 = 256$) is obtained. A variation in the reference voltage 1.25 V that is the intermediate voltage for connection of the low voltage range and the high voltage range can be compensated for by monitoring the digital conversion value of the reference voltage 1.25 V.

However, patent document 1 does not refer to the issue of zero point adjustment that should be considered in the low voltage range.

On the other hand, JP-A-11-214996 (patent document 2, paragraph 0005 and FIG. 1) discloses a technique in which outputs of a preamplifier and a main amplifier that cascade-connected to it are input to a microprocessor via a multi-channel A/D converter. An input circuit of the preamplifier is equipped with an analog switch SW1 for zero point adjustment, an analog switch SW2 for gain control, and a reference voltage source for gain control. The microprocessor acquires data for zero point adjustment and data for gain control by on/off-controlling the analog switches SW1 and SW2 and reading A/D conversion values at each time point.

JP-A-10-169500 (patent document 3, paragraphs 0009 and 0010 and FIG. 1) discloses a technique for compensating for a variation in the characteristic of an exhaust gas sensor by calibrating the detection output in a fuel-cut state that provides an atmospheric environment in the exhaust gas sensor that has an oxygen pump device and an oxygen concentration cell device and in which an air-fuel ratio is detected on the basis of a signal voltage that is obtained by differentially amplifying a voltage across a current detection resistor provided in a pump current supply circuit.

The technique of patent document 1 has problems that the second A/D converter serves only as the A/D converter for handling signal voltages in the low voltage range and that one analog signal occupies inputs of three channels in total.

The technique of patent document 2 is not intended for increase in the accuracy of A/D conversion in the low voltage range. Digital conversion values of outputs of the preamplifier and the main amplifier are fixed by the resolution of the multi-channel A/D converter used.

The technique of patent document 3 is not intended for increase in the accuracy of A/D conversion but for the variation compensation of the exhaust gas sensor for detecting the air-fuel ratio.

SUMMARY OF THE INVENTION

A first object of the present invention is to provide a simple means that is effective in increasing the A/D conversion accuracy in a low voltage range or a particular intermediate range for part of many analog signals to be handled by a vehicular electronic control unit for an automobile by using a multi-channel A/D converter having the same full-scale input voltage for those signals and having an ordinary resolution, and that uses a prescribed reference gain to maintain continuity between digital conversion values in a low voltage range and those in a high voltage range or between digital conversion values in a particular intermediate range and those in the ranges outside it.

A second object of the invention is to provide a means capable of calculating, with learning, a highly accurate compensation gain when necessary by adding a means for obtaining a prescribed intermediate voltage, to maintain continuity between digital conversion values in a low voltage range and those in a high voltage range or between digital conversion values in a particular intermediate range and those in the ranges outside it.

A third object of the invention is to provide a means capable of calculating, with learning, a highly accurate compensation gain without a means for obtaining a prescribed intermediate voltage, to maintain continuity between digital conversion values in a low voltage range and those in a high voltage range or between digital conversion values in a particular intermediate range and those in the ranges outside it.

The invention provides a vehicular electronic control unit comprising:

an analog signal input circuit for producing voltages corresponding to a voltage generated by at least one variable analog signal source;

a multi-channel A/D converter for converting the voltages produced by the analog signal input circuit into a conversion digital value;

a data memory;

a microprocessor for writing a digital conversion value produced by the multi-channel A/D converter to the data memory, the microprocessor having a capability of handling digital data having a longer bit length than a bit length corresponding to a resolution of the multi-channel A/D converter; and a nonvolatile program memory that cooperates with the microprocessor, the analog signal input circuit comprising:

a full-range input circuit that is an input circuit provided between the variable analog signal source and a first input terminal of the multi-channel A/D converter, for producing a first input voltage, the full-range input circuit being configured so that the first input voltage becomes approximately equal to a full-scale input voltage of the multi-channel A/D converter when the voltage generated by the variable analog signal source has a maximum value; and an enlarged range input circuit that is an input circuit provided between the variable analog signal source and a second input terminal of the multi-channel A/D converter, for producing a second input voltage, the enlarged range input circuit being configured so that the second input voltage becomes approximately equal to the full-scale input voltage of the multi-channel A/D converter when the first input voltage is equal to a prescribed intermediate voltage that is lower than a maximum voltage, wherein the nonvolatile program memory stores programs to serve as:

error signal storing means activated when the voltage generated by the variable analog signal source is zero, for writing, as a first error voltage, a digital conversion value of a first input voltage to the data memory at a first address, and for writing, as a second error voltage, a digital conversion value of a second input voltage to the data memory at a second address;

gain compensating means for producing a second compensation voltage by calculating a second correction voltage by subtracting the second error voltage from a second present voltage that is a digital conversion value of a second input voltage and dividing the second correction voltage by a compensation gain or multiplying the second correction voltage by a compensation gain reciprocal, the compensation gain being set so that the second compensation voltage becomes approximately equal to a first correction voltage in a low voltage range obtained by subtracting the first error voltage from a first present voltage that is a digital conversion value of a first input voltage, the low voltage range being a range that is lower than the intermediate voltage; and selecting and switching means for selectively using the second compensation voltage if the first input voltage is in the low voltage range, selectively using the first correction voltage if the first input voltage is in a high voltage range that is a range higher than or equal to the intermediate voltage, and issuing an instruction to store a digital conversion value that is proportional to a selection result to the data memory at a prescribed address.

The invention also provides a vehicular electronic control unit comprising:

an analog signal input circuit for producing voltages corresponding to a voltage generated by at least one variable analog signal source that is an exhaust gas sensor having an oxygen pump device and an oxygen concentration cell device;

a multi-channel A/D converter for converting the voltages produced by the analog signal input circuit into a conversion digital value;

a data memory;

a microprocessor for writing a digital conversion value produced by the multi-channel A/D converter to the data memory, the microprocessor having a capability of handling digital data having a longer bit length than a bit length corresponding to a resolution of the multi-channel A/D converter; and a nonvolatile program memory that cooperates with the microprocessor, the analog signal input circuit comprising:

a variable analog signal circuit comprising:

a pump current supply circuit for supplying a positive or negative pump current to the oxygen pump device;

a current detection resistor connected to the pump current supply circuit; and a bias voltage source for adding a bias voltage to a positive or negative signal voltage produced by differentially amplifying a voltage across the current detection resistor;

a full-range input circuit that is an input circuit provided between the variable analog signal source and a first input terminal of the multi-channel A/D converter, for producing a first input voltage, the full-range input circuit being configured so that the first input voltage becomes approximately equal to a full-scale input voltage of the multi-channel A/D converter when the voltage generated by the variable analog signal source has a maximum value; and an enlarged range input circuit that is an input circuit provided between the variable analog signal source and a second input terminal of the multi-channel A/D converter, for producing a second input voltage, the enlarged range input circuit being configured so that the second input voltage becomes approximately equal to the full-scale input voltage of the multi-channel A/D converter when the first input voltage is equal to a prescribed intermediate voltage that is lower than a maximum voltage, wherein the nonvolatile program memory stores programs to serve as:

error signal storing means activated when the voltage across the current detection resistor is zero and both of the first and second input voltages are equal to a prescribed bias voltage, for determining error voltages with respect to a reference bias voltage that is an intrinsic digital conversion value corresponding to a normal bias voltage that complies with a standard, the error signal storing means writing, as a first error voltage, a value obtained by subtracting the reference bias voltage from a digital conversion value of a first input voltage to the data memory at a first address, and writing, as a second error voltage, a value obtained by subtracting the reference bias voltage from a digital conversion value of a second input voltage to the data memory at a second address;

gain compensating means for producing a second compensation voltage by calculating a second correction voltage by subtracting the second error voltage from a second present voltage that is a digital conversion value of a second input voltage, dividing a second increment voltage obtained by subtracting the reference bias voltage from the second correction voltage by a compensation gain or multiplying the second increment voltage by a compensation gain reciprocal, and adding the reference bias voltage to a resulting product or quotient, the compensation gain being set so that the second compensation voltage becomes approximately equal to a first correction voltage in an intermediate range obtained by subtracting the first error voltage from a first present voltage that is a digital conversion value of a first input voltage, the intermediate range being a range that is lower than the intermediate voltage; and selecting and switching means for selectively using the second compensation voltage if the first input voltage is in the intermediate range, selectively using the first correction voltage if the first input voltage is in one of outside ranges that are outside the intermediate range, and issuing an instruction to store a digital conversion value that is proportional to a selection result to the data memory at a prescribed address.

According to the vehicular electronic control unit of the invention, even with an inexpensive A/D converter having a low resolution, the unit of stepwise variations of digital conversion values in a low voltage input state can be reduced and a fine output characteristic can be obtained. Since the error adjustment function is provided that can be performed when necessary during a drive, products need not be adjusted at the time of shipment and the A/D conversion accuracy of an actual product can be increased by making automatic compensation in accordance with its actual use environment.

Further, according to the invention, even with an inexpensive A/D converter having a low resolution, the resolution of digital conversion values by the exhaust gas sensor can be improved in an intermediate voltage range when the sensor is frequently used in the vicinity of a theoretical air-fuel ratio. Since the error adjustment function is provided that can be performed when necessary during a drive, products need not be adjusted at the time of shipment and the A/D conversion accuracy of an actual product can be increased by making automatic compensation in accordance with its actual use environment.

DESCRIPTION OF THE PREFERRED EMBODIMENTS

Embodiment 1

The entire configuration of a vehicular electronic control unit according to a first embodiment of the present invention will be described below with reference to a circuit block diagram of FIG. 1.

Figure 1:
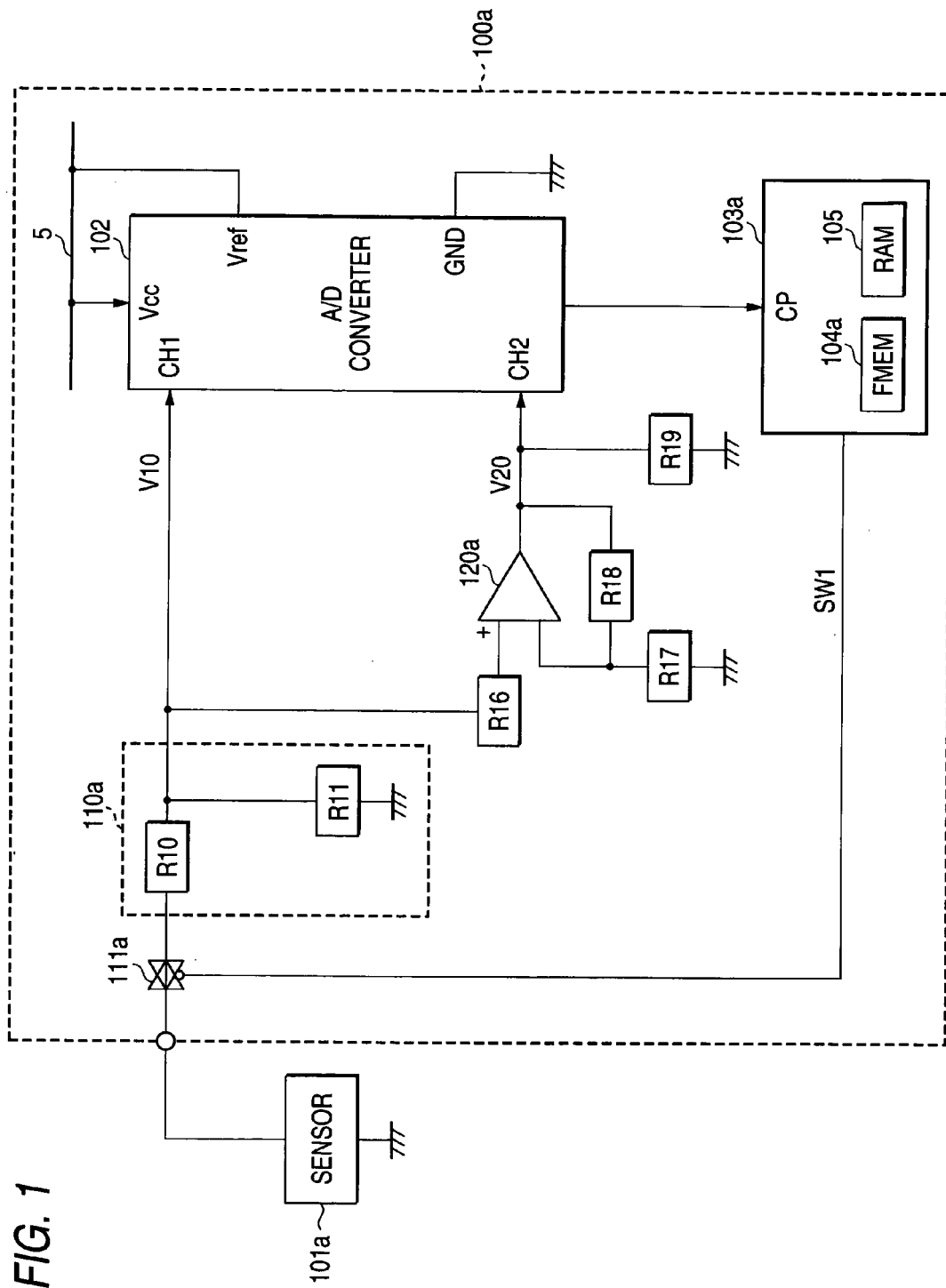
FIG. 1 is a circuit block diagram showing the entire configuration of a vehicular electronic control unit according to a first embodiment of the present invention.

In FIG. 1, reference symbol 100a denotes a vehicular electronic control unit such as an engine control unit that is mounted on an automobile. A variable analog signal source 101a that is one of many analog sensors is connected to the electronic control unit 100a.

Reference numeral 102 denotes a multi-channel A/D converter having a resolution of 10 bits that is provided inside the electronic control unit 100a. A regulated DC voltage 5 V is applied to a voltage source terminal Vcc and a reference voltage terminal Vref of the electronic control unit 100a. A first input voltage V10 of 0 to 5 V and a second input voltage V20 of 0 to 5 V are applied to a first input terminal CH1 and a second input terminal CH2 of the multi-channel A/D converter 102, respectively.

Therefore, the minimum unit of the input voltage to be converted into a digital voltage is $5/1{,}023$ V$\cong$5 mV (DC), which corresponds to approximately 0.1% of the maximum value of the input voltage.

Many other analog signal sources (not shown) are connected to the multi-channel A/D converter 102. Analog voltage values that are input to the respective input channels are sequentially converted into digital values, which are stored in a buffer memory that is provided in the multi-channel A/D converter 102.

Reference symbol 103a denotes a microprocessor capable of processing 32-bit data, for example, simultaneously, and symbol 104a denotes a nonvolatile program memory that is bus-connected to the microprocessor 103a. The program memory 104a stores not only various control programs and control constants for operation as a vehicular electronic control unit but also various programs and control data for various control means of this embodiment.

Reference numeral 105 denotes a RAM memory for computation that is bus-connected to the microprocessor 103a. The RAM memory 105 also serves as a data memory; digital data that are stored in the buffer memory of the multi-channel A/D converter 102 can be read out by the microprocessor 103a and written to the RAM memory 105 when necessary.

Reference symbol 110a denotes a voltage divider circuit that is a series circuit of an input resistor R10 and a pull-down resistor R11. Reference symbol 111a denotes a first analog switch that is connected in series to the input resistor R10 and is provided between the variable analog signal source 101a and the first input terminal CH1. The analog switch 111a is on/off-controlled by a first instruction signal SW1 that is generated by the microprocessor 103a. The first input voltage V10 has a value obtained by dividing the output voltage of the variable analog signal source 101a between the input resistor R10 and the pull-down resistor R11.

Reference symbol 120a denotes a second amplifier that is connected to a pull-down resistor R19 and that produces the above-mentioned second input voltage V20. The positive-side input terminal of the second amplifier 120a is connected to the first input terminal CH1 via an input resistor R16, and its negative-side input terminal is connected to the connecting point of a voltage division resistor R17 and a feedback resistor R18. The feedback resistor R18 is connected to the output terminal of the second amplifier 120a.

Therefore, a theoretical gain G relating to the ratio of the second input voltage V20 to the first input voltage V10 is given by $$G = V20/V10 = (R17+R18)/R17. \quad (1)$$

Figure 2A:
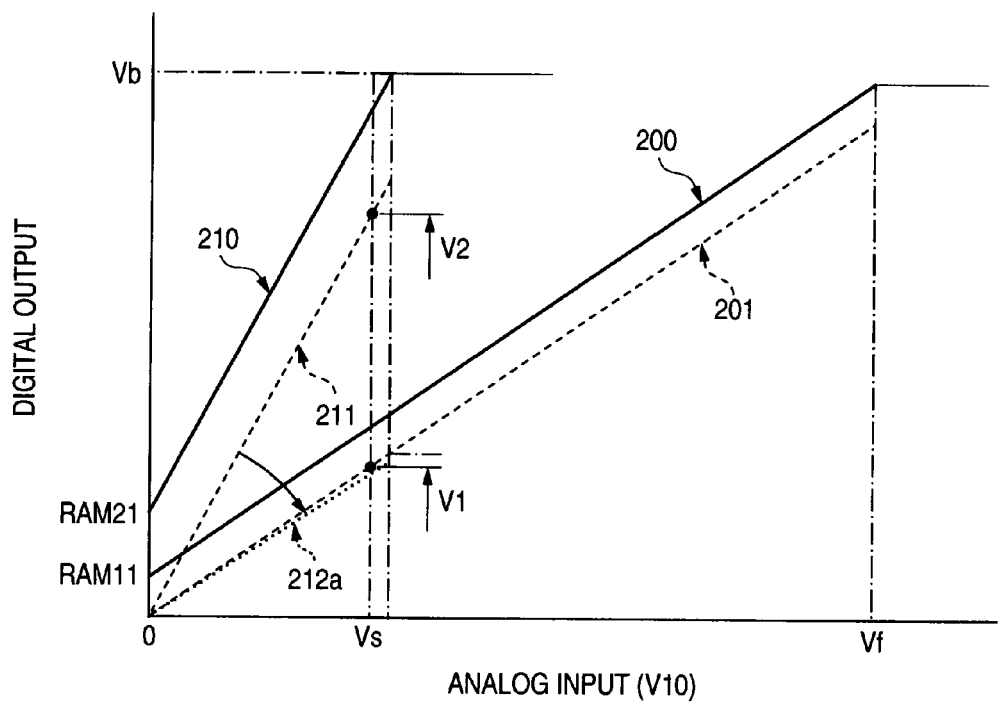
FIGS. 2A and 2B are graphs showing an input/output characteristic of a multi-channel A/D converter shown in FIG. 1.

FIG. 2A is a graph showing an input/output characteristic of the multi-channel A/D converter 102 shown in FIG. 1. The horizontal axis represents the analog input voltage (first input voltage V10) and the vertical axis represents the digital conversion value corresponding to the first input voltage V10 or the second input voltage V20.

A full-scale voltage Vf which is the maximum value of the analog input voltage is the voltage that is applied to the reference voltage terminal Vref of the multi-channel A/D converter 102 and is DC 5V in this embodiment. A maximum output voltage Vb which is the maximum value of the digital conversion value is equal to a digital dedicated value 1,023 in this embodiment.

Reference numeral 200 denotes a curve representing a relationship between the first input voltage V10 and the corresponding digital conversion value, that is, the first present voltage. The first present voltage is equal to a first error voltage RAM11 when the first input voltage V10 is zero.

Reference numeral 201 denotes a curve representing a relationship between the first input voltage V10 and the first correction voltage that is obtained by digitally subtracting the first error voltage RAM11 from the first present voltage (200). Reference symbol 201a in FIG. 2B denotes a low voltage portion of the curve 201.

Reference symbol 210 denotes a curve representing a relationship between the first input voltage V10 and the digital conversion value (i.e., second present voltage) corresponding to the second input voltage V20. Since the second input voltage V20 is the voltage obtained by amplifying the first input voltage V10 at the theoretical gain G, the digital conversion value reaches the maximum output voltage Vb=1,023 when the first input voltage V10 becomes equal to an intermediate voltage of about 1.25 V, for example. The second present voltage (210) is equal to a second error voltage RAM21 when the first input voltage V10 is zero.

Reference numeral 211 denotes a curve representing a relationship between the first input voltage V10 and the second correction voltage that is obtained by digitally subtracting the second error voltage RAM21 from the second present voltage (210).

Reference symbol 212a denotes a curve representing a relationship between the first input voltage V10 and the second compensation voltage that is obtained by dividing the second correction voltage (211) by the theoretical gain G. If the amplification factor of the second amplifier 120a is equal to the theoretical gain G correctly, the curve 212a of the second compensation voltage coincides with the low voltage portion 201a of the curve 201 of the first correction voltage.

However, the following problem exists. The resistance values of the voltage division resistor R17 and the feedback resistor R18 shown in FIG. 1 have variations. For example, slight deviations occur even if they are high-accuracy resistors whose errors are within 0.1%, for example. Such errors are on the same level as the resolution of the multi-channel A/D converter 102. It is unlikely that the curve 212a of the second compensation voltage exactly coincides with the low voltage portion 201a of the curve 201 of the first correction voltage.

However, in practice, the error between the curve 212a and the low voltage portion 201a is reduced by using, instead of the theoretical gain G, a reference gain R that is a measured average based on a large number of product samples.

Figure 2B:
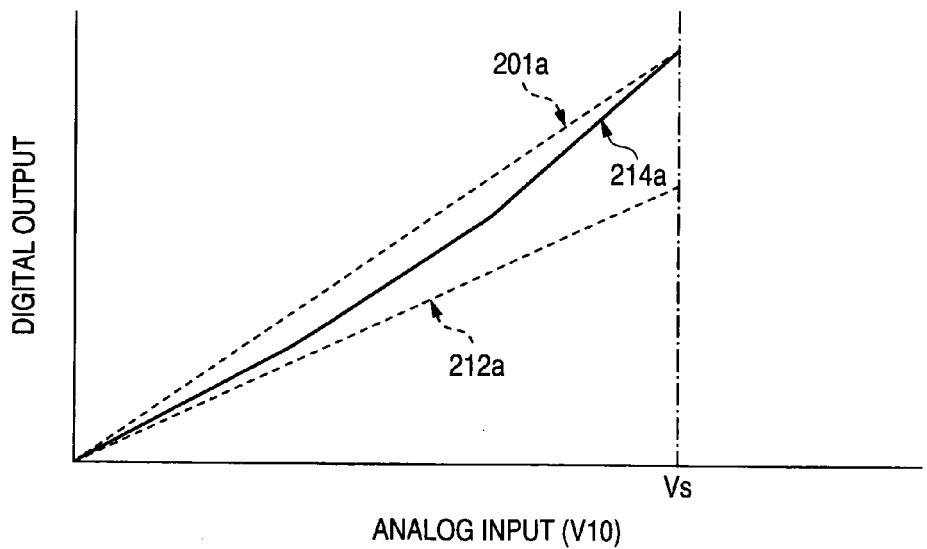

In FIG. 2B showing, in an enlarged manner, the region where the first input voltage V10 is low, reference symbol 201a denotes the above-mentioned low voltage portion of the curve 201 of the first corrected voltage 201, symbol 212a denotes the above-mentioned curve of the second compensation voltage, and symbol 214a denotes a curve of the second average voltage. The second average voltage is calculated according to the following equation:

$$V214 = \{V201 \times \alpha + V212(1-\alpha)\}/2 \quad (2)$$

$$\alpha = V211/(Vb - RAM21) \quad (3)$$

where V201 is the first correction voltage, V212 is the second compensation voltage, V214 is the second average voltage, α is a weight coefficient, Vb is the maximum output voltage, and RAM21 is the second error voltage.

The operation of the vehicular electronic control unit 100a according to the first embodiment that is configured as shown in FIG. 1 will be described below with reference to a flowchart of FIG. 3.

Figure 3:
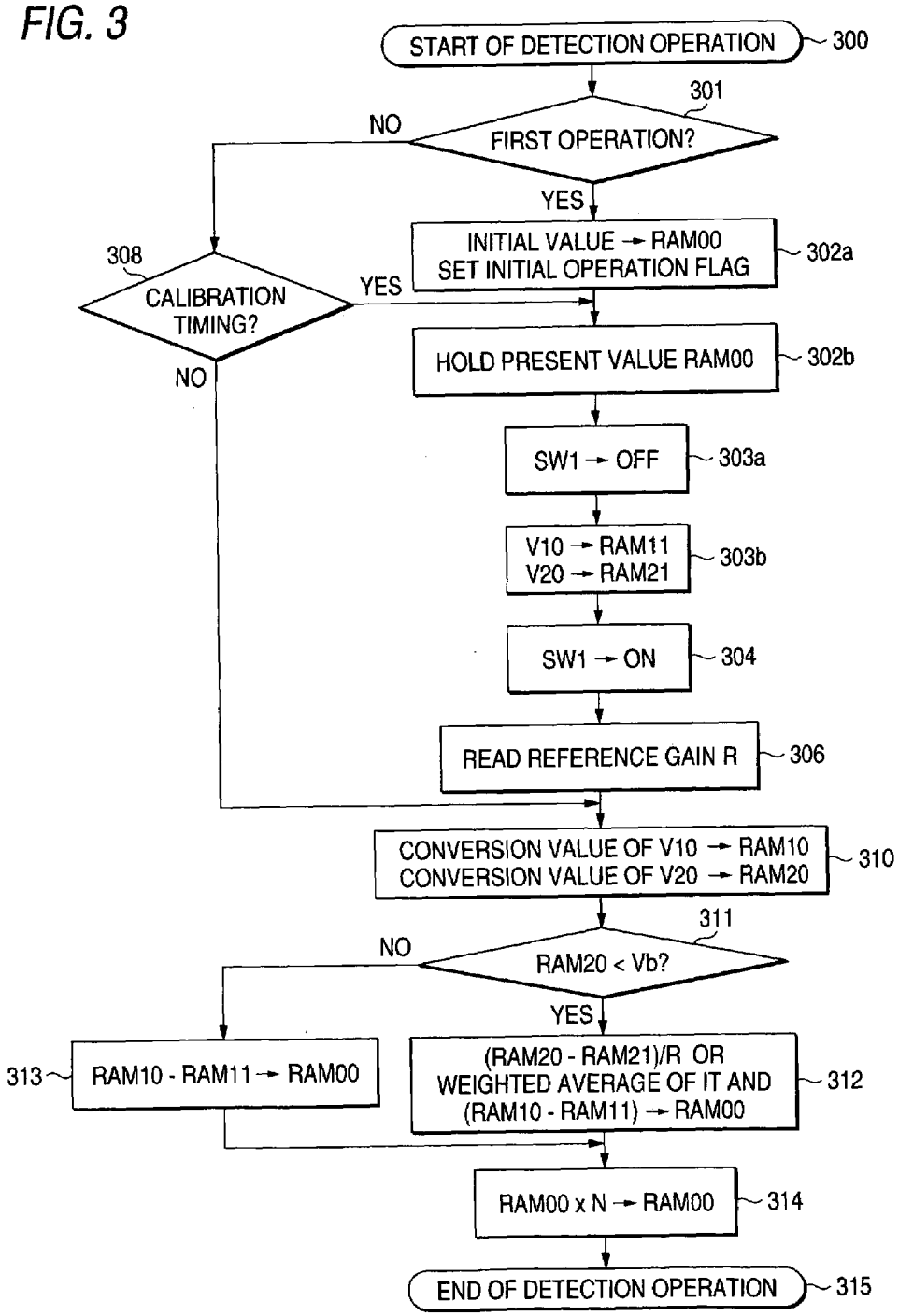
FIG. 3 is a flowchart showing the operation of the vehicular electronic control unit according to the first embodiment.

In FIG. 3, at a start step 300, a calibration operation of the microprocessor 103a is started. The start step 300 is activated repeatedly, that is, every time an operation end step 315 (described later) is executed.

At step 301 which is executed after step 300, it is judged whether the current operation is the first one by monitoring whether an initial operation flag (not shown) was set at the next step 302a. At step 302a which is executed if the judgment result of step 301 is "yes," (i.e., the current operation is the first one), an initial value is written to the RAM memory 105 at a prescribed address RAM00 and the initial operation flag is set. The set state of the initial operation flag is stored and maintained until power-off of the electronic control unit 100a.

The address RAM00 is an address (of RAM memory) where a digital conversion value that is proportional to a voltage generated by the variable analog signal source 101a is written. When the microprocessor 103a needs a digital conversion value that is proportional to a voltage generated by the variable analog signal source 101a, the microprocessor 103a reads out and uses the data stored at the address RAM00 when necessary.

At step 302b which is executed after step 302a, writing to the area having the address RAM00 is prohibited to prevent the data at the address RAM00 from being changed. At step 303a which is executed after step 302b, the supply of the first instruction signal SW1 is stopped to open the first analog switch 111a. At step 303b which is executed after step 303a, a digital conversion value corresponding to a first input voltage V10 is written, as a first error voltage RAM11, to the RAM memory 105 at a first address and a digital conversion value corresponding to a second input voltage V20 is written, as a second error voltage RAM21, to the RAM memory 105 at a second address. At step 304 which is executed after step 303b, the first instruction signal SW1 is generated to make the first analog switch 111a conductive. At step 306 which is activated after step 304, the reference gain R is read out. The reference gain R that is read out at step 306 is data that was stored in the nonvolatile program memory 104a in advance and that is a measured average gain, that is, an average, over a large number of product samples, of the ratio V2/V1 of the measured value V2 of the second correction voltage (211) to the measured value V1 of the first correction voltage (201) in a state that the first input voltage V10 was equal to an intermediate voltage Vs.

At step 308 which is executed if the judgment result of step 301 is "no" (i.e., the current operation is not the first one), it is judged whether to perform a calibration again. A judgment result "yes" is produced at step 308 and a transition is made to step 302b repeatedly, that is, every time a time that is taken for the environment temperature of the control circuit unit to vary has elapsed or the variable analog signal source 101a has become unused.

At step 310 which is executed if the judgment result of step 308 is "no" (i.e., a regular calibration has already been performed) or when step 306 has just been executed, a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105.

At step 311 which is executed after step 310, it is judged whether the second present voltage RAM20 is lower than the maximum output voltage Vb. At step 312 which is executed if the judgment result of step 311 is "yes" (i.e., the first input voltage V10 is in the low voltage range), a second correction voltage obtained by subtracting the second error voltage RAM21 from the second present voltage RAM20 is divided by the reference gain R that was read out at step 306 and the quotient is stored in the RAM memory 105 at the prescribed address RAM00. At step 313 which is executed if the judgment result of step 311 is "no" (i.e., the first input voltage V10 is in the high voltage range), a first correction voltage obtained by subtracting the first error voltage RAM11 from the first present voltage RAM10 is stored as it is in the RAM memory 105 at the prescribed address RAM00. At step 314 which is executed after step 312 or 313, the value stored at the address RAM00 is multiplied by a fixed factor N and the product is caused to overwrite the value stored at the address RAM00. Step 315 is an operation end step which is executed after step 314.

Alternatively, step 312 may be such that variable weighted averaging (see Equations (2) and (3)) is performed and a resulting value is stored at the prescribed address RAM00.

If the reciprocal of the reference gain R is stored at step 306, the division at step 312 can be replaced by multiplication. This is advantageous because the microprocessor 103a can perform multiplication faster than division.

Another modification is as follows. At step 306 an enlargement factor X (=(fixed factor N)/(reference gain R)) is stored, at step 312 the second correction voltage is multiplied by the enlargement factor X rather than divided by the reference gain R, and at step 313 the first correction voltage is multiplied by the fixed factor N. This is advantageous in that the number of operations at step 312 can be reduced.

Examples of the reference gain R and the fixed factor N are 4.05 and 32, respectively, in which case the enlargement factor X becomes 7.9. Even if the decimal point is eliminated from a calculation result of step 312, no large error is produced because the decimal point is eliminated from a value that has been multiplied by 32 in advance.

As described above, in the first embodiment, the range of the input voltage to be subjected to A/D conversion is divided into the low voltage range and the high voltage range and a digital conversion value is synthesized by using the reference gain. This has been described above with reference to FIG. 1 (reference numerals are in the 100s), FIGS. 2A and 2B (reference numerals are in the 200s), and FIG. 3 (reference numerals are in the 300s).

The vehicular electronic control unit 100a according to the first embodiment of the invention is configured as follows. A voltage generated by the variable analog signal source 101a is input to the multi-channel A/D converter 102 via the analog signal input circuit and a resulting digital value is written to the RAM memory 105 via the microprocessor 103a. The analog signal input circuit is equipped with a full-range input circuit and an enlarged range input circuit (described later). The microprocessor 103a is one capable of handling digital data that is more accurate, that is, longer in bit length, as compared to the resolution of the multi-channel A/D converter 102. The nonvolatile program memory 104a which cooperates with the microprocessor 103a stores programs to serve as an error signal storing means 303b, a gain compensating means 312, and a selecting and switching means 311 (described later).

The full-range input circuit is an input circuit that is provided between the variable analog signal source 101a and the first input terminal CH1 of the multi-channel A/D converter 102 and that produces a first input voltage V10. The input circuit is the voltage divider circuit 110a that is configured so that the first input voltage V10 becomes approximately equal to a full-scale input voltage Vf of the multi-channel A/D converter 102 when the voltage generated by the variable analog signal source 101a is at the maximum.

The enlarged range input circuit is an input circuit that is provided between the variable analog signal source 101a and the second input terminal CH2 of the multi-channel A/D converter 102 and that produces a second input voltage V20. The input circuit includes the second amplifier 120a and is configured so that the second input voltage V20 becomes approximately equal to the full-scale input voltage Vf of the multi-channel A/D converter 102 when the first input voltage V10 is equal to a prescribed intermediate voltage Vs that is lower than the maximum voltage Vf.

Activated when the voltage generated by the variable analog signal source 101a is zero, the error signal storing means 303b writes, as a first error voltage RAM11, a digital conversion value of a first input voltage V10 to the RAM memory 105 at a first address and writes, as a second error voltage RAM21, a digital conversion value of a second input voltage V20 to the RAM memory 105 at a second address.

The gain compensating means 312 produces a second compensation voltage (212a) by calculating a second correction voltage (211) by subtracting the second error voltage RAM21 from a second present voltage (210) that is a digital conversion value of a second input voltage V20 and dividing the second correction voltage (211) by a compensation gain or multiplying it by the reciprocal of the compensation gain. The compensation gain is set so that the second compensation voltage (212a) becomes approximately equal to a first correction voltage (201) (i.e., a value (201a) in the low voltage range) obtained by subtracting the first error voltage RAM11 from a first present voltage (200) that is a digital conversion value of a first input voltage V10.

The selecting and switching means 311 selectively uses the second compensation voltage (212a) if the first input voltage V10 is in the low voltage range, that is, lower than the intermediate voltage Vs, and selectively uses the first correction voltage (201) if the first input voltage V10 is in the high voltage range, that is, higher than or equal to the intermediate voltage Vs. And the selecting and switching means 311 issues an instruction to store a digital value proportional to the selection result to the RAM memory 105 at a prescribed address RAM00.

If the voltage generated by the variable analog signal source 101a is sufficiently higher than the full-scale input voltage Vf of the multi-channel A/D converter 102, the ratio between the first input voltage V10 and the second input voltage V20 can be set to a prescribed value by providing voltage divider circuits having different voltage division ratios and not having an amplifier in the full-range input circuit and the enlarged range input circuit, respectively.

In the vehicular electronic control unit 100a according to the first embodiment of the invention, the analog signal input circuit is equipped with the first analog switch 111a. The nonvolatile program memory 104a stores programs to serve as an error signal input means 303a and a present status holding means 302b. The first analog switch 111a is an opening/closing element that is provided in the full-range input circuit and the enlarged range input circuit and that disconnects the multi-channel A/D converter 102 from the variable analog signal source 101a to forcibly establish the same state as the voltage generated by the variable analog signal source 101a is zero. The error signal input means 303a on/off-controls the first analog switch 111a in accordance with a first instruction signal SW1 supplied from the microprocessor 103a, and causes the error signal storing means 303b to operate. The present status holding means 302b prevents data that was selected and stored in the RAM memory 105 by the selecting and switching means 311 from being changed, that is, keeps the data at the value that was in storage immediately before the start of operation of the error signal input means 303a, while the error signal input means 303a is in operation.

Therefore, the microprocessor 103a can perform an error adjustment when necessary even if the voltage of an actual input signal is not zero. Occurrence of an erroneous digital conversion value can be prevented because a preceding digital conversion value is held during error adjustment processing.

In the vehicular electronic control unit 100a according to the first embodiment of the invention, the nonvolatile program memory 104a stores reference gain data, which is data that was stored in advance as a reference gain R (=V2/V1) or its reciprocal (reference gain reciprocal) and that is a statistical value such as an average or a center value of a plurality of samples obtained by calculating, for a large number of samples, the ratio of the measured value V2 of the second correction voltage (211) to the measured value V1 of the first correction voltage (201) in a state that the first input voltage V10 was approximately equal to the intermediate voltage Vs. The compensation gain that is used by the above-described gain compensating means 312 is the reference gain R.

Since a reference gain corresponding to center values of component variations can be calculated in advance by using a large number of product samples, actual products are free of a large step between digital conversion values in the low voltage range of the input voltage and those in the high voltage range (i.e., continuity is substantially secured).

Satisfactory results are obtained as long as the intermediate voltage Vs is equal to or a little lower than an ideal intermediate voltage where the digital conversion value of the second input voltage V20 is equal to the maximum output voltage Vb. Even if the intermediate voltage Vs somewhat varies, no error occurs in the reference gain R because it is calculated as a ratio.

In the vehicular electronic control unit 100a according to the first embodiment of the invention, the nonvolatile program memory 104a stores a program to serve as a variable weighted averaging means 312. The variable weighted averaging means 312 calculates a weighted average voltage in the range (low voltage range) where the curve 212a of the second compensation voltage and the curve 201 of the first correction voltage overlap with each other. The variable weighted averaging means 312 calculates a weighted average in such a manner as to decrease the weight coefficient (1 to 0) of the weighted averaging operation by which to multiply the second compensation voltage (212a) and to increase the weight coefficient (0 to 1) by which to multiply the first correction voltage (201) as the absolute value of the difference between the second compensation voltage (212a) and the first correction voltage (201) increases, and employs the weighted average as a second average voltage (214a). The selecting and switching means 311 selectively uses the second average voltage (214a) instead of the second compensation voltage 212a.

Therefore, even if the continuity between the digital conversion value of the second compensation voltage (212a) and that of the first correction voltage (201) is insufficient in an actual product, a steep variation of the digital conversion value can be prevented, that is, a gentle transition is attained.

In the vehicular electronic control unit 100a according to the first embodiment of the invention, the error signal storing means 303b operates immediately after a start of operation of the electronic control unit 100a. And the nonvolatile program memory 104a stores a program to serve as a calibration timing judging means 308. The calibration timing judging means 308 causes the error signal storing means 303b to operate repeatedly, that is, every time a time that is taken for the environment temperature to vary by an amount that would cause a state that a re-calibration is desirable has elapsed or the variable analog signal source 101a has become unused.

Therefore, by setting the frequency of the error adjustment high, calibration processing can be effected timely in accordance with a variation of the use environment.

In the vehicular electronic control unit 100a according to the first embodiment of the invention, the nonvolatile program memory 104a stores a program to serve as a conversion-into-integer means 314, which multiplies a digital conversion value of an analog signal voltage by a prescribed fixed factor N and stores the product in the RAM memory 105. The fixed factor N is set so that even a maximum numerical value to be stored in the RAM memory 105 is smaller than or equal to a limit value that is determined by a data bit length that can be handled by the microprocessor 103a. A decimal part of a value that is obtained by multiplying gain-compensated data such as the second compensation voltage (212a) or the second average voltage (214a) by the fixed factor N is discarded.

Since a finally obtained digital conversion value does not have a decimal part, the operation processing speed of the microprocessor 103a can be increased in a subsequent stage of its use.

The multiplication by the fixed factor N may be performed at any time from capturing of a digital conversion value into the RAM memory 105 to its final disposal.

Embodiment 2

The entire configuration of a vehicular electronic control unit according to a second embodiment of the invention will be described below with reference to a circuit block diagram of FIG. 4.

Figure 4:
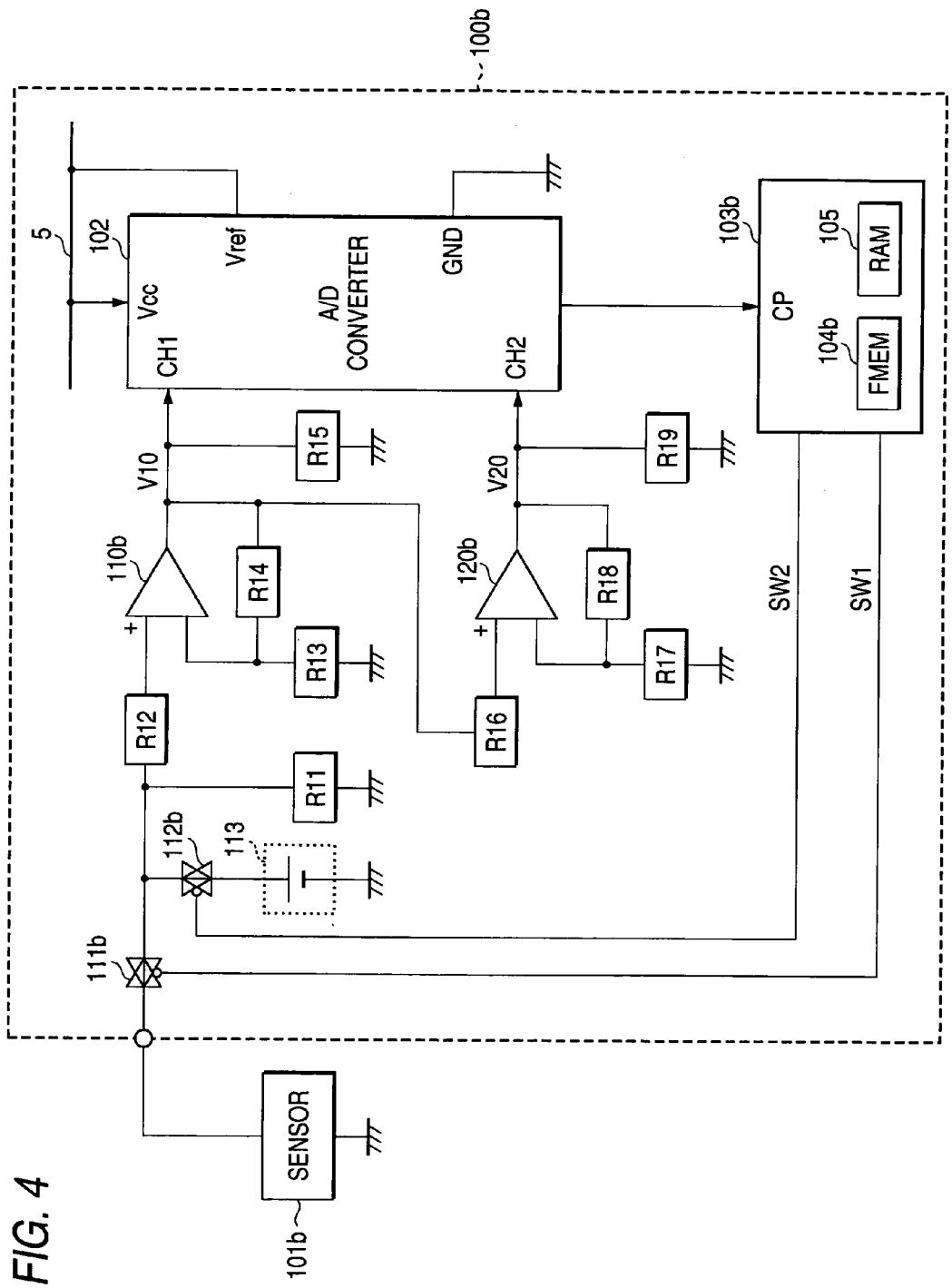
FIG. 4 is a circuit block diagram showing the entire configuration of a vehicular electronic control unit according to a second embodiment of the invention.

In FIG. 4, reference symbol 100*b* denotes a vehicular electronic control unit such as an engine control unit that is mounted on an automobile. A variable analog signal source 101*b* that is one of many analog sensors is connected to the electronic control unit 100*b*.

Reference numeral 102 denotes a multi-channel A/D converter having a resolution of 10 bits that is provided inside the electronic control unit 100*b*. A regulated DC voltage 5 V is applied to a voltage source terminal Vcc and a reference voltage terminal Vref of the multi-channel A/D converter 102. A first input voltage V10 of 0 to 5 V and a second input voltage V20 of 0 to 5 V are applied to a first input terminal CH1 and a second input terminal CH2 of the multi-channel A/D converter 102, respectively.

Therefore, the minimum unit of the input voltage to be converted into a digital voltage is $5/1{,}023$ V≅5 mV (DC), which corresponds to approximately 0.1% of the maximum value of the input voltage.

Many other analog signal sources (not shown) are connected to the multi-channel A/D converter 102. Analog voltage values that are input to the respective input channels are sequentially converted into digital values, which are stored in a buffer memory that is provided in the multi-channel A/D converter 102.

Reference symbol 103*b* denotes a microprocessor capable of processing 32-bit data, for example, simultaneously, and symbol 104*a* denotes a nonvolatile program memory that is bus-connected to the microprocessor 103*b*. The program memory 104*b* stores not only various control programs and control constants for operation as a vehicular electronic unit but also various programs and control data for various control means of this embodiment.

Reference numeral 105 denotes a RAM memory for computation that is bus-connected to the microprocessor 103*b*. The RAM memory 105 also serves as a data memory; digital data that are stored in the buffer memory of the multi-channel A/D converter 102 can be read out by the microprocessor 103*b* and written to the RAM memory 105 when necessary.

Reference symbol 110*b* denotes a first amplifier that is connected to a pull-down resistor R15 and that produces the above-mentioned first input voltage V10. The positive-side input terminal of the first amplifier 110*b* is connected to the variable analog signal source 101*b* via an input resistor R12 and a first analog switch 111*b* (described later), and its negative-side input terminal is connected to the connecting point of a voltage division resistor R13 and a feedback resistor R14. The feedback resistor R14 is connected to the output terminal of the first amplifier 110*b*.

Reference symbol 111*b* denotes the above-mentioned first analog switch that is connected to the input resistor R12 and is provided between the variable analog signal source 101*b* and the pull-down resistor R11. The analog switch 111*b* is on/off-controlled by a first instruction signal SW1 that is generated by the microprocessor 103*b*.

Reference symbol 112*b* denotes a second analog switch and symbol 113 denotes an intermediate voltage generation circuit. By generating a second instruction signal SW2 after stopping the generation of the first instruction signal SW1, the microprocessor 103*b* can make the second analog switch 112*b* conductive in a state that the first analog switch 111*b* is opened and thereby supply the output voltage of the intermediate voltage generation circuit 113 to the input resistor R12 instead of the output voltage of the variable analog signal source 101*b*.

Reference symbol 120*b* denotes a second amplifier that is connected to a pull-down resistor R19 and that produces the above-mentioned second input voltage V20. The positive-side input terminal of the second amplifier 120*b* is connected to the first input terminal CH1 via an input resistor R16, and its negative-side input terminal is connected to the connecting point of a voltage division resistor R17 and a feedback resistor R18. The feedback resistor R18 is connected to the output terminal of the second amplifier 120*b*.

Therefore, a theoretical gain G relating to the ratio of the second input voltage V20 to the first input voltage V10 is given by the above-mentioned Equation (1).

Figure 5:
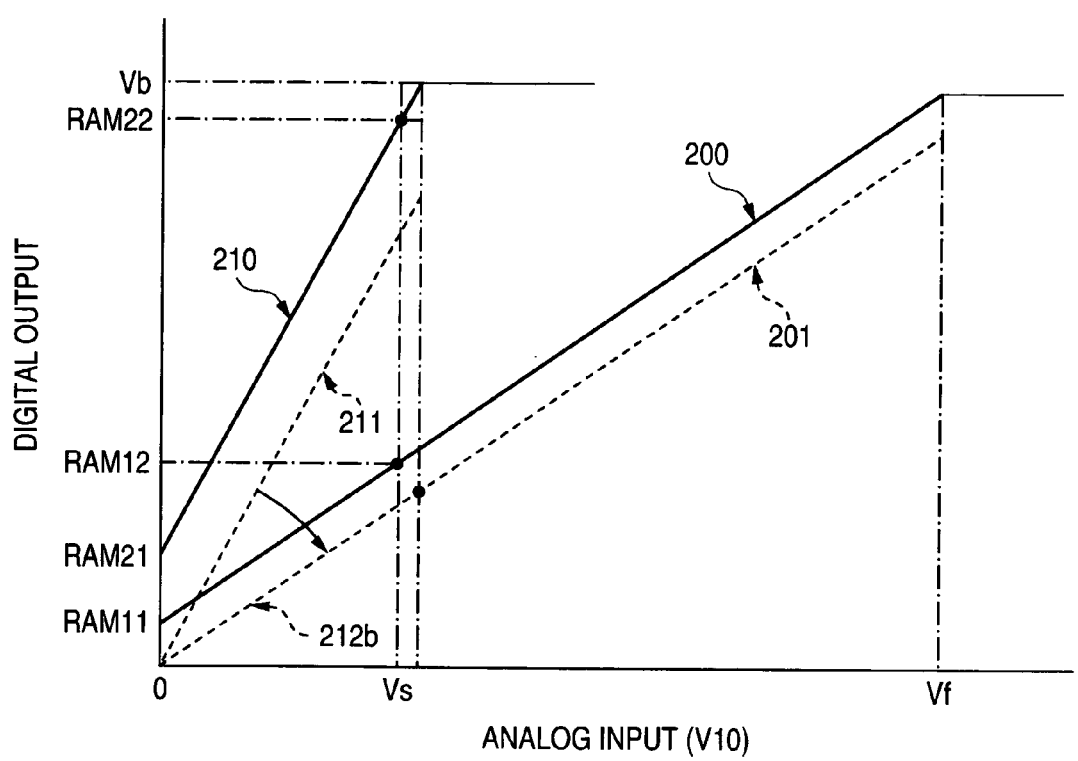
FIG. 5 is a graph showing an input/output characteristic of a multi-channel A/D converter shown in FIG. 4.

FIG. 5 is a graph showing an input/output characteristic of the multi-channel A/D converter 102 shown in FIG. 4. The horizontal axis represents the analog input voltage (first input voltage V10) and the vertical axis represents the digital conversion value corresponding to the first input voltage V10 or the second input voltage V20.

A full-scale voltage Vf which is the maximum value of the analog input voltage is the voltage that is applied to the reference voltage terminal Vref of the multi-channel A/D converter 102 and is DC 5V in this embodiment. A maximum output voltage Vb which is the maximum value of the digital conversion value is equal to a digital dedicated value 1,023 in this embodiment.

Reference numeral 200 denotes a curve representing a relationship between the first input voltage V10 and the corresponding digital conversion value, that is, the first present voltage. The first present voltage is equal to a first error voltage RAM11 when the first input voltage V10 is zero.

Reference numeral 201 denotes a curve representing a relationship between the first input voltage V10 and the first correction voltage that is obtained by digitally subtracting the first error voltage RAM11 from the first present voltage (200).

Reference symbol 210 denotes a curve representing a relationship between the first input voltage V10 and the digital conversion value (i.e., second present voltage) corresponding to the second input voltage V20. Since the second input voltage V20 is the voltage obtained by amplifying the first input voltage V10 at the theoretical gain G, the digital conversion value reaches the maximum output voltage Vb=1,023 when the first input voltage V10 becomes equal to an intermediate voltage of about 1.25 V, for example. The second present voltage (210) is equal to a second error voltage RAM21 when the first input voltage V10 is zero.

Reference numeral 211 denotes a curve representing a relationship between the first input voltage V10 and the second correction voltage (210) that is obtained by digitally subtracting the second error voltage RAM21 from the second present voltage 210.

If the first analog switch 111*b* (see FIG. 4) is opened and the second analog switch 112*b* is closed, the constant voltage generated by the intermediate voltage generation circuit 113 is applied to the positive-side input terminal of the first amplifier 110*b*, as a result of which the intermediate voltage Vs (see FIG. 5) is supplied to the multi-channel A/D converter 102 as a first input voltage V10.

The theoretical gain G of Equation (1) is set so that at this time the second input voltage V20 becomes equal to the full-scale input voltage Vf of the multi-channel A/D converter 102.

Reference symbol 212b denotes a curve representing a relationship between the first input voltage V10 and the second compensation voltage that is obtained by dividing the second correction voltage (211) by a compensation gain K or multiplying it by a compensation gain reciprocal H. The curve 212b of the second compensation voltage is connected to the bottom of the curve 201 of the first correction voltage. The compensation gain K and the compensation gain reciprocal H are given by the following equations:

(compensation gain $K$)=$(RAM22-RAM21)/(RAM12-RAM11)$ (4)

(compensation gain reciprocal $H$)=$(RAM12-RAM11)/(RAM22-RAM21)$ (5)

where RAM12 is a first intermediate voltage that is a digital conversion value corresponding to a first input voltage V10 that is equal to the above-mentioned intermediate voltage Vs, RAM22 is a second intermediate voltage that is a digital conversion value corresponding to a second input voltage V20 that is obtained when the first input voltage V10 is equal to the intermediate voltage Vs, RAM11 is the first error voltage, and RAM21 is the second error voltage.

The operation of the vehicular electronic control unit 100b according to the second embodiment that is configured as shown in FIG. 4 will be described below with reference to a flowchart of FIG. 6.

Figure 6:
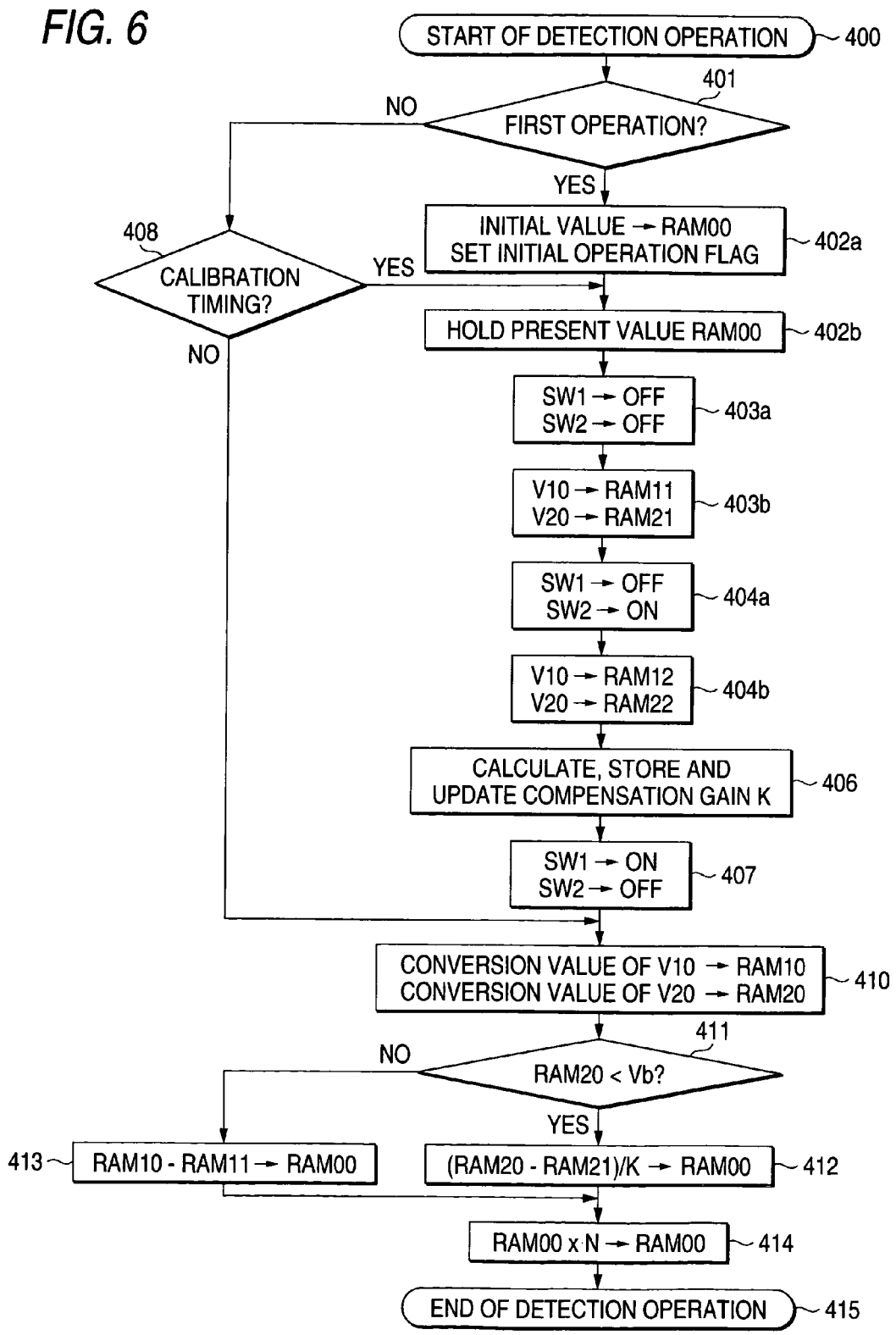
FIG. 6 is a flowchart showing the operation of the vehicular electronic control unit according to the second embodiment.

In FIG. 6, at a start step 400, a calibration operation of the microprocessor 103b is started. The start step 400 is activated repeatedly, that is, every time an operation end step 415 (described later) is executed.

At step 401 which is executed after step 400, it is judged whether the current operation is the first one by monitoring whether an initial operation flag (not shown) was set at the next step 402a. At step 402a which is executed if the judgment result of step 401 is "yes," (i.e., the current operation is the first one), an initial value is written to the RAM memory 105 at a prescribed address RAM00 and the initial operation flag is set. The set state of the initial operation flag is maintained until power-off of the electronic control unit 100b.

The address RAM00 is an address where a digital conversion value that is proportional to a voltage generated by the variable analog signal source 101b is written. When the microprocessor 103b needs a digital conversion value that is proportional to a voltage generated by the variable analog signal source 101b, the microprocessor 103b reads out and uses the data stored at the address RAM00 when necessary.

At step 402b which is executed after step 402a, writing to the area having the address RAM00 is prohibited to prevent the data at the address RAM00 from being changed. At step 403a which is activated after step 402b, the supply of the first instruction signal SW1 is stopped to open the first analog switch 111b and the supply of the second instruction signal SW2 is stopped to open the second analog switch 112b. At step 403b which is executed after step 403a, a digital conversion value corresponding to a first input voltage V10 is written, as a first error voltage RAM11, to the RAM memory 105 at a first address and a digital conversion value corresponding to a second input voltage V20 is written, as a second error voltage RAM21, to the RAM memory 105 at a second address. At step 404a which is executed after step 403b, the supply of the first instruction signal SW1 is stopped to open the first analog switch 111b and the second instruction signal SW2 is generated to close the second analog switch 112b. At step 404b which is executed after step 404a, a digital conversion value corresponding to a first input voltage V10 is written, as a first intermediate voltage RAM12, to the RAM memory 105 at a third address and a digital conversion value corresponding to a second input voltage V20 is written, as a second intermediate voltage RAM22, to the RAM memory 105 at a fourth address. At step 406 which is executed after step 404b, a compensation gain K is calculated and stored according to Equation (4). At step 407 which is executed after step 406, the first instruction signal SW1 is generated to close the first analog switch 111b and the supply of the second instruction signal SW2 is stopped to open the second analog switch 112b.

At step 408 which is executed if the judgment result of step 401 is "no" (i.e., the current operation is not the first one), it is judged whether to perform a calibration again. A judgment result "yes" is produced at step 408 and a transition is made to step 402b repeatedly, that is, every time a time that is taken for the environment temperature of the control circuit unit to vary has elapsed or the variable analog signal source 101b has become unused.

At step 410 which is executed if the judgment result of step 408 is "no" (i.e., a regular calibration has already been performed) or when step 407 has just been executed, a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105.

At step 411 which is executed after step 410, it is judged whether the second present voltage RAM20 is lower than the maximum output voltage Vb. At step 412 which is executed if the judgment result of step 411 is "yes" (i.e., the first input voltage V10 is in the low voltage range), a second correction voltage obtained by subtracting the second error voltage RAM21 from the second present voltage RAM20 is divided by the compensation gain K that was calculated and stored at step 406 and the quotient is stored in the RAM memory 105 at the prescribed address RAM00. At step 413 which is executed if the judgment result of step 411 is "no" (i.e., the first input voltage V10 is in the high voltage range), a first correction voltage obtained by subtracting the first error voltage RAM11 from the first present voltage RAM10 is stored as it is in the RAM memory 105 at the prescribed address RAM00. At step 414 which is executed after step 412 or 413, the value stored at the address RAM00 is multiplied by a fixed factor N and the product is caused to overwrite the value stored at the address RAM00. Step 415 is an operation end step which is executed after step 414.

If the reciprocal of the compensation gain K is stored at step 406, the division at step 412 can be replaced by multiplication. This is advantageous because the microprocessor 103b can perform multiplication faster than division.

Another modification is as follows. At step 406 X=(fixed factor N)/(compensation gain K) is stored, at step 412 the second correction voltage is multiplied by the stored value X rather than divided by the compensation gain K, and at step 413 the first correction voltage is multiplied by the fixed factor N. This is advantageous in that the number of operations at step 412 can be reduced.

Examples of the compensation gain K and the fixed factor N are 4.05 and 32, respectively, in which case the stored value X becomes 7.9. Even if the decimal point is eliminated from a calculation result of step 412, no large error is produced because the decimal point is eliminated from a value that has been multiplied by 32 in advance.

As described above, in the second embodiment, the range of the input voltage to be subjected to A/D conversion is divided into the low voltage range and the high voltage range and a digital conversion value is synthesized by using the compensation gain that is calculated by using the intermediate voltage generation circuit 113. This has been described above with reference to FIG. 4 (reference numerals are in the 100s), FIG. 5 (reference numerals are in the 200s), and FIG. 6 (reference numerals are in the 400s).

The vehicular electronic control unit 100b according to the second embodiment of the invention is configured as follows. A voltage generated by the variable analog signal source 101b is input to the multi-channel A/D converter 102 via the analog signal input circuit and a resulting digital value is written to the RAM memory 105 via the microprocessor 103b. A part of the analog signal input circuits is equipped with a full-range input circuit and an enlarged range input circuit (described later). The microprocessor 103b is one capable of handling digital data that is more accurate, that is, longer in bit length, as compared to the resolution of the multi-channel A/D converter 102. The nonvolatile program memory 104b which cooperates with the microprocessor 103b stores programs to serve as an error signal storing means 403b, a gain compensating means 412, and a selecting and switching means 411 (described later).

The full-range input circuit is an input circuit that is provided between the variable analog signal source 101b and the first input terminal CH1 of the multi-channel A/D converter 102 and that produces a first input voltage V10. The input circuit includes the first amplifier 110b and is configured so that the first input voltage V10 becomes approximately equal to a full-scale input voltage Vf of the multi-channel A/D converter 102 when the voltage generated by the variable analog signal source 101b is at the maximum.

The enlarged range input circuit is an input circuit that is provided between the variable analog signal source 101b and the second input terminal CH2 of the multi-channel A/D converter 102 and that produces a second input voltage V20. The input circuit includes the second amplifier 120b and is configured so that the second input voltage V20 becomes approximately equal to the full-scale input voltage Vf of the multi-channel A/D converter 102 when the first input voltage V10 is equal to a prescribed intermediate voltage Vs that is lower than the maximum voltage.

Activated when the voltage generated by the variable analog signal source 101b is zero, the error signal storing means 403b writes, as a first error voltage RAM11, a digital conversion value of a first input voltage V10 to the RAM memory 105 at a first address and writes and stores, as a second error voltage RAM21, a digital conversion value of a second input voltage V20 to the RAM memory 105 at a second address.

The gain compensating means 412 produces a second compensation voltage (212b) by calculating a second correction voltage (211) by subtracting the second error voltage RAM21 from a second present voltage (210) that is a digital conversion value of a second input voltage V20 and dividing the second correction voltage (211) by a compensation gain K. The compensation gain K is set so that the second compensation voltage (212b) becomes approximately equal to a first correction voltage (201) (in the low voltage range) obtained by subtracting the first error voltage RAM11 from a first present voltage (200) that is a digital conversion value of a first input voltage V10.

The selecting and switching means 411 selectively uses the second compensation voltage (212b) if the first input voltage V10 is in the low voltage range, that is, lower than the intermediate voltage Vs, and selectively uses the first correction voltage (201) if the first input voltage V10 is in the high voltage range, that is, higher than or equal to the intermediate voltage Vs. And the selecting and switching means 311 issues an instruction to store a digital value proportional to the selection result to the RAM memory 105 at a prescribed address RAM00.

In the vehicular electronic control unit 100b according to the second embodiment of the invention, the analog signal input circuit is equipped with the first analog switch 111b. And the nonvolatile program memory 104b stores programs to serve as an error signal input means 403a and a present status holding means 402b. The first analog switch 111b is an opening/closing element that is provided in the full-range input circuit and the enlarged range input circuit and that disconnects the multi-channel A/D converter 102 from the variable analog signal source 101b to forcibly establish the same state as the voltage generated by the variable analog signal source 101b is zero. The error signal input means 403a on/off-controls the first analog switch 111b in accordance with a first instruction signal SW1 supplied from the microprocessor 103b, and causes the error signal storing means 403b to operate. The present status holding means 402b prevents data that was selected and stored in the RAM memory 105 by the selecting and switching means 411 from being changed, that is, keeps the data at the value that was in storage immediately before the start of operation of the error signal input means 403a, while the error signal input means 403a is in operation.

Therefore, the microprocessor 103b can perform an error adjustment when necessary even if the voltage of an actual input signal is not zero. Occurrence of an erroneous digital conversion value can be prevented because a preceding digital conversion value is held during error adjustment processing.

In the vehicular electronic control unit 100b according to the second embodiment of the invention, the nonvolatile program memory 104b stores programs to serve as an intermediate signal storing means 404b and a gain calculating means 406.

Activated when the first input voltage V10 is forcibly set at a value that is approximately equal to the intermediate voltage Vs, the intermediate signal storing means 404b writes, as a first intermediate voltage RAM12, a digital conversion value of a first input voltage V10 to the RAM memory 105 at a third address and writes and stores, as a second intermediate voltage RAM22, a digital conversion value of a second input voltage V20 to the RAM memory 105 at a fourth address.

The gain calculating means 406 calculates and stores a compensation gain K (=(second difference voltage)/(first difference voltage)), that is, the ratio of the difference between the second intermediate voltage RAM22 and the second error voltage RAM21 to the difference between the first intermediate voltage RAM12 and the first error voltage RAM11. The compensation gain that is used by the above-described gain compensating means 412 is the compensation gain K that is calculated by the gain calculating means 406.

Since the compensation gain is calculated by a learning function using the product itself, no step occurs between digital conversion values in the low voltage range of the input voltage and those in the high voltage range (i.e., continuity is secured) even if circuit resistance values have large variations, which is in contrast to the case of using a reference gain that is determined on the basis of product sample data or the reciprocal of the reference gain.

In the vehicular electronic control unit 100b according to the second embodiment of the invention, the analog signal input circuit is equipped with the intermediate voltage generation circuit 113 and the second analog switch 112b. And the nonvolatile program memory 104b stores programs to serve as an intermediate signal input means 404a and a present status holding means 402b (described below).

The intermediate voltage generation circuit 113 is a reference voltage generation circuit for generating a prescribed intermediate signal voltage that is lower than the maximum value of the voltage generated by the variable analog signal source 101b. The second analog switch 112b is an opening/closing element that is provided in the full-range input circuit and the enlarged range input circuit and that applies the intermediate signal voltage generated by the intermediate voltage generation circuit 113 to the first and second input terminals CH1 and CH2 of the multi-channel A/D converter 102 via the full-range input circuit and the enlarged range input circuit instead of the voltage generated by the variable analog signal source 101b. The intermediate signal input means 404a on/off-controls the second analog switch 112b in accordance with a second instruction signal SW2 supplied from the microprocessor 103b, and causes the intermediate signal storing means 404b to operate. The present status holding means 402b prevents data that was selected and stored in the RAM memory 105 by the selecting and switching means 411 from being changed, that is, keeps the data at the value that was in storage immediately before the start of operation of the intermediate signal input means 404a, while the intermediate signal input means 404a is in operation.

Therefore, the microprocessor 103b can calculate a compensation factor with learning when necessary even if the actual input signal is not equal to the intermediate signal voltage. Occurrence of an erroneous digital conversion value can be prevented because a preceding digital conversion value is held during that calculation.

In the vehicular electronic control unit 100b according to the second embodiment of the invention, the error signal storing means 303b, the intermediate signal storing means 404b, and the gain calculating means 406 operate immediately after a start of operation of the electronic control unit 100b. And the nonvolatile program memory 104b stores a program to serve as a calibration timing judging means 408. The calibration timing judging means 408 causes the error signal storing means 403b, the intermediate signal storing means 404b, and the gain calculating means 412 to operate repeatedly, that is, every time a time that is taken for the environment temperature to vary by an amount that would cause a state that a re-calibration is desirable has elapsed or the variable analog signal source 101b has become unused.

Therefore, by setting the frequency of the error adjustment and the gain calculation high, calibration processing can be effected timely in accordance with a variation of the use environment.

In the vehicular electronic control unit 100b according to the second embodiment of the invention, the nonvolatile program memory 104b stores a program to serve as a conversion-into-integer means 414, which multiplies a digital conversion value of an analog signal voltage by a prescribed fixed factor N and stores the product in the RAM memory 105. The fixed factor N is set so that even a maximum numerical value to be stored in the RAM memory 105 is smaller than or equal to a limit value that is determined by a data bit length that can be handled by the microprocessor 103a. A decimal part of a value that is obtained by multiplying gain-compensated data such as the second compensation voltage (212b) by the fixed factor N is discarded.

Since a finally obtained digital conversion value does not have a decimal part, the operation processing speed of the microprocessor 103b can be increased in a subsequent stage of its use.

Embodiment 3

The entire configuration of a vehicular electronic control unit according to a third embodiment of the invention will be described below with reference to a circuit block diagram of FIG. 7.

Figure 7:
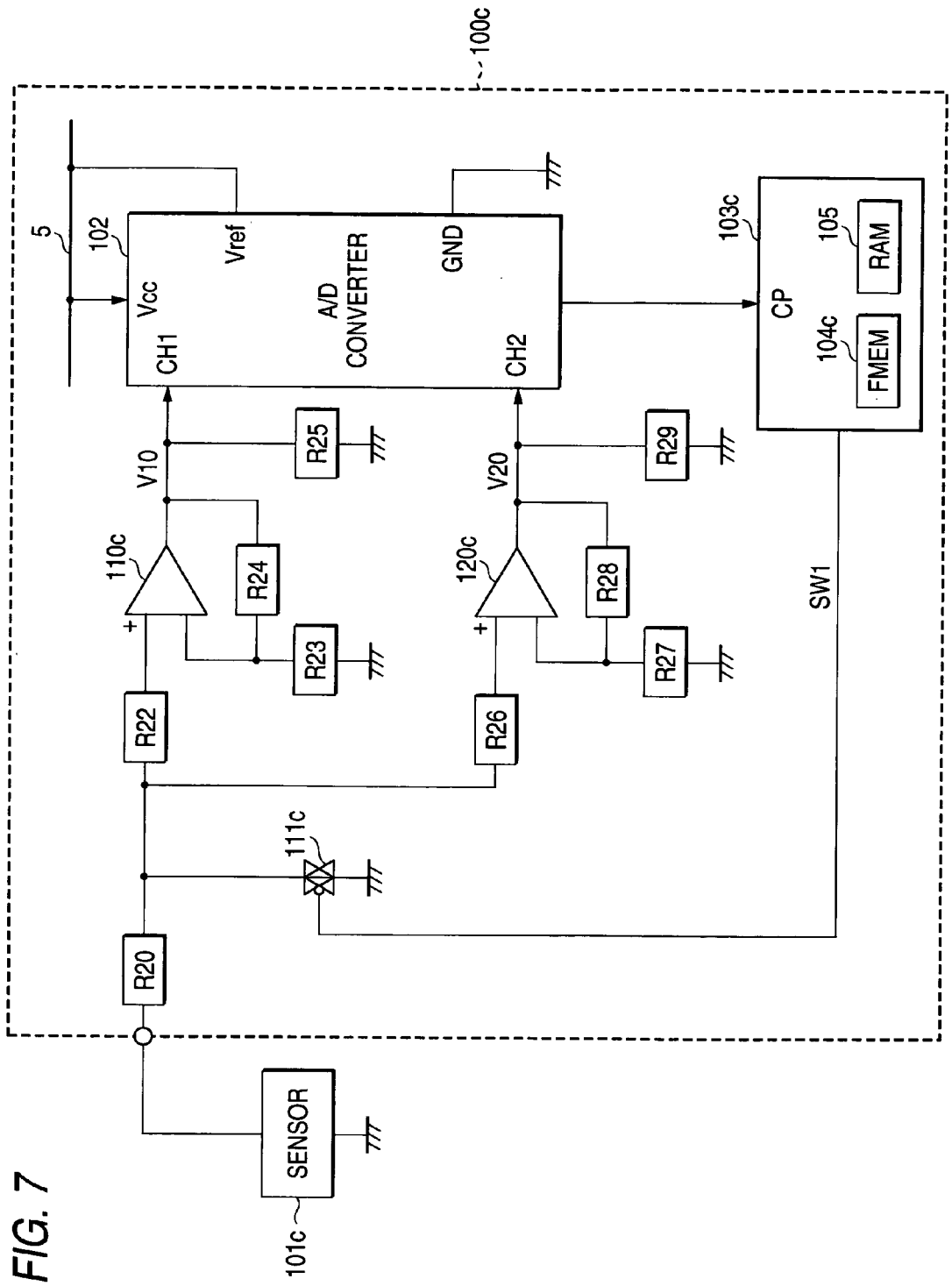
FIG. 7 is a circuit block diagram showing the entire configuration of a vehicular electronic control unit according to a third embodiment of the invention.

In FIG. 7, reference symbol 100c denotes a vehicular electronic control unit such as an engine control unit that is mounted on an automobile. A variable analog signal source 101c that is one of many analog sensors is connected to the electronic control unit 100c.

Reference numeral 102 denotes a multi-channel A/D converter having a resolution of 10 bits that is provided inside the electronic control unit 100c. A regulated DC voltage 5 V is applied to a voltage source terminal Vcc and a reference voltage terminal Vref of the multi-channel A/D converter 102. A first input voltage V10 of 0 to 5 V and a second input voltage V20 of 0 to 5 V are applied to a first input terminal CH1 and a second input terminal CH2 of the multi-channel A/D converter 102, respectively.

Therefore, the minimum unit of the input voltage to be converted into a digital voltage is $5/1,023$ V≅5 mV (DC), which corresponds to approximately 0.1% of the maximum value of the input voltage.

Many other analog signal sources (not shown) are connected to the multi-channel A/D converter 102. Analog voltage values that are input to the respective input channels are sequentially converted into digital values, which are stored in a buffer memory that is provided in the multi-channel A/D converter 102.

Reference symbol 103c denotes a microprocessor capable of processing 32-bit data, for example, simultaneously, and symbol 104c denotes a nonvolatile program memory that is bus-connected to the microprocessor 103c. The program memory 104c stores not only various control programs and control constants for operation as a vehicular electronic unit but also various programs and control data for various control means of this embodiment.

Reference numeral 105 denotes a RAM memory for computation that is bus-connected to the microprocessor 103c. The RAM memory 105 also serves as a data memory; digital data that are stored in the buffer memory of the multi-channel A/D converter 102 can be read out by the microprocessor 103a and written to the RAM memory 105 when necessary.

Reference symbol 110c denotes a first amplifier that is connected to a pull-down resistor R25 and that produces the above-mentioned first input voltage V10. The positive-side input terminal of the first amplifier 110c is connected to the variable analog signal source 101c via an input resistor R22 and a current limiting resistor R20, and its negative-side input terminal is connected to the connecting point of a voltage division resistor R23 and a feedback resistor R24.

The feedback resistor R24 is connected to the output terminal of the first amplifier 110c.

Reference symbol 111c denotes a first analog switch that is connected in parallel to the series circuit of the variable analog signal source 101c and the current limiting resistor R20. The analog switch 111c is on/off-controlled by a first instruction signal SW1 that is generated by the microprocessor 103c.

Reference symbol 120c denotes a second amplifier that is connected to a pull-down resistor R29 and that produces the above-mentioned second input voltage V20. The positive-side input terminal of the second amplifier 120c is connected to the variable analog signal source 101c via an input resistor R26 and the current limiting resistor R20, and its negative-side input terminal is connected to the connecting point of a voltage division resistor R27 and a feedback resistor R28. The feedback resistor R28 is connected to the output terminal of the second amplifier 120c.

Therefore, a theoretical gain G relating to the ratio of the second input voltage V20 to the first input voltage V10 is given by $$G = V20/V10 \quad (6)$$
$$= \{(R27 + R28)/R27\}/\{(R23 + R24)/R23\}.$$

Figure 8A:
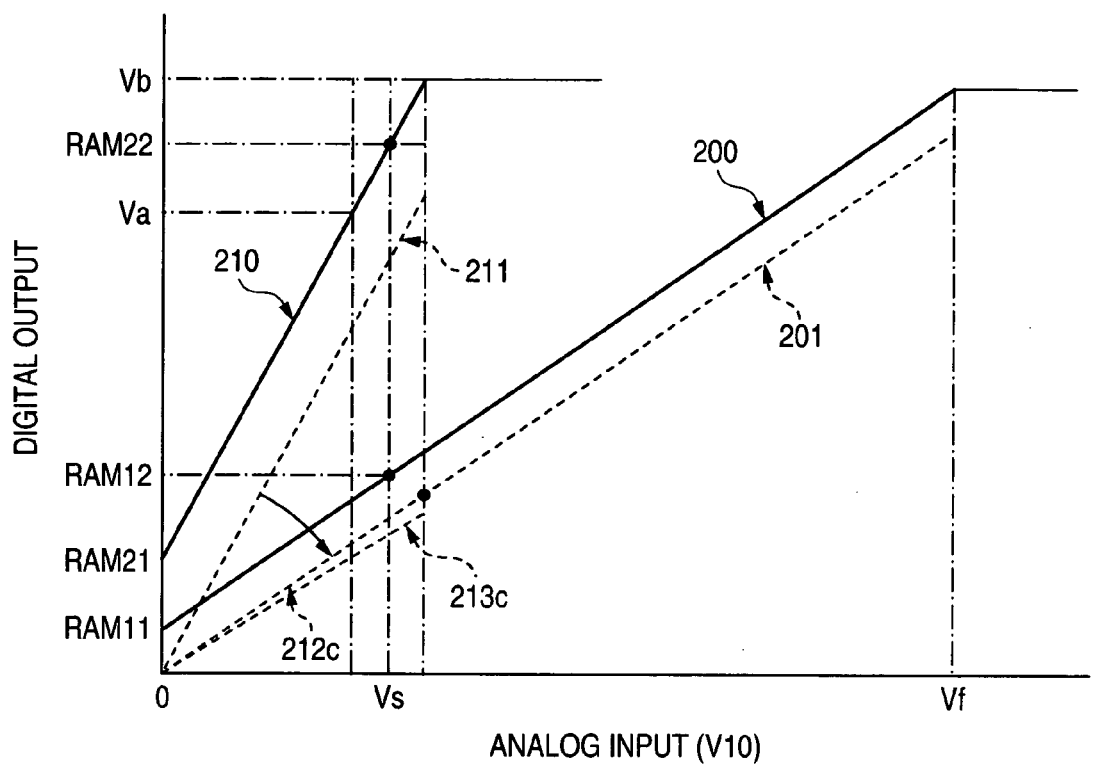
FIGS. 8A and 8B are graphs showing an input/output characteristic of a multi-channel A/D converter shown in FIG. 7.

FIG. 8A is a graph showing an input/output characteristic of the multi-channel A/D converter 102 shown in FIG. 7. The horizontal axis represents the analog input voltage (first input voltage V10) and the vertical axis represents the digital conversion value corresponding to the first input voltage V10 or the second input voltage V20.

A full-scale voltage Vf which is the maximum value of the analog input voltage is the voltage that is applied to the reference voltage terminal Vref of the multi-channel A/D converter 102 and is DC 5V in this embodiment. A maximum output voltage Vb which is the maximum value of the digital conversion value is equal to a digital dedicated value 1,023 in this embodiment.

Reference numeral 200 denotes a curve representing a relationship between the first input voltage V10 and the corresponding digital conversion value, that is, the first present voltage. The first present voltage is equal to a first error voltage RAM11 when the first input voltage V10 is zero. Reference numeral 201 denotes a curve representing a relationship between the first input voltage V10 and the first correction voltage that is obtained by digitally subtracting the first error voltage RAM11 from the first present voltage (200).

Reference symbol 210 denotes a curve representing a relationship between the first input voltage V10 and the digital conversion value (i.e., second present voltage) corresponding to the second input voltage V20. Since the second input voltage V20 is the voltage obtained by amplifying the first input voltage V10 at the theoretical gain G, the digital conversion value reaches the maximum output voltage Vb=1,023 when the first input voltage V10 becomes equal to an intermediate voltage of about 1.25 V, for example. The second present voltage (210) is equal to a second error voltage RAM21 when the first input voltage V10 is zero.

Reference numeral 211 denotes a curve representing a relationship between the first input voltage V10 and the second correction voltage that is obtained by digitally subtracting the second error voltage RAM21 from the second present voltage (210).

Reference symbol 212c denotes a curve representing a relationship between the first input voltage V10 and the second compensation voltage that is obtained by dividing the second correction voltage (211) by a compensation gain K that is calculated according to the above-mentioned Equation (4) or multiplying it by a compensation gain reciprocal H that is calculated according to the above-mentioned Equation (5). The curve 212c of the second compensation voltage is connected to the bottom of the curve 201 of the first correction voltage.

In Equations (4) and (5), RAM12 is a first intermediate voltage that is a digital conversion value corresponding to a first input voltage V10 that is equal to an intermediate voltage Vs, RAM22 is a second intermediate voltage that is a digital conversion value corresponding to a second input voltage V20 that is obtained when the first input voltage V10 is equal to the intermediate voltage Vs, RAM11 is the first error voltage, and RAM21 is the second error voltage.

The intermediate voltage Vs is an intermediate voltage that happens to be obtained from a voltage generated by the variable analog signal source 101c. To keep the accuracy of Equations (4) and (5) high, a compensation gain K or compensation gain reciprocal H is calculated according to Equation (4) or (5) in a state that the second intermediate voltage RAM22 is lower than or equal to the maximum output voltage Vb and higher than or equal to a designated output voltage Va that is a little lower than the maximum output voltage Vb.

Reference symbol 213c denotes a curve representing a relationship between the first input voltage V10 and the second estimate voltage that is obtained by dividing the second correction voltage (211) by the theoretical gain G obtained according to Equation (6). If the amplification factors of the first and second amplifiers 110c and 120c are equal to the theoretical gains correctly, the curve 213c of the second estimate voltage coincides with the low voltage portion 201a of the curve 201 of the first correction voltage.

However, the following problem exists. The resistance values of the voltage division resistors R23 and R27 and the feedback resistors R24 and R28 shown in FIG. 7 have variations. For example, slight deviations occur even if they are high-accuracy resistors whose errors are within 0.1%. Such errors are on the same level as the resolution of the multi-channel A/D converter 102. It is unlikely that the curve 213c of the second estimate voltage exactly coincides with the low voltage portion 201a of the curve 201 of the first correction voltage.

However, in practice, the error between the curve 213c and the low voltage portion 201a is reduced by using, instead of the theoretical gain G, a reference gain R that is a measured average based on a large number of product samples.

Figure 8B:
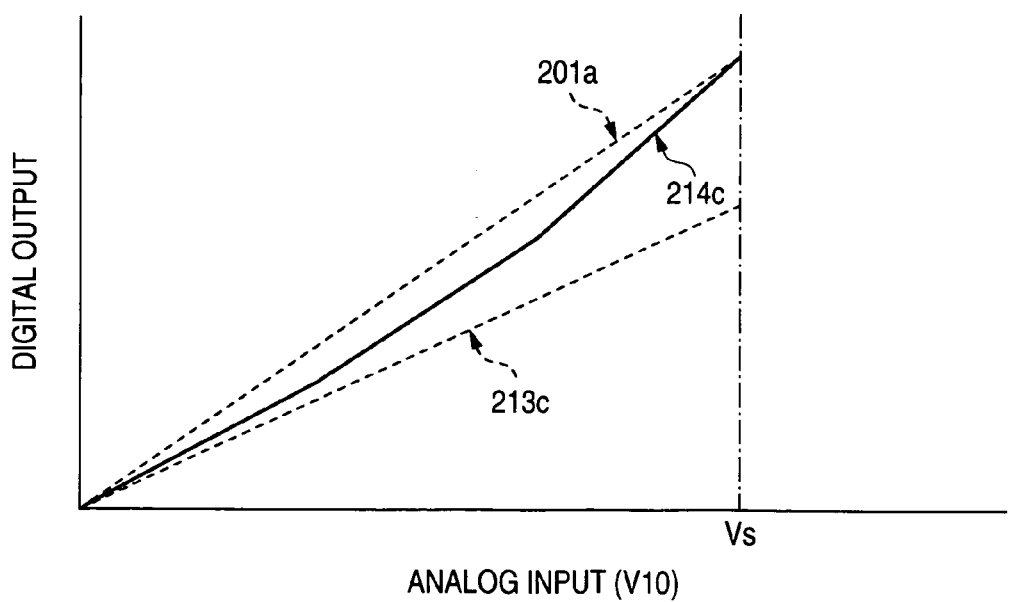

In FIG. 8B showing, in an enlarged manner, the region where the first input voltage V10 is low, reference symbol 201a denotes the above-mentioned low voltage portion of the curve of the first corrected voltage 201, symbol 213c denotes the above-mentioned curve of the second estimate voltage, and symbol 214c denotes a curve of the second average voltage. The second average voltage is calculated according to the following equation:

$$V214 = \{V201 \times \alpha + V213(1-\alpha)\}/2 \quad (7)$$

$$\alpha = V211/(Vb - RAM21) \quad (8)$$

where V201 is the first correction voltage, V213 is the second estimate voltage, V214 is the second average voltage, α is a weight coefficient, Vb is the maximum output voltage, and RAM21 is the second error voltage.

The operation of the vehicular electronic control unit 100c according to the third embodiment that is configured as shown in FIG. 7 will be described below with reference to a flowchart of FIG. 9.

Figure 9:
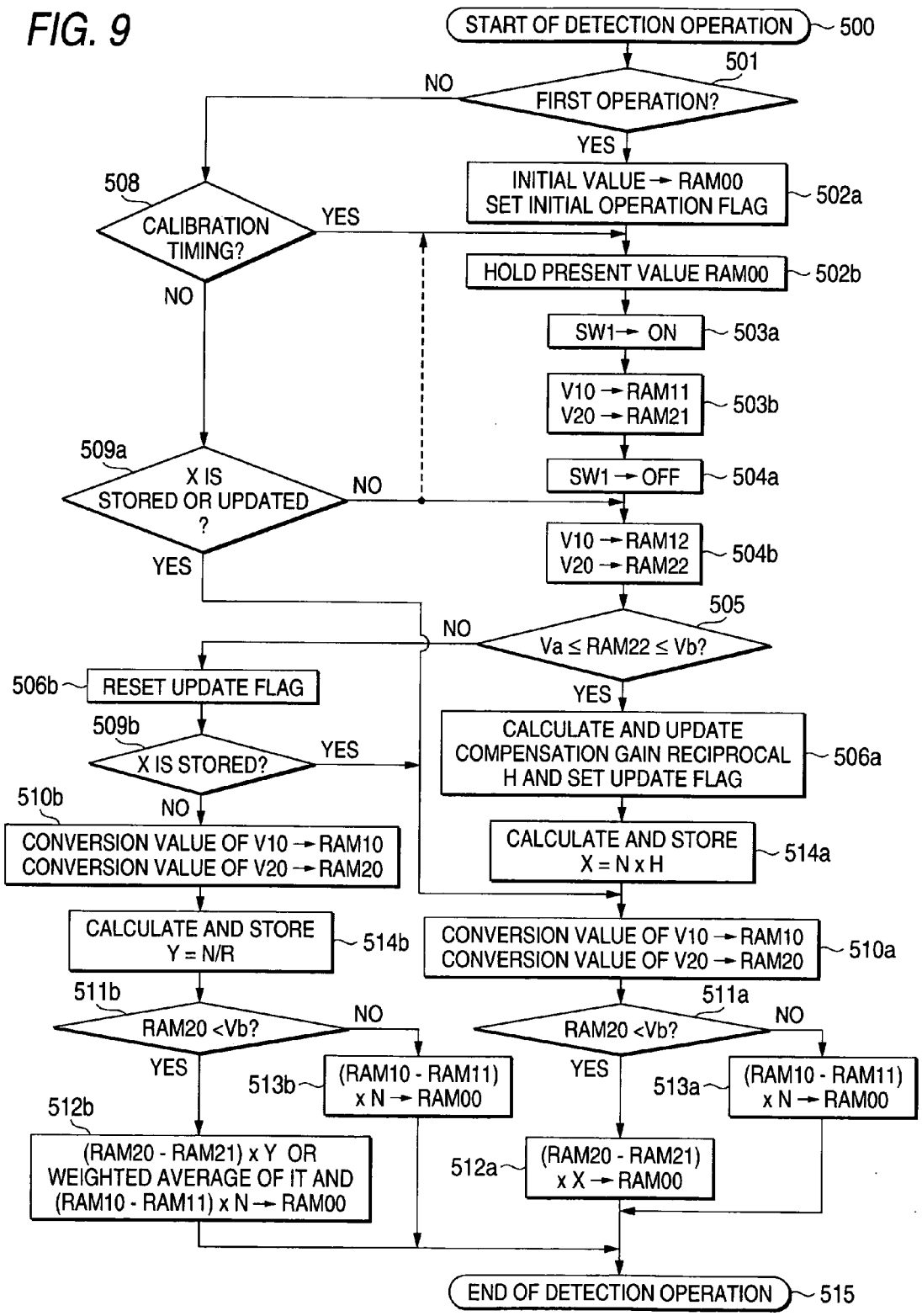
FIG. 9 is a flowchart showing the operation of the vehicular electronic control unit according to the third embodiment.

In FIG. 9, at a start step 500, a calibration operation of the microprocessor 103c is started. The start step 500 is activated repeatedly, that is, every time an operation end step 515 (described later) is executed.

At step 501 which is executed after step 500, it is judged whether the current operation is the first one by monitoring whether an initial operation flag (not shown) was set at the next step 502a. At step 502a which is executed if the judgment result of step 501 is "yes," (i.e., the current operation is the first one), an initial value is written to the RAM memory 105 at a prescribed address RAM00 and the initial operation flag is set. The set state of the initial operation flag is maintained until power-off of the electronic control unit 100c.

The address RAM00 is an address where a digital conversion value that is proportional to a voltage generated by the variable analog signal source 101c is written. When the microprocessor 103c needs a digital conversion value that is proportional to a voltage generated by the variable analog signal source 101c, the microprocessor 103c reads out and uses the data stored at the address RAM00 when necessary.

At step 502b which is executed after step 502a, writing to the area having the address RAM00 is prohibited to prevent the data at the address RAM00 from being changed. At step 503a which is executed after step 502b, the first instruction signal SW1 is generated to close the first analog switch 111c and thereby establish a state that the input signal voltage is zero. At step 503b which is executed after step 503a, a digital conversion value corresponding to a first input voltage V10 is written, as a first error voltage RAM11, to the RAM memory 105 at a first address and a digital conversion value corresponding to a second input voltage V20 is written, as a second error voltage RAM21, to the RAM memory 105 at a second address. At step 504a which is executed after step 503b, the supply of the first instruction signal SW1 is stopped to open the first analog switch 111c and thereby render the input signal effective. At step 504b which is executed after step 504a, a digital conversion value corresponding to a first input voltage V10 is written, as a first intermediate voltage RAM12, to the RAM memory 105 at a third address and a digital conversion value corresponding to a second input voltage V20 is written, as a second intermediate voltage RAM22, to the RAM memory 105 at a fourth address.

At step 505 which is executed after step 504b, it is judged whether the second intermediate voltage RAM22 that was stored at step 504b is within the designated range, that is, lower than or equal to the maximum output voltage Vb of the multi-channel A/D converter 102 and higher than or equal to the designated output voltage Va that is a little lower than the maximum output voltage Vb. At step 506a which is executed if the judgment result of step 505 is "yes" (i.e., within the designated range), a compensation gain reciprocal H is calculated according to Equation (5) and stored and an update flag (not shown) for indicating that the compensation gain reciprocal H has been calculated is set. At step 514a which is executed after step 506a, an enlargement factor X that is the product of the compensation gain reciprocal H and the fixed factor N is calculated and stored.

At step 508 which is executed if the judgment result of step 501 is "no" (i.e., the current operation is not the first one), it is judged whether to perform a calibration again. A judgment result "yes" is produced at step 508 and a transition is made to step 502b repeatedly, that is, every time a time that is taken for the environment temperature of the control circuit unit to vary has elapsed or the variable analog signal source 101c has become unused.

At step 509a which is executed if the judgment result of step 508 is "no" (i.e., not calibration timing), it is judged whether a compensation gain reciprocal H was calculated and stored at step 506a and an enlargement factor X was calculated and stored at step 514a.

If the judgment result of step 509a is "no" (i.e., an enlargement factor X was not stored), a transition is made to step 504b though the judgment result of step 508 is "no" (i.e., not calibration timing). Alternatively, a transition may be made to step 502b (indicated by a broken line in FIG. 9).

At step 510a which is executed if the judgment result of step 509a is "yes" (i.e., an enlargement factor X is stored) or when step 514a has just been executed, a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105.

At step 511a which is executed after step 510a, it is judged whether the second present voltage RAM20 is lower than the maximum output voltage Vb. At step 512a which is executed if the judgment result of step 511a is "yes" (i.e., the first input voltage V10 is in the low voltage range), a second correction voltage (211) obtained by subtracting the second error voltage RAM21 from the second present voltage RAM20 is multiplied by the enlargement factor X that was calculated and stored at step 514a and the product is stored in the RAM memory 105 at the prescribed address RAM00. At step 513a which is executed if the judgment result of step 511a is "no" (i.e., the first input voltage V10 is in the high voltage range), a first correction voltage (201) obtained by subtracting the first error voltage RAM11 from the first present voltage RAM10 is multiplied by the fixed factor N and the product is stored in the RAM memory 105 at the prescribed address RAM00.

At step 506b which is executed if the judgment result of step 505 is "no" (i.e., the second intermediate voltage RAM22 that was stored at step 504b is not within the prescribed designated range), the update flag that was set at step 506a is reset. At step 509b which is executed after step 506b, it is judged whether an enlargement factor X was calculated and stored at step 514a. If the judgment result of step 509b is "yes" (an enlargement factor X was stored), a transition is made to step 510a.

At step 510b which is executed if the judgment result of step 509b is "no" (i.e., an enlargement factor X has not been calculated and stored yet at step 514a), a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105. At step 514b, an enlargement factor Y is calculated by dividing the fixed factor N by a reference gain R and is stored.

The reference gain R is data that was stored in advance in the nonvolatile program memory 104c as a reference gain R=V2/V1 or its reciprocal (reference gain reciprocal) and that is a statistical value such as an average or a center value of a plurality of samples obtained by calculating, for a large number of samples, the ratio of the measured value V2 of the second correction voltage to the measured value V1 of the first correction voltage in a state that the first input voltage V10 was approximately equal to the intermediate voltage Vs. The fixed factor N is a fixed value 32, for example, and is a factor for converting a numerical value being handled into an integer.

At step 511b which is executed after step 514b, it is judged whether the second present voltage RAM20 that was stored at step 510b is lower than the maximum output voltage Vb. At step 512b which is executed if the judgment result of step 511b is "yes" (i.e., the first input voltage V10 is in the low voltage range), a second correction voltage (211) obtained by subtracting the second error voltage RAM21 from the second present voltage RAM20 is multiplied by the enlargement factor Y that was calculated and stored at step 514b and the product is stored in the RAM memory 105 at the prescribed address RAM00. At step 513b which is executed if the judgment result of step 511b is "no" (i.e., the first input voltage V10 is in the high voltage range), a first correction voltage (201) obtained by subtracting the first error voltage RAM11 from the first present voltage RAM10 that was stored at step 510b is multiplied by the fixed factor N and the product is stored in the RAM memory 105 at the prescribed address RAM00. Step 515 is an operation end step which is executed after step 512a, 513a, 512b, or 513b.

As described above, in the third embodiment, the range of the input voltage to be subjected to A/D conversion is divided into the low voltage range and the high voltage range and a digital conversion value is synthesized by using the compensation gain that is calculated without using an intermediate voltage generation circuit. This has been described above with reference to FIG. 7 (reference numerals are in the 100s), FIGS. 8A and 8B (reference numerals are in the 200s), and FIG. 9 (reference numerals are in the 500s).

The vehicular electronic control unit 100c according to the third embodiment of the invention is configured as follows. A voltage generated by the variable analog signal source 101c is input to the multi-channel A/D converter 102 via the analog signal input circuit and a resulting digital value is written to the RAM memory 105 via the microprocessor 103c. The analog signal input circuit is equipped with a full-range input circuit and an enlarged range input circuit (described later). The microprocessor 103c is one capable of handling digital data that is more accurate, that is, longer in bit length, as compared to the resolution of the multi-channel A/D converter 102. The nonvolatile program memory 104c which cooperates with the microprocessor 103c stores programs to serve as an error signal storing means 503b, a gain compensating means 512a, and a selecting and switching means 511a (described later).

The full-range input circuit is an input circuit that is provided between the variable analog signal source 101c and the first input terminal CH1 of the multi-channel A/D converter 102 and that produces a first input voltage V10. The input circuit includes the first amplifier 110c and is configured so that the first input voltage V10 becomes approximately equal to a full-scale input voltage Vf of the multi-channel A/D converter 102 when the voltage generated by the variable analog signal source 101c is at the maximum.

The enlarged range input circuit is an input circuit that is provided between the variable analog signal source 101c and the second input terminal CH2 of the multi-channel A/D converter 102 and that produces a second input voltage V20. The input circuit includes the second amplifier 120c and is configured so that the second input voltage V20 becomes approximately equal to the full-scale input voltage Vf of the multi-channel A/D converter 102 when the first input voltage V10 is equal to a prescribed intermediate voltage Vs that is lower than the maximum voltage.

Activated when the voltage generated by the variable analog signal source 101c is zero, the error signal storing means 503b writes, as a first error voltage RAM11, a digital conversion value of a first input voltage V10 to the RAM memory 105 at a first address and writes, as a second error voltage RAM21, a digital conversion value of a second input voltage V20 to the RAM memory 105 at a second address.

The gain compensating means 512a produces a second compensation voltage (212c) by calculating a second correction voltage (211) by subtracting the second error voltage RAM21 from a second present voltage (210) that is a digital conversion value of a second input voltage V20 and dividing the second correction voltage (211) by a compensation gain K or multiplying it by the a compensation gain reciprocal H. The compensation gain K is set so that the second compensation voltage (212c) becomes approximately equal to a first correction voltage (201) (i.e., a voltage (201a) in the low voltage range) obtained by subtracting the first error voltage RAM11 from a first present voltage (200) that is a digital conversion value of a first input voltage V10.

The selecting and switching means 511a selectively uses the second compensation voltage (212c) if the first input voltage V10 is in the low voltage range, that is, lower than the intermediate voltage Vs, and selectively uses the first correction voltage (201) if the first input voltage V10 is in the high voltage range, that is, higher than or equal to the intermediate voltage Vs. And the selecting and switching means 511a issues an instruction to store a digital value proportional to the selection result to the RAM memory 105 at a prescribed address RAM00.

In the vehicular electronic control unit 100c according to the third embodiment of the invention, the analog signal input circuit is equipped with the first analog switch 111c. The nonvolatile program memory 104c stores programs to serve as an error signal input means 503a and a present status holding means 502b. The first analog switch 111c is an opening/closing element that is provided in the full-range input circuit and the enlarged range input circuit and that short-circuits the input circuit between the variable analog signal source 101c and the multi-channel A/D converter 102 to forcibly establish the same state as the voltage generated by the variable analog signal source 101c is zero. The error signal input means 503a on/off-controls the first analog switch 111c in accordance with a first instruction signal SW1 supplied from the microprocessor 103c, and causes the error signal storing means 503b to operate. The present status holding means 502b prevents data that was selected and stored in the RAM memory 105 by the selecting and switching means 511a from being changed, that is, keeps the data at the value that was in storage immediately before the start of operation of the error signal input means 503a, while the error signal input means 503a is in operation.

Therefore, the microprocessor 103c can perform an error adjustment when necessary even if the voltage of an actual input signal is not zero. Occurrence of an erroneous digital conversion value can be prevented because a preceding digital conversion value is held during error adjustment processing.

The configuration in which a zero-voltage state is established by short-circuiting the input circuit is advantageous over the configuration in which the input circuit is disconnected from the input signal source in that the electronic control unit is less prone to noise introduction.

In the vehicular electronic control unit 100c according to the third embodiment of the invention, the nonvolatile program memory 104c stores programs to serve as an intermediate signal storing means 504b, a gain calculating means 506a, and an intermediate signal checking means 505 (described below).

Activated when the voltage generated by the variable analog signal source 101c is approximately equal to the intermediate voltage Vs, the intermediate signal storing means 504b writes, as a first intermediate voltage RAM12, a digital conversion value of a first input voltage V10 to the RAM memory 105 at a third address and writes, as a second intermediate voltage RAM22, a digital conversion value of a second input voltage V20 to the RAM memory 105 at a fourth address.

The gain calculating means 506a calculates a ratio between a first difference voltage that is the difference between the first intermediate voltage RAM12 and the first error voltage RAM11 and a second difference voltage that is the difference between the second intermediate voltage RAM22 and the second error voltage RAM21, that is, a compensation gain K (=(second difference voltage)/(first difference voltage)) or a compensation gain reciprocal H (=(first difference voltage)/(second difference voltage)), and stores it.

The intermediate signal checking means 505 judges whether the second intermediate voltage RAM22 that was stored by the intermediate signal storing means 504b is within a designated range, that is, whether it is lower than or equal to a maximum output voltage Vb of the multi-channel A/D converter 102 and higher than or equal to a designated output voltage Va that is a little lower than the maximum output voltage Vb. If the second intermediate voltage RAM22 is within the designated range, the intermediate signal checking means 505 validates the first and second intermediate voltages RAM12 and RAM22 that were stored by the intermediate signal storing means 504b and causes the gain calculating means 506a to perform a gain calculation. The compensation gain that is used by the above-described gain compensating means 512a is the compensation gain K or the compensation gain reciprocal H that was calculated by the gain calculating means 506a.

Since the compensation gain or the compensation gain reciprocal is calculated by a learning function using the product itself, no step variation occurs between digital conversion values in the low voltage range of the input voltage and those in the high voltage range (i.e., continuity is secured) even if circuit resistance values have large variations, which is in contrast to the case of using a reference gain that is determined on the basis of product sample data or the reciprocal of the reference gain.

In addition, no special reference voltage source needs to be prepared to obtain a second intermediate voltage, which makes it possible to construct an analog signal input circuit that is compact and inexpensive.

Another advantage is that the measured second intermediate voltage RAM22 being low prevents occurrence of a large error in the gain calculation.

In the vehicular electronic control unit 100c according to the third embodiment of the invention, the nonvolatile program memory 104c stores reference gain data R and programs to serve as a compensation storage judging means 509b, a tentative gain compensating means 512b, a tentative selecting and switching means 511b.

The reference gain data R is data that was stored in advance as a reference gain R (=V2/V1) or its reciprocal (reference gain reciprocal) and that is a statistical value such as an average or a center value of a plurality of samples obtained by calculating, for a large number of samples, the ratio of the measured value V2 of the second correction voltage (211) to the measured value V1 of the first correction voltage (201) in a state that the first input voltage V10 is approximately equal to the intermediate voltage Vs.

The compensation storage judging means 509b judges whether the gain calculating means 506a calculated and stored a compensation gain K or a compensation gain reciprocal H.

The tentative gain compensating means 512b operates instead of the gain compensating means 512a if the judgment result of the compensation storage judging means 509b is "not stored." The tentative gain compensating means 512b calculates a second estimate voltage 213c by subtracting the second error voltage RAM21 from a second present voltage (210) that is a digital conversion value of a second input voltage V20 and dividing the second correction voltage (211) by the reference gain R or multiplying the second correction voltage (211) and the reciprocal of the reference gain R.

The tentative selecting and switching means 511b operates instead of the selecting and switching means 511a if the judgment result of the compensation storage judging means 509b is "not stored." The tentative selecting and switching means 511b selectively uses the second estimate voltage (213c) if the first input voltage V10 is in the intermediate voltage range, that is, lower than the intermediate voltage Vs, and selectively uses a first correction voltage (201) obtained by subtracting the first error voltage RAM11 from a first present voltage (200) that is a digital conversion value of a first input voltage V10 if the first input voltage V10 is in the high voltage range, that is, higher than or equal to the intermediate voltage Vs. And the tentative selecting and switching means 511b issues an instruction to store a digital value proportional to the selection result to the RAM memory 105 at the prescribed address RAM00.

Therefore, when the electronic control unit 100c is in a state that a compensation gain has not been calculated because the input signal voltage has not happened to have a value corresponding to a second intermediate voltage, the reference gain that is based on sample data is used. This prevents occurrence of a large step between digital conversion values in the low voltage range of the input voltage and those in the high voltage range (i.e., continuity is substantially secured). After a second intermediate voltage in the designated range has been measured and a compensation gain has been calculated and stored, the continuity between digital conversion values in the low voltage range of the input voltage and those in the high voltage range is improved and the accuracy of A/D conversion is further increased as a whole.

In addition, no special reference voltage source needs to be prepared to obtain a second intermediate voltage, which makes it possible to construct an analog signal input circuit that is compact and inexpensive.

In the vehicular electronic control unit 100c according to the third embodiment of the invention, the nonvolatile program memory 104c stores a program to serve as a variable weighted averaging means 512b. The variable weighted averaging means 512b calculates a weighted average voltage in the range (low voltage range) where the curve 213c of the second estimate voltage and the curve 201 of the first correction voltage overlap with each other. The variable weighted averaging means 512b calculates a weighted average in such a manner as to decrease the weight coefficient (1 to 0) of the weighted averaging operation by which to multiply the second estimate voltage (213c) and to increase the weight coefficient (0 to 1) by which to multiply the first correction voltage (201) as the absolute value of the difference between the second estimate voltage (213c) and the first correction voltage (201) increases, and employs the weighted average as a second average voltage (214c). The tentative selecting and switching means 511b selectively uses the second average voltage (214c) instead of the second estimate voltage 213c.

Therefore, even if the continuity between the digital conversion value of the second estimate voltage (213c) and that of the first correction voltage (201) is insufficient in an actual product, a steep variation of the digital conversion value can be prevented, that is, a gentle transition is attained.

In the vehicular electronic control unit 100c according to the third embodiment of the invention, the error signal storing means 503b, the intermediate signal storing means 504b, the intermediate signal checking means 505, and the gain calculating means 506a operate immediately after a start of operation of the electronic control unit 100c. And the nonvolatile program memory 104c stores programs to serve as a regular calibration timing judging means 508 and an irregular calibration timing judging means 509a.

The regular calibration timing judging means 508 causes the error signal storing means 503b, the intermediate signal storing means 504b, the intermediate signal checking means 505, and the gain calculating means 506a to operate repeatedly, that is, every time a time that is taken for the environment temperature to vary by an amount that would cause a state that a re-calibration is desirable has elapsed or the variable analog signal source 101c has become unused.

Activated if the judgment result of the intermediate signal checking means 505 is "out of the designated range" immediately after a start of operation of the electronic control unit 100c or during a regular calibration, the irregular calibration timing judging means 509a issues an instruction to activate the intermediate signal storing means 504b and the intermediate signal checking means 505 repeatedly in subsequent operation cycles. The irregular calibration timing judging means 509a activates the gain calculating means 506a if the checking result of the intermediate signal checking means 505 is "within the designated range."

An instant when the input signal voltage happens to have a value corresponding to the intermediate voltage Vs is found quickly and a gain is calculated immediately if the checking result of the intermediate signal checking means 505 is "within the designated range." And the compensation gain that is used by the gain compensating means is changed from the reference gain R to the compensation gain K that has been obtained by the gain calculation. As a result, accurate A/D conversion can be performed over the entire input voltage range.

In the vehicular electronic control unit 100c according to the third embodiment of the invention, the nonvolatile program memory 104a stores programs to serve as conversion-into-integer means 514a and 514b, which multiply a digital conversion value of an analog signal voltage by a prescribed fixed factor N and stores the product in the RAM memory 105. The fixed factor N is set so that even a maximum numerical value to be stored in the RAM memory 105 is smaller than or equal to a limit value that is determined by a data bit length that can be handled by the microprocessor 103c. A decimal part of a value that is obtained by multiplying gain-compensated data such as the second compensation voltage (212c), the second estimate voltage (213c), or the second average voltage (214c) by the fixed factor N is discarded.

Since a finally obtained digital conversion value does not have a decimal part, the operation processing speed of the microprocessor 103c can be increased in a subsequent stage of its use.

Embodiment 4

The entire configuration of a vehicular electronic control unit according to a fourth embodiment of the invention will be described below with reference to a circuit block diagram of FIG. 10.

Figure 10:
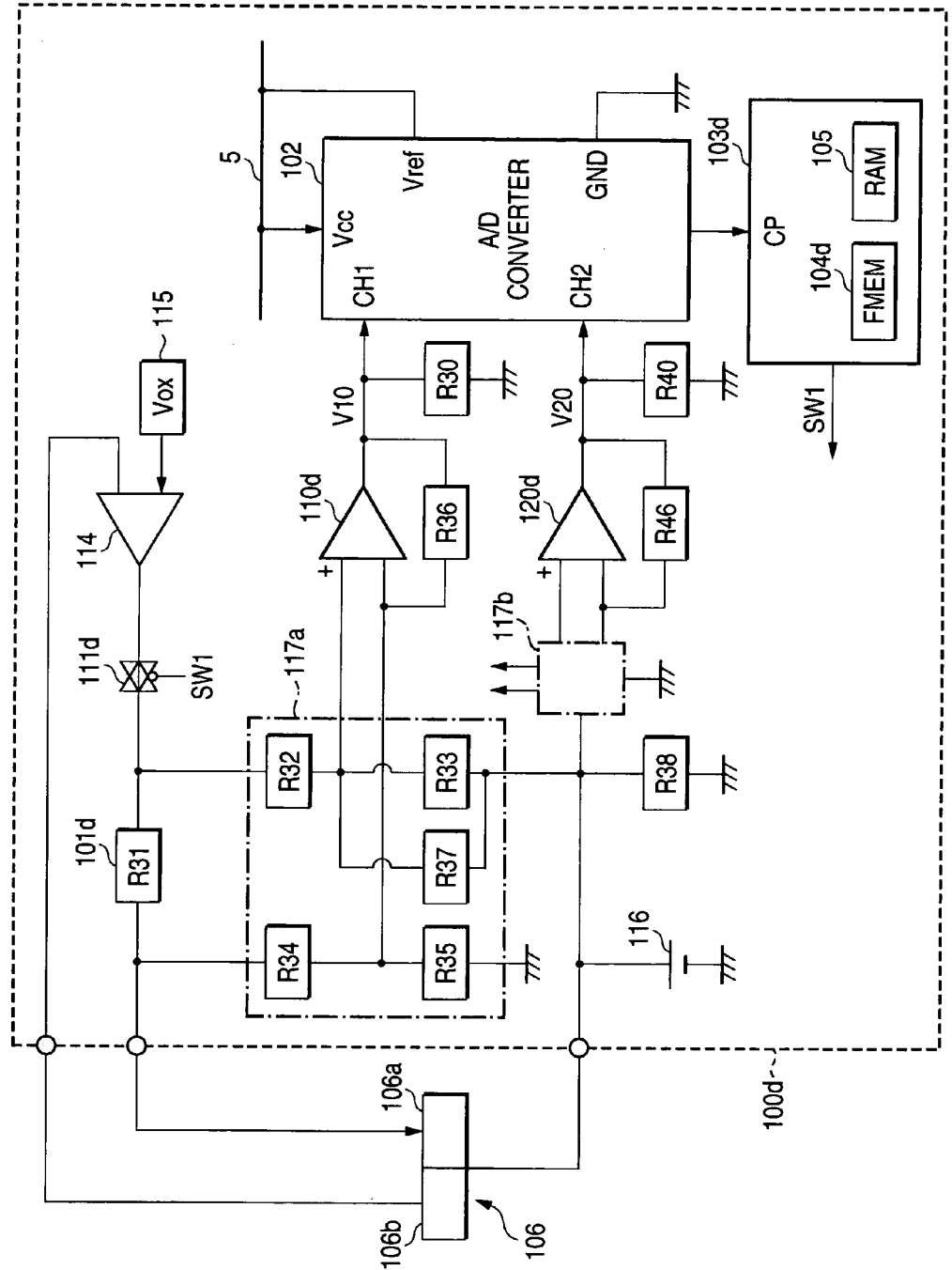
FIG. 10 is a circuit block diagram showing the entire configuration of a vehicular electronic control unit according to a fourth embodiment of the invention.

In FIG. 10, reference symbol 100d denotes a vehicular electronic control unit such as an engine control unit that is mounted on an automobile. An exhaust gas sensor 106 that is one of many analog sensors is connected to the electronic control unit 100d.

Reference numeral 102 denotes a multi-channel A/D converter having a resolution of 10 bits that is provided inside the electronic control unit 100d. A regulated DC voltage 5 V is applied to a voltage source terminal Vcc and a reference voltage terminal Vref of the multi-channel A/D converter 102. A first input voltage V10 of 0 to 5 V and a second input voltage V20 of 0 to 5 V are applied to a first input terminal CH1 and a second input terminal CH2 of the multi-channel A/D converter 102, respectively.

Many other analog signal sources (not shown) are input to the multi-channel A/D converter 102. Analog voltage values that are input to the respective input channels are sequentially converted into digital values, which are stored in a buffer memory that is provided in the multi-channel A/D converter 102.

Reference symbol 103d denotes a microprocessor capable of processing 32-bit data, for example, simultaneously, and symbol 104d denotes a nonvolatile program memory that is bus-connected to the microprocessor 103d. The program memory 104d stores not only various control programs and control constants for operation as a vehicular electronic unit but also various programs and control data for various control means of this embodiment.

Reference numeral 105 denotes a RAM memory for computation that is bus-connected to the microprocessor 103d. The RAM memory 105 also serves as a data memory; digital data that are stored in the buffer memory of the multi-channel A/D converter 102 can be read out by the microprocessor 103d and written to the RAM memory 105 when necessary.

The exhaust gas sensor 106 has an oxygen pump device 106a made of a zirconia solid electrolyte and an oxygen concentration cell device 106b also made of a zirconia solid electrolyte. The oxygen pump device 106a and the oxygen concentration cell device 106b are housed in a gas detection chamber (not shown) that is formed by gas passage walls made of a gas diffusion porous material. The temperature of the oxygen pump device 106a and oxygen concentration cell device 106b are controlled by using a ceramic electric heater (not shown) so as to establish a constant temperature environment.

Reference numeral 114 denotes a pump current supply circuit that is a comparison control circuit, and numeral 115 denotes a reference voltage generation circuit for generating a constant voltage 450 mV. An oxygen concentration detection voltage generated by the oxygen concentration cell device 106b is applied to the negative-side input terminal of the pump current supply circuit 114, and the reference voltage generated by the reference voltage generation circuit 115 is applied to the positive-side input terminal of the pump current supply circuit 114. Supplied with those voltages, the pump current supply circuit 114 supplies a pump current so that the oxygen concentration detection voltage becomes equal to the reference voltage 450 mV.

The oxygen concentration in the gas detection chamber varies depending on the magnitude and the sign of the pump current Ip that is supplied from the pump current supply circuit 114. The relationship between the pump current Ip and the air-fuel ratio A/F that is the ratio of the air weight A to the fuel weight F of an air fuel mixture supplied to the engine is such that, for example, Ip amounts to −4.4, 0, and 3.8 mA when A/F is equal to 10, 14.57, and 40, respectively. In particular, Ip amounts to 6.0 mA in the atmospheric environment in which A/F is infinite.

Reference numeral 116 denotes a bias voltage source for supplying a negative current to the pump device 106a. Reference symbol 111d denotes a power shutoff analog switch that is provided between the pump current supply circuit 114 and the oxygen pump device 106a. Reference symbol 101d denotes a variable analog signal source that employs, as an analog signal source, the voltage across a current detection resistor R31 that is provided between the output terminal of the pump current supply circuit 114 and the oxygen pump device 106a. A positive pump current Ip is supplied from the pump current supply circuit 114 to the oxygen pump device 106a so as to go through, in order, the power shutoff analog switch 111d, the current detection resistor R31, the oxygen pump device 106a, and the bias voltage source 116. A negative pump current Ip is supplied from the bias voltage source 116 to the oxygen pump device 106a so as to go through, in order, the oxygen pump device 106a, the current detection resistor R31, the power shutoff analog switch 111d, and the pump current supply circuit 114.

Reference symbols R32 and R33 denote a series connection of voltage division resistors that is connected to the connecting point of the power shutoff analog switch 111d and the current detection resistor R31. A parallel resistor R37 is connected in parallel to the voltage division resistor R33.

Reference symbols R34 and R35 denote a series connection of voltage division resistors to which the voltage at the connecting point of the current detection resistor R31 and the oxygen pump device 106a is applied.

Reference symbol 110d denotes a first amplifier that is connected to a pull-down resistor R30 and that supplies the first input voltage V10 to the first input terminal CH1 of the multi-channel A/D converter 102. The positive-side input terminal of the first amplifier 110d is connected to the connecting point of the voltage division resistors R32 and R33. The negative-side input terminal of the first amplifier 110d is connected to the connecting point of the voltage division resistors R34 and R35, and is also connected to the output terminal of the first amplifier 110d via a feedback resistor R36.

Reference symbol 117a denotes a first voltage divider circuit that consists of the voltage division resistors R32, R33, R34, and R35 and the parallel resistor R37. Reference symbol R38 denotes a low-resistance resistor that is connected in parallel to the bias voltage source 116. The negative side of the voltage division resistor R33 and the parallel resistor R37 is connected to the bias voltage source 116.

The design resistance values of the resistors are set symmetrically, that is, R32=R34, R33=R35, and R36=R37. The first input voltage V10 produced by the first amplifier 110d does not have a negative value because of the addition of the voltage across the current detection resistor R31 as the variable analog signal source 101d and the voltage of the bias voltage source 116.

Reference symbol 120d denotes a second amplifier that is connected to a pull-down resistor R40 and that supplies the second input voltage V20 to the second input terminal CH2 of the A/D converter 102. Reference symbol 117b denotes a second voltage divider circuit that is equivalent to the first voltage divider circuit 117a and that is connected to both terminals of the current detection resistor R31. The negative-side input terminal of the second amplifier 120d is connected to the output terminal of the second amplifier 120d via a feedback resistor R46.

As a result, the ratio of the second input voltage V20 to the first voltage V10, i.e., a prescribed theoretical gain G, is calculated on the basis of the circuit constants of the first voltage divider circuit 117a and the second voltage divider circuit 117b.

FIG. 1A is a graph showing an input/output characteristic of the multi-channel A/D converter 102 shown in FIG. 10. The horizontal axis represents the analog input voltage (first input voltage V10) and the vertical axis represents the digital conversion value corresponding to the first input voltage V10 or the second input voltage V20.

A full-scale voltage Vf which is the maximum value of the analog input voltage is the voltage that is applied to the reference voltage terminal Vref of the multi-channel A/D converter 102 and is DC 5V in this embodiment. A maximum output voltage Vb which is the maximum value of the digital conversion value is equal to a digital dedicated value 1,023 in this embodiment.

Reference numeral 200 is the first present voltage obtained by digital conversion of the first input voltage V10, Vd is a bias voltage due to the bias voltage source 116, V0 is a reference bias voltage which is a digital conversion value of the bias voltage Vd, the first error voltage (RAM11) is a value of difference between the first present voltage 200 and the reference bias voltage V0 when the first input voltage V10 is equal to the bias voltage Vd that is, when the voltage across the current detection resistor R31 is zero.

Reference numeral 201 is the first correction voltage that is obtained by digitally subtracting the first error voltage RAM11 from the first present voltage 200. Reference symbol 201b in FIG. 11B denotes an intermediate portion of the curve 201.

Reference symbol 210 denotes a curve representing a relationship between the first input voltage V10 and the digital conversion value (i.e., second present voltage) corresponding to the second input voltage V20. Since the second input voltage V20 is the voltage obtained by amplifying the first input voltage V10 at the theoretical gain G, the digital conversion value reaches a maximum output voltage Vb=1,023 when the first input voltage V10 becomes equal to an intermediate voltage of about 3 V, for example. The second present voltage (210) is equal to a second error voltage RAM21 plus the reference bias voltage V0 when the first input voltage V10 is equal to the bias voltage Vd.

Reference numeral 211 denotes a curve representing a relationship between the first input voltage V10 and the second correction voltage that is obtained by digitally subtracting the second error voltage RAM21 from the second present voltage (210).

Figure 11A:
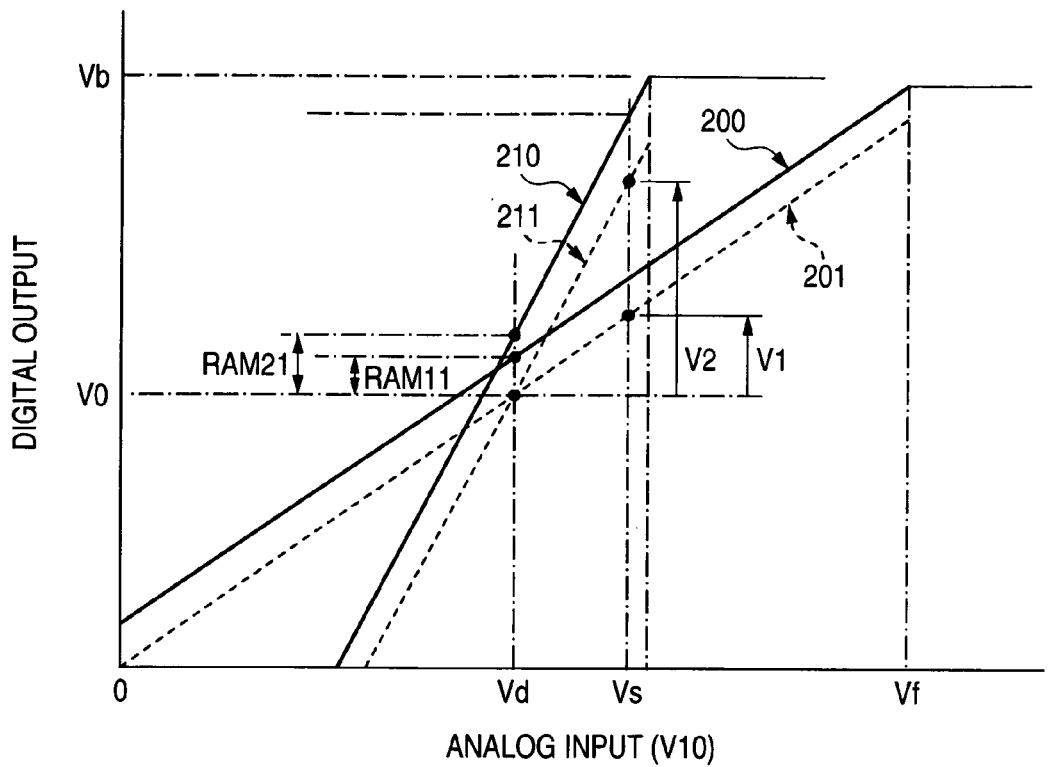
FIGS. 11A and 11B are graphs showing an input/output characteristic of a multi-channel A/D converter shown in FIG. 10.
Figure 11B:
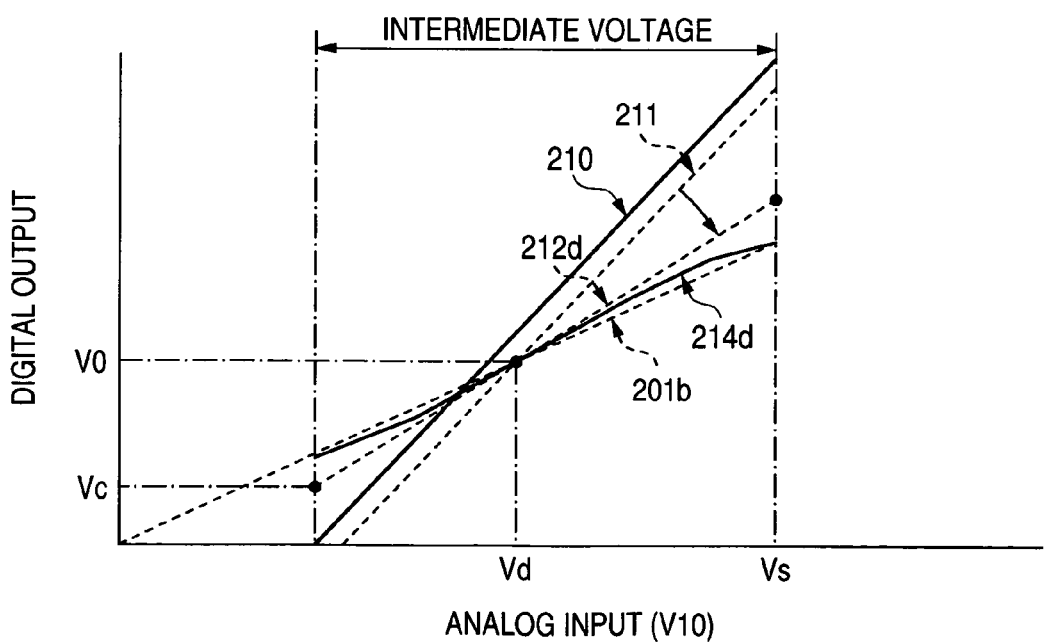

In FIG. 11B showing, in an enlarged manner, the region where the first input voltage V10 is in the intermediate range, reference symbol 201b denotes the intermediate portion of the curve 201 of the first correction voltage. Reference symbol 212d denotes a curve representing a relationship between the first input voltage V10 and the second compensation voltage that is obtained by dividing, by the theoretical gain G, the second increment obtained by subtracting the reference bias voltage V0 from the second correction voltage (211) and then adding the reference bias voltage V0 to the quotient. If the amplification factors of the first and second amplifiers 110d and 120d are correct and the ratio between the amplification factors for the voltage across the current detection resistor R31 is equal to the theoretical gain G, the curve 212d of the second compensation voltage coincides with the intermediate portion 201b of the curve 201 of the first correction voltage.

However, the following problem exists. The resistance values of the resistors of the first and second voltage divider circuits 117a and 117b and the feedback resistors R36 and R46 shown in FIG. 10 have variations. For example, slight deviations occur even if they are high-accuracy resistors whose errors are within 0.1%, for example. Such errors are on the same level as the resolution of the multi-channel A/D converter 102. It is unlikely that the curve 212d of the second compensation voltage exactly coincides with the intermediate portion 201b of the curve 201 of the first correction voltage.

However, in practice, the error between the curve 212d and the intermediate portion 201b is reduced by using, instead of the theoretical gain G, a reference gain R that is a measured average based on a large number of product samples.

Reference numeral 214d denotes a curve representing a relationship between the first input voltage V10 and the second average voltage, which is the weighted average voltage of the second compensation voltage (212d) and the first correction voltage (201, 201b) in the intermediate range. The weighted average as the second average voltage is calculated in such a manner that the weight coefficient (1 to 0) of the weighted averaging operation by which to multiply the second compensation voltage (212d) is decreased and the weight coefficient (0 to 1) by which to multiply the first correction voltage (201) is increased as the absolute value of the difference between the second compensation voltage (212d) and the first correction voltage (201) increases.

Therefore, weight is attached to the second compensation voltage (212d) in the vicinity of the reference point where both of the first input voltage V10 and the second input voltage V20 are equal to the bias voltage Vd, and greater weight is attached to the first correction voltage (201) as the position concerned goes away from the reference point. In this manner, a stepwise variation is prevented when the position concerned moves from the intermediate region to an outside region.

The intermediate range of the first input voltage V10 is a range lower than or equal to the intermediate voltage Vs where the second present voltage (210) is approximately equal to the maximum output voltage Vb, the second present voltage 210 becomes 0 V and higher than or equal to a voltage where the second compensation voltage (212d) is equal to a lower limit output voltage Vc.

The operation of the vehicular electronic control unit 100d according to the fourth embodiment that is configured as shown in FIG. 10 will be described below with reference to a flowchart of FIG. 12.

Figure 12:
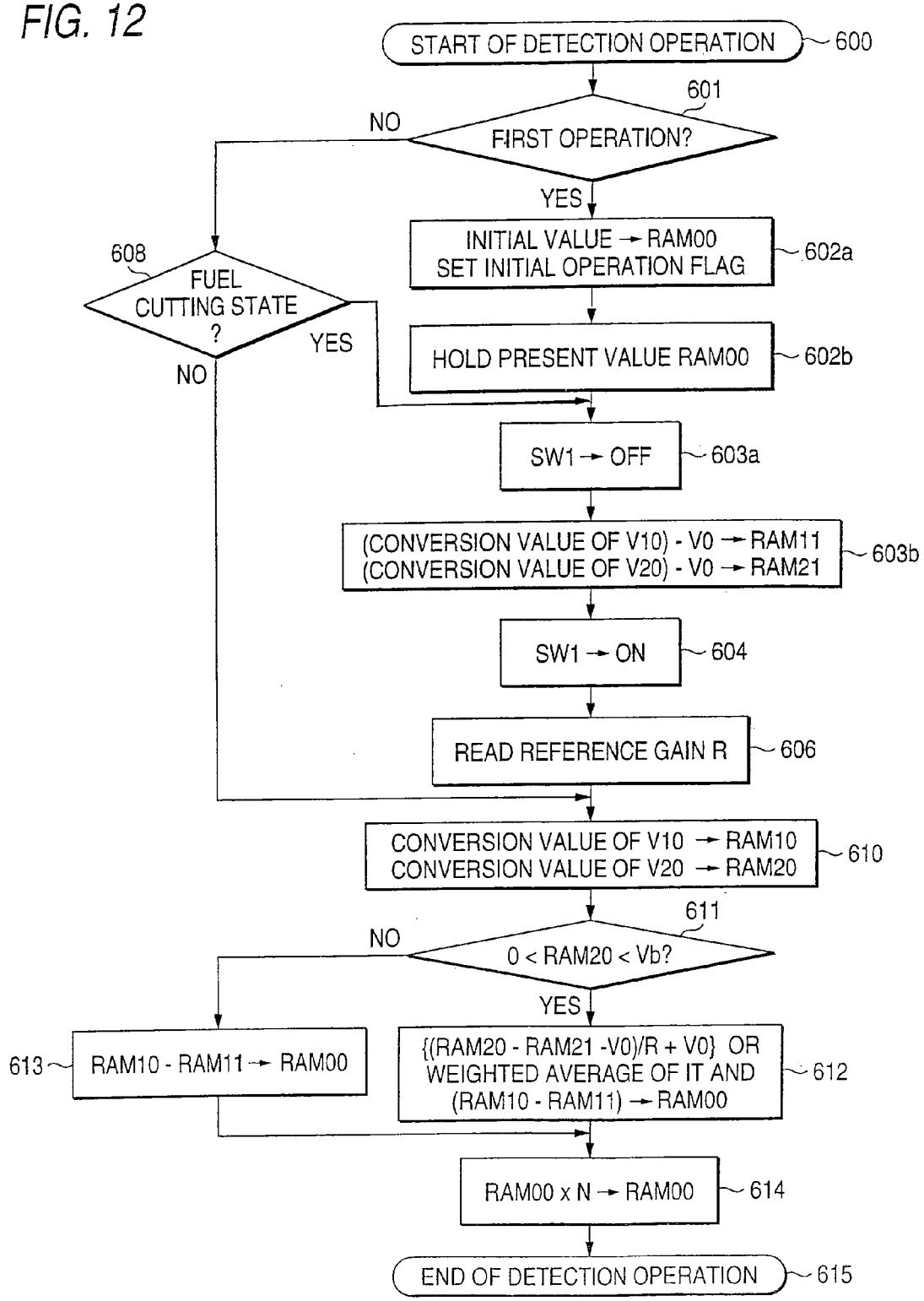
FIG. 12 is a flowchart showing the operation of the vehicular electronic control unit according to the fourth embodiment.

In FIG. 12, at a start step 600, a calibration operation of the microprocessor 103d is started. The start step 600 is activated repeatedly, that is, every time an operation end step 615 (described later) is executed.

At step 601 which is executed after step 600, it is judged whether the current operation is the first one by monitoring whether an initial operation flag (not shown) was set at the next step 602a. At step 602a which is executed if the judgment result of step 601 is "yes," (i.e., the current operation is the first one), an initial value is written to the RAM memory 105 at a prescribed address RAM00 and the initial operation flag is set. The set state of the initial operation flag is maintained until power-off of the electronic control unit 100d.

The address RAM00 is an address where a digital conversion value that is proportional to an addition voltage of a voltage generated by the variable analog signal source 101d and the bias voltage is written. When the microprocessor 103d needs a digital conversion value that is proportional to an addition voltage, the microprocessor 103a reads out and uses the data stored at the address RAM00 when necessary.

At step 602b which is executed after step 602a, writing to the area having the address RAM00 is prohibited to prevent the data at the address RAM00 from being changed. At step 603a which is executed after step 602b, the supply of the first instruction signal SW1 is stopped to open the first analog switch 111d. At step 603b which is executed after step 603a, a value obtained by subtracting the reference bias voltage V0 from a digital conversion value corresponding to a first input voltage V10 is written, as a first error voltage RAM11, to the RAM memory 105 at a first address and a value obtained by subtracting the reference bias voltage V0 from a digital conversion value corresponding to a second input voltage V20 is written, as a second error voltage RAM21, to the RAM memory 105 at a second address. At step 604 which is executed after step 603b, the first instruction signal SW1 is generated to make the first analog switch 111d conductive. At step 606 which is activated after step 604, the reference gain R is read out. The reference gain R that is read out at step 606 is data that was stored in the nonvolatile program memory 104d in advance and that is a measured average gain, that is, an average, over a large number of product samples, of the ratio V2/V1 of the measured value V2 of the second increment voltage to the measured value V1 of the first increment voltage in a state that the first input voltage V10 was equal to the intermediate voltage Vs.

The reference bias voltage V0 is an intrinsic digital conversion value that should be obtained when the normal bias voltage Vd is applied. The first and second error voltages RAM11 and RAM21 occur if the actual bias voltage Vd has an error.

At step 608 which is executed if the judgment result of step 601 is "no" (i.e., the current operation is not the first one), it is judged whether to perform a calibration again. A judgment result "yes" is produced at step 608 and a transition is made to step 602b repeatedly, that is, every time a time that is taken for the environment temperature of the control circuit unit to vary has elapsed or the exhaust gas sensor 106 has become unused (fuel cutting state).

At step 610 which is executed if the judgment result of step 608 is "no" (i.e., a regular calibration has already been performed) or when step 606 has just been executed, a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105.

At step 611 which is executed after step 610, it is judged whether the second present voltage RAM20 is higher than 0 V and lower than the maximum output voltage Vb. At step 612 which is executed if the judgment result of step 611 is "yes" (i.e., the first input voltage V10 is in the intermediate range), a second compensation voltage (212d) that is obtained by calculating a second correction voltage (211) by subtracting the second error voltage RAM21 from the second present voltage RAM20, dividing, by the reference gain R that was read out at step 606, a second increment obtained by subtracting the reference bias voltage V0 from the second correction voltage (211), and then adding the reference bias voltage V0 to the quotient, and the thus-obtained second compensation voltage (212d) is stored in the RAM memory 105 at the prescribed address RAM00. At step 613 which is executed if the judgment result of step 611 is "no" (i.e., the first input voltage V10 is in an outside range), a first correction voltage (201) obtained by subtracting the first error voltage RAM11 from the first present voltage RAM10 is stored as it is in the RAM memory 105 at the prescribed address RAM00. At step 614 which is executed after step 612 or 613, the value stored at the address RAM00 is multiplied by a fixed factor N and the product is caused to overwrite the value stored at the address RAM00. Step 615 is an operation end step which is executed after step 614.

Alternatively, step 612 may be such that variable weighted averaging (described above) is performed and a resulting value is stored at the prescribed address RAM00.

If the reciprocal of the reference gain R is stored, the division at step 612 can be replaced by multiplication. This is advantageous because the microprocessor 103d can perform multiplication faster than division.

Another modification is as follows. At step 606 an enlargement factor X (=(fixed factor N)/(reference gain R)) is read out, at step 612 the second increment is multiplied by the enlargement factor X rather than divided by the reference gain R, and at step 613 the first correction voltage (201) is multiplied by the fixed factor N. This is advantageous in that the number of operations at step 612 can be reduced.

Examples of the reference gain R and the fixed factor N are 3.05 and 32, respectively, in which case the enlargement factor X becomes 10.49. Even if the decimal point is eliminated from a calculation result of step 612, no large error is produced because the decimal point is eliminated from a value that has been multiplied by 32 in advance.

As described above, in the fourth embodiment, the range of the input voltage to be subjected to A/D conversion is divided into the intermediate range and the outside ranges and a digital conversion value is synthesized by using the reference gain R. This has been described above with reference to FIG. 10 (reference numerals are in the 100s), FIGS. 11A and 11B (reference numerals are in the 200s), and FIG. 12 (reference numerals are in the 600s).

The vehicular electronic control unit 100d according to the fourth embodiment of the invention is configured as follows. A voltage generated by the variable analog signal source 101d is input to the multi-channel A/D converter 102 via the analog signal input circuit and a resulting digital value is written to the RAM memory 105 via the microprocessor 103d. The exhaust gas sensor 106 having the oxygen pump device 106a and the oxygen concentration cell device 106b is an exemplary variable analog signal source. A variable analog signal circuit is formed by the pump current supply circuit 114 for supplying a positive or negative pump current to the oxygen pump device 106a, the current detection resistor R31 that is connected to the pump current supply circuit 114, and the bias voltage source 116 for adding a bias voltage to a positive or negative signal voltage obtained by differentially amplifying a voltage across the current detection resistor R31. The analog signal input circuit is equipped with a full-range input circuit and an enlarged range input circuit (described later). The microprocessor 103d is one capable of handling digital data that is more accurate, that is, longer in bit length, as compared to the resolution of the multi-channel A/D converter 102. The nonvolatile program memory 104d which cooperates with the microprocessor 103d stores programs to serve as an error signal storing means 603b, a gain compensating means 612, and a selecting and switching means 611 (described later).

The full-range input circuit is an input circuit that is provided between the variable analog signal circuit and the first input terminal CH1 of the multi-channel A/D converter 102 and that produces a first input voltage V10. The input circuit includes the first amplifier 110d and is configured so that the first input voltage V10 becomes approximately equal to a full-scale input voltage Vf of the multi-channel A/D converter 102 when the output voltage of the variable analog signal circuit is at the maximum.

The enlarged range input circuit is an input circuit that is provided between the variable analog signal circuit and the second input terminal CH2 of the multi-channel A/D converter 102 and that produces a second input voltage V20. The input circuit includes the second amplifier 120d and is configured so that the second input voltage V20 becomes approximately equal to the full-scale input voltage Vf of the multi-channel A/D converter 102 when the first input voltage V10 is equal to a prescribed intermediate voltage Vs that is lower than the maximum voltage.

Activated when the voltage across the current detection resistor R31 is zero and both of the first and second input voltages V10 and V20 are equal to a prescribed bias voltage Vd, the error signal storing means 603b determines error voltages as measured from a reference bias voltage V0 that is an intrinsic digital conversion value that corresponds to a normal bias voltage that complies with the specification. The error signal storing means 603b writes, as a first error voltage RAM11, a value obtained by subtracting the reference bias voltage V0 from a digital conversion value of a first input voltage V10 to the RAM memory 105 at a first address, and writes, as a second error voltage RAM21, a value obtained by subtracting the reference bias voltage V0 from a digital conversion value of a second input voltage V20 to the RAM memory 105 at a second address.

The gain compensating means 612 produces a second compensation voltage (212d) by calculating a second correction voltage (211) by subtracting the second error voltage RAM21 from a second present voltage (210) that is a digital conversion value of a second input voltage V20, dividing, by a compensation gain, a second increment voltage obtained by subtracting the reference bias voltage V0 from the second correction voltage (211) or multiplying it by the reciprocal of the compensation gain, and adding the reference bias voltage V0 to the quotient or product. The compensation gain is set so that the second compensation voltage (212d) becomes approximately equal to a first correction voltage (201) (i.e., a value (201b) in the intermediate range) obtained by subtracting the first error voltage RAM11 from a first present voltage (200) that is a digital conversion value of a first input voltage V10.

The selecting and switching means 611 selectively uses the second compensation voltage (212d) if the first input voltage V10 is in the intermediate range 201b, that is, lower than the intermediate voltage Vs, and selectively uses the first correction voltage (201) if the first input voltage V10 is in an outside range, that is, a range other than the intermediate range 201b. And the selecting and switching means 611 issues an instruction to store a digital value proportional to the selection result to the RAM memory 105 at a prescribed address RAM00.

In the vehicular electronic control unit 100d according to the fourth embodiment of the invention, the variable analog signal circuit is equipped with the power shutoff analog switch 111d. The nonvolatile program memory 104d stores a program to serve as an error signal input means 603a and a program to serve as at least one of a fuel cutting detecting means 608 and a present status holding means 602b. The power shutoff analog switch 111d is an opening/closing element that forcibly makes the input signal voltage of the full-range input circuit and the enlarged range input circuit equal to the bias voltage Vd (which is added to the input of the first and second amplifiers by the bias voltage source 116) by preventing a current flow through the current detection resistor R31. The error signal input means 603a on/off-controls the power shutoff analog switch 111d in accordance with a first instruction signal SW1 supplied from the microprocessor 103d, and causes the error signal storing means 603b to operate.

The fuel cutting detecting means 608 judges that a fuel cutting state is established if fuel supply is not being done though control power is supplied immediately before a drive, during a descending/coasting drive, or during a decelerating/coasting drive. The present status holding means 602b prevents data that was selected and stored in the RAM memory 105 by the selecting and switching means 611 from being changed, that is, keeps the data at the value that was in storage immediately before the start of operation of the error signal input means 603a, while the error signal input means 603a is in operation. The error signal input means 603a causes the error signal storing means 603b to operate if the judgment result of the fuel cutting means 608 is "yes" or while the present status holding means 602b is in operation.

Therefore, the microprocessor 103d can compensate for an error in the bias voltage Vd when necessary even if the actual voltage across the current detection resistor R31 is not zero. Occurrence of an erroneous digital conversion value can be prevented because a preceding digital conversion value is held during error adjustment processing.

In particular, if performed in a fuel cutting state, an error adjustment does not influence an air-fuel ratio control because the output of the exhaust gas sensor 106 is not used in that state.

In the vehicular electronic control unit 100d according to the fourth embodiment of the invention, the nonvolatile program memory 104d stores reference gain data, which is data that was stored in advance as a reference gain R (=V2/V1) or its reciprocal (reference gain reciprocal) and that is a statistical value such as an average or a center value of a plurality of samples obtained by calculating, for a large number of samples, the ratio of the measured value V2 of the second increment voltage obtained by subtracting the reference bias voltage V0 from the second correction voltage (211) to the measured value V1 of the first increment voltage obtained by subtracting the reference bias voltage V0 from the first correction voltage 201 in a state that the first input voltage V10 was approximately equal to the intermediate voltage Vs. The compensation gain that is used by the above-described gain compensating means 612 is the reference gain R.

Since a reference gain R corresponding to center values of component variations can be calculated in advance by using a large number of product samples, actual products are free of a large step between the second compensation voltage (212d) and the first correction voltage (201) (i.e., continuity is substantially secured).

In the vehicular electronic control unit 100d according to the fourth embodiment of the invention, the nonvolatile program memory 104d stores a program to serve as a variable weighted averaging means 612. The variable weighted averaging means 612 calculates a weighted average voltage in the range where the curve 212d of the second compensation voltage and the curve 201 of the first correction voltage overlap with each other. The variable weighted averaging means 612 calculates a weighted average in such a manner as to decrease the weight coefficient (1 to 0) of the weighted averaging operation by which to multiply the second compensation voltage (212d) and to increase the weight coefficient (0 to 1) by which to multiply the first correction voltage (201) as the absolute value of the difference between the second compensation voltage (212d) and the first correction voltage (201) increases, and employs the weighted average as a second average voltage (214d). The selecting and switching means 611 selectively uses the second average voltage (214d) instead of the second compensation voltage 212d.

Therefore, even if the continuity between the digital conversion value of the second compensation voltage (212d) and that of the first correction voltage (201) is insufficient in an actual product, a steep variation of the digital conversion value can be prevented, that is, a gentle transition is attained.

In the vehicular electronic control unit 100d according to the fourth embodiment of the invention, the error signal storing means 603b operates immediately after a start of operation of the electronic control unit 100d. And the nonvolatile program memory 104d stores a program to serve as a calibration timing judging means 608. The calibration timing judging means 308 causes the error signal storing means 603b to operate repeatedly, that is, every time the exhaust gas sensor 106 has become unused (fuel cutting state).

Since an error adjustment is performed every time a descending/coasting drive or a decelerating/coasting drive is done, calibration processing can be effected timely in accordance with a variation of the use environment.

In the vehicular electronic control unit 100d according to the fourth embodiment of the invention, the nonvolatile program memory 104d stores a program to serve as a conversion-into-integer means 614, which multiplies a digital conversion value of an analog signal voltage by a prescribed fixed factor N and stores the product in the RAM memory 105. The fixed factor N is set so that even a maximum numerical value to be stored in the RAM memory 105 is smaller than or equal to a limit value that is determined by a data bit length that can be handled by the microprocessor 103d. A decimal part of a value that is obtained by multiplying gain-compensated data such as the second compensation voltage (212d) or the second average voltage (214d) by the fixed factor N is discarded.

Since a finally obtained digital conversion value does not have a decimal part, the operation processing speed of the microprocessor 103d can be increased in a subsequent stage of its use.

Embodiment 5

The entire configuration of a vehicular electronic control unit according to a fifth embodiment of the invention will be described below with reference to a circuit block diagram of FIG. 13.

Figure 13:
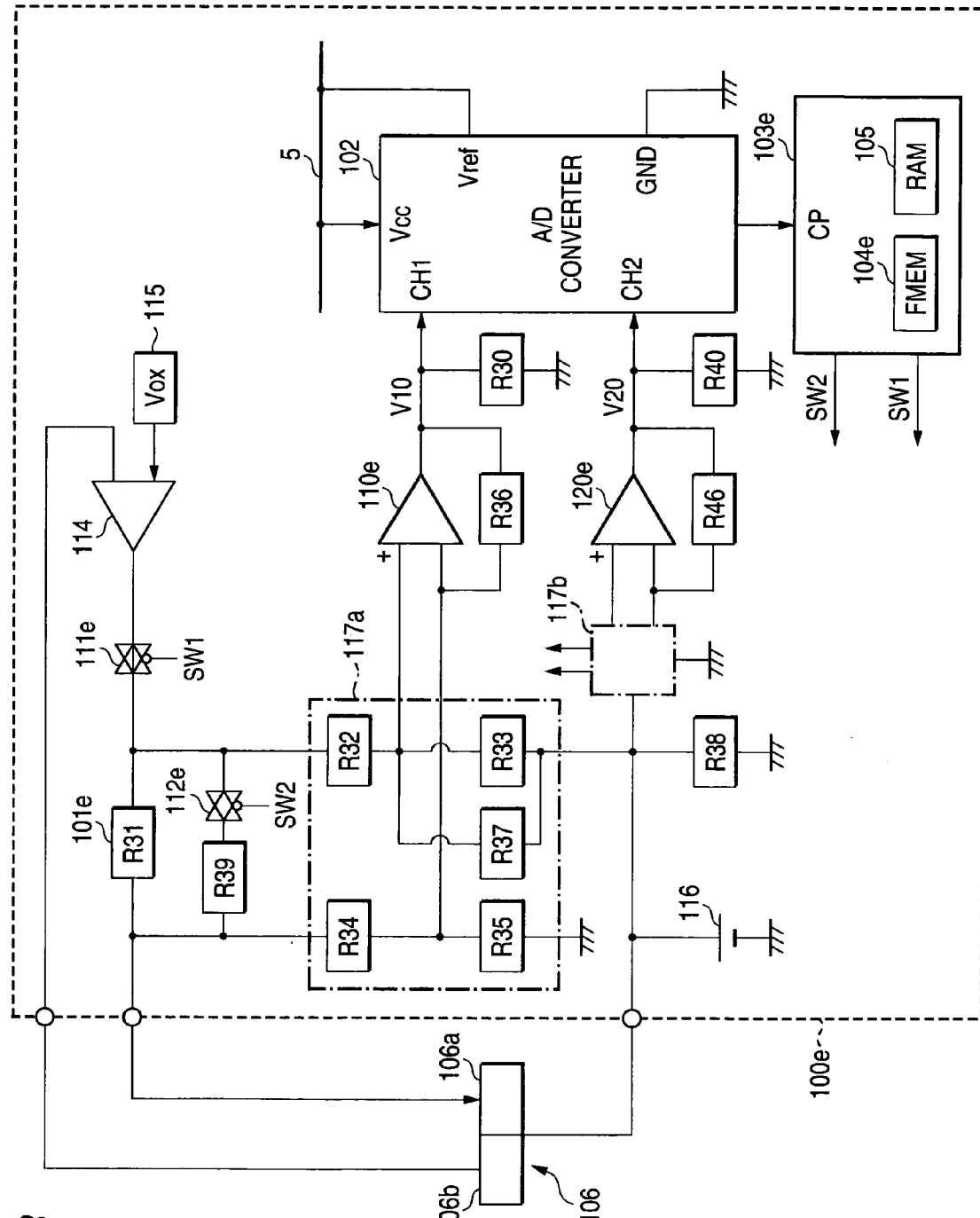
FIG. 13 is a circuit block diagram showing the entire configuration of a vehicular electronic control unit according to a fifth embodiment of the invention.

In FIG. 13, reference symbol 100e denotes a vehicular electronic control unit such as an engine control unit that is mounted on an automobile. An exhaust gas sensor 106 that is one of many analog sensors is connected to the electronic control unit 100e.

Reference numeral 102 denotes a multi-channel A/D converter having a resolution of 10 bits that is provided inside the electronic control unit 100e. A regulated DC voltage 5 V is applied to a voltage source terminal Vcc and a reference voltage terminal Vref of the multi-channel A/D converter 102. A first input voltage V10 of 0 to 5 V and a second input voltage V20 of 0 to 5 V are applied to a first input terminal CH1 and a second input terminal CH2 of the multi-channel A/D converter 102, respectively.

Many other analog signal sources (not shown) are connected to the multi-channel A/D converter 102. Analog voltage values that are input to the respective input channels are sequentially converted into digital values, which are stored in a buffer memory that is provided in the multi-channel A/D converter 102.

Reference symbol 103e denotes a microprocessor capable of processing 32-bit data, for example, simultaneously, and symbol 104e denotes a nonvolatile program memory that is bus-connected to the microprocessor 103e. The program memory 104e stores not only various control programs and control constants for operation as a vehicular electronic unit but also various programs and control data for various control means of this embodiment.

Reference numeral 105 denotes a RAM memory for computation that is bus-connected to the microprocessor 103e. The RAM memory 105 also serves as a data memory; digital data that are stored in the buffer memory of the multi-channel A/D converter 102 can be read out by the microprocessor 103e and written to the RAM memory 105 when necessary.

Like the one shown in FIG. 10, the exhaust gas sensor 106 has an oxygen pump device 106a and an oxygen concentration cell device 106b and is supplied with power from a pump current supply circuit 114.

Reference numeral 116 denotes a bias voltage source for supplying a negative current to the pump device 106a. Reference symbol 111e denotes a power shutoff analog switch that is provided between the pump current supply circuit 114 and the oxygen pump device 106a. Reference symbol 101e denotes a variable analog signal source that employs, as an analog signal source, the voltage across a current detection resistor R31 that is provided between the output terminal of the pump current supply circuit 114 and the oxygen pump device 106a. A positive pump current Ip is supplied from the pump current supply circuit 114 to the oxygen pump device 106a so as to go through, in order, the power shutoff analog switch 111e, the current detection resistor R31, the oxygen pump device 106a, and the bias voltage source 116. A negative pump current Ip is supplied from the bias voltage source 116 to the oxygen pump device 106a so as to go through, in order, the oxygen pump device 106a, the current detection resistor R31, the power shutoff analog switch 111e, and the pump current supply circuit 114.

Reference symbols R32 and R33 denote a series connection of voltage division resistors that is connected to the connecting point of the power shutoff analog switch 111e and the current detection resistor R31. A parallel resistor R37 is connected in parallel to the voltage division resistor R33.

Reference symbols R34 and R35 denote a series connection of voltage division resistors to which the voltage at the connecting point of the current detection resistor R31 and the oxygen pump device 106a is applied.

Reference symbol 110e denotes a first amplifier that is connected to a pull-down resistor R30 and that supplies the first input voltage V10 to the first input terminal CH1 of the multi-channel A/D converter 102. The positive-side input terminal of the first amplifier 110e is connected to the connecting point of the voltage division resistors R32 and R33. The negative-side input terminal of the first amplifier 110e is connected to the connecting point of the voltage division resistors R34 and R35, and is also connected to the output terminal of the first amplifier 110e via a feedback resistor R36.

Reference symbol 117a denotes a first voltage divider circuit that consists of the voltage division resistors R32, R33, R34, and R35 and the parallel resistor R37. Reference symbol R38 denotes a low-resistance resistor that is connected in parallel to the bias voltage source 116. The negative side of the voltage division resistor R33 and the parallel resistor R37 is connected to the bias voltage source 116.

The design resistance values of the resistors are set symmetrically, that is, R32=R34, R33=R35, and R36=R37. The first input voltage V10 produced by the first amplifier 110e does not have a negative value because of the addition of the voltage across the current detection resistor R31 as the variable analog signal source 101e and the voltage of the bias voltage source 116.

Reference symbol 120e denotes a second amplifier that is connected to a pull-down resistor R40 and that supplies the second input voltage V20 to the second input terminal CH2 of the A/D converter 102. Reference symbol 117b denotes a second voltage divider circuit that is equivalent to the first voltage divider circuit 117a and that is connected to both terminals of the current detection resistor R31. The negative-side input terminal of the second amplifier 120e is connected to the output terminal of the second amplifier 120e via a feedback resistor R46.

As a result, the ratio of the second input voltage V20 to the first voltage V10, i.e., a prescribed theoretical gain G, is calculated on the basis of the circuit constants of the first voltage divider circuit 117a and the second voltage divider circuit 117b.

A current decrease detection analog switch 112e and a parallel resistor R39, which are connected to each other in series, are connected in parallel to the current detection resistor R31. The current decrease detection analog switch 112e is on/off controlled by a second instruction signal SW2 that is generated by the microprocessor 103e.

The pump current Ip has a prescribed maximum value in a fuel cutting state that fuel injection is not being performed immediately before a start of the engine that has been stopped for a long time, during a descending/coasting drive, or during a decelerating/coasting drive. An intermediate voltage Vs is obtained in this state by closing the current decrease detection analog switch 112e and thereby connecting the parallel resistor R39 to the current detection resistor R31.

However, the maximum pump current cannot be obtained and hence a compensation gain K or a compensation gain reciprocal H (described later) cannot be calculated until the environment temperature of the exhaust gas sensor 106 becomes an optimum value. During that period, a compensation calculation is performed by using the theoretical gain G or a reference gain R.

Figure 14A:
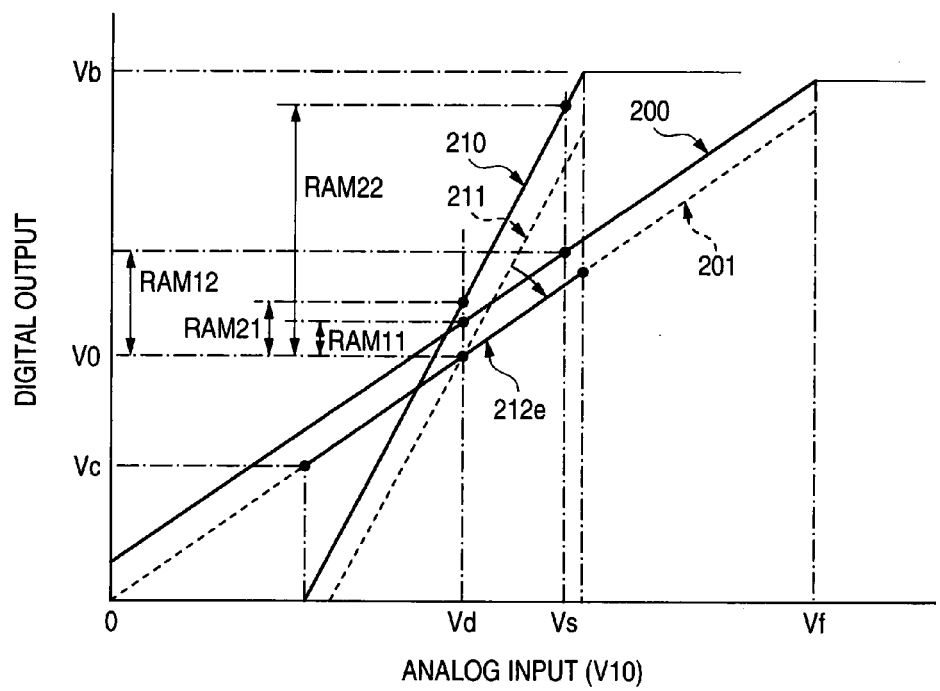
FIGS. 14A and 14B are graphs showing an input/output characteristic of a multi-channel A/D converter shown in FIG. 13.

FIG. 14A is a graph showing an input/output characteristic of the multi-channel A/D converter 102 shown in FIG. 13. The horizontal axis represents the analog input voltage (first input voltage V10) and the vertical axis represents the digital conversion value corresponding to the first input voltage V10 or the second input voltage V20.

A full-scale voltage Vf which is the maximum value of the analog input voltage is the voltage that is applied to the reference voltage terminal Vref of the multi-channel A/D converter 102 and is DC 5V in this embodiment. A maximum output voltage Vb which is the maximum value of the digital conversion value is equal to a digital dedicated value 1,023 in this embodiment.

Reference numeral 200 denotes a curve representing a relationship between the first input voltage V10 and the corresponding digital conversion value, that is, the first present voltage. The first present voltage is equal to a first error voltage RAM11 plus a reference bias voltage V0 that is a digital conversion value of a bias voltage Vd when the first input voltage V10 is equal to the bias voltage Vd. The bias voltage Vd is a first input voltage V10 that is obtained when the voltage across the current detection resistor R31 is zero, that is, a voltage originating from the bias voltage source 116.

Reference numeral 201 denotes a curve representing a relationship between the first input voltage V10 and the first correction voltage that is obtained by digitally subtracting the first error voltage RAM11 from the first present voltage (200). Reference symbol 201b in FIG. 14B denotes an intermediate portion of the curve 201.

Reference symbol 210 denotes a curve representing a relationship between the first input voltage V10 and the digital conversion value (i.e., second present voltage) corresponding to the second input voltage V20. Since the second input voltage V20 is the voltage obtained by amplifying the first input voltage V10 at the theoretical gain G, the digital conversion value reaches a maximum output voltage Vb=1,023 when the first input voltage V10 becomes equal to an intermediate voltage of about 3 V, for example. The second present voltage (210) is equal to a second error voltage RAM21 plus the reference bias voltage V0 when the first input voltage V10 is equal to the bias voltage Vd.

Reference numeral 211 denotes a curve representing a relationship between the first input voltage V10 and the second correction voltage that is obtained by digitally subtracting the second error voltage RAM21 from the second present voltage (210). Reference symbol 212e denotes a curve representing a relationship between the first input voltage V10 and the second compensation voltage that is obtained by multiplying, by a compensation gain reciprocal H, the second increment obtained by subtracting the reference bias voltage V0 from the second correction voltage (211) and then adding the reference bias voltage V0 to the product. The compensation gain reciprocal H is calculated according to the above-mentioned Equation (5).

Figure 14B:
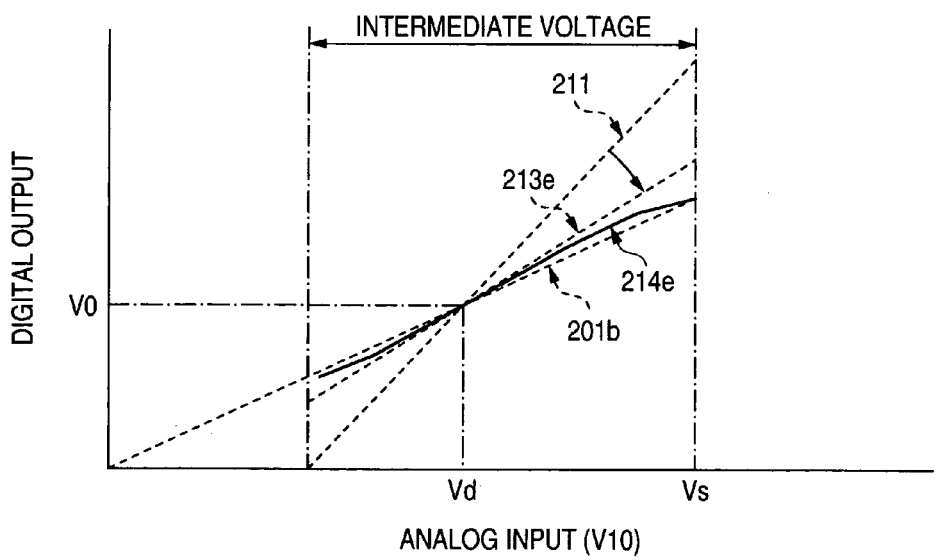

In FIG. 14B showing, in an enlarged manner, the region where the first input voltage V10 is in the intermediate range, reference symbol 201b denotes the intermediate portion of the curve 201 of the first correction voltage. Reference symbol 213e denotes a curve representing a relationship between the first input voltage V10 and the second estimate voltage that is obtained by dividing, by the theoretical gain G, the second increment obtained by subtracting the reference bias voltage V0 from the second correction voltage (211) and then adding the reference bias voltage V0 to the quotient. The second estimate voltage (213e) is used in a state that the above-mentioned compensation gain reciprocal H has not been calculated yet.

If the amplification factors of the first and second amplifiers 110e and 120e are correct and the ratio between the amplification factors for the voltage across the current detection resistor R31 is equal to the theoretical gain G, the curve 213e of the second estimate voltage coincides with the intermediate portion 201b of the curve 201 of the first correction voltage.

However, the following problem exists. The resistance values of the resistors of the first and second voltage divider circuits 117a and 117b and the feedback resistors R36 and R46 shown in FIG. 13 have variations. For example, slight deviations occur even if they are high-accuracy resistors whose errors are within 0.1%, for example. Such errors are on the same level as the resolution of the multi-channel A/D converter 102. It is unlikely that the curve 213e of the second estimate voltage exactly coincides with the intermediate portion 201b of the curve 201 of the first correction voltage.

However, in practice, the error between the curve 213e and the intermediate portion 201b is reduced by using, instead of the theoretical gain G, a reference gain R that is a measured average based on a large number of product samples.

Reference numeral 214e denotes a curve representing a relationship between the first input voltage V10 and the second average voltage, which is the weighted average voltage of the second estimate voltage (213e) and the first correction voltage (201, 201b) in the intermediate range. The weighted average as the second average voltage is calculated in such a manner that the weight coefficient (1 to 0) of the weighted averaging operation by which to multiply the second estimate voltage (213e) is decreased and the weight coefficient (0 to 1) by which to multiply the first correction voltage (201) is increased as the absolute value of the difference between the second estimate voltage (213e) and the first correction voltage (201) increases.

Therefore, weight is attached to the second estimate voltage (213e) in the vicinity of the reference point where both of the first input voltage V10 and the second input voltage V20 are equal to the bias voltage Vd, and greater weight is attached to the first correction voltage (201) as the position concerned goes away from the reference point. In this manner, a stepwise variation is prevented when the position concerned moves from the intermediate region to an outside region.

The intermediate range of the first input voltage V10 is a range lower than or equal to the intermediate voltage Vs where the second present voltage (210) is approximately equal to the maximum output voltage Vb, the second present voltage 210 becomes 0 V and higher than or equal to a voltage where the second estimate voltage (213e) is equal to a lower limit output voltage Vc.

The operation of the vehicular electronic control unit 100e according to the fifth embodiment that is configured as shown in FIG. 13 will be described below with reference to a flowchart of FIG. 15.

Figure 15:
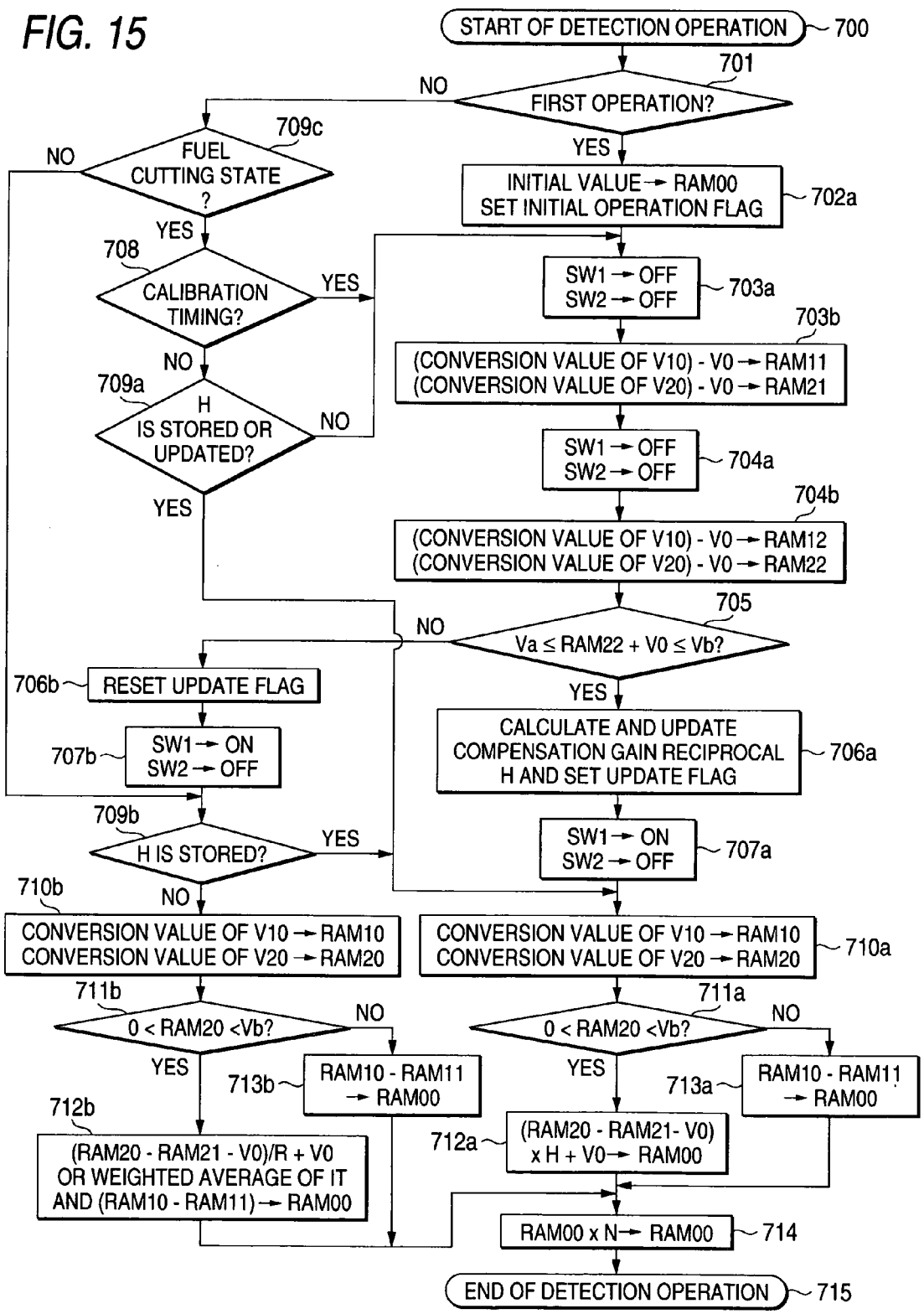
FIG. 15 is a flowchart showing the operation of the vehicular electronic control unit according to the fifth embodiment.

In FIG. 15, at a start step 700, a calibration operation of the microprocessor 103e is started. The start step 700 is activated repeatedly, that is, every time an operation end step 715 (described later) is executed.

At step 701 which is executed after step 700, it is judged whether the current operation is the first one by monitoring whether an initial operation flag (not shown) was set at the next step 702a. At step 702a which is executed if the judgment result of step 701 is "yes," (i.e., the current operation is the first one), an initial value is written to the RAM memory 105 at a prescribed address RAM00 and the initial operation flag is set. The set state of the initial operation flag is maintained until power-off of the electronic control unit 100e.

The address RAM00 is an address where a digital conversion value that is proportional to an addition voltage of a voltage generated by the variable analog signal source 101e and the bias voltage is written. When the microprocessor 103e needs a digital conversion value that is proportional to an addition voltage, the microprocessor 103e reads out and uses the data stored at the address RAM00 when necessary.

At step 703a which is executed after step 702a, the supply of the first and second instruction signals SW1 and SW2 is stopped to open the power shutoff analog switch 111e and the current decrease detection analog switch 112e. At step 703b which is executed after step 703a, a value obtained by subtracting the reference bias voltage V0 from a digital conversion value corresponding to a first input voltage V10 is written, as a first error voltage RAM11, to the RAM memory 105 at a first address and a value obtained by subtracting the reference bias voltage V0 from a digital conversion value corresponding to a second input voltage V20 is written, as a second error voltage RAM21, to the RAM memory 105 at a second address. At step 704a which is executed after step 703b, the first and second instruction signals SW1 and SW2 are generated to close the power shutoff analog switch 111e and the current decrease detection analog switch 112e. At step 704b which is executed after step 704a, a value obtained by subtracting the reference bias voltage V0 from a digital conversion value corresponding to a first input voltage V10 is written, as a first intermediate voltage RAM12, to the RAM memory 105 at a third address and a value obtained by subtracting the reference bias voltage V0 from a digital conversion value corresponding to a second input voltage V20 is written, as a second intermediate voltage RAM22, to the RAM memory 105 at a fourth address.

The reference bias voltage V0 is an intrinsic digital conversion value that should be obtained when the normal bias voltage Vd is applied. The first and second error voltages RAM11 and RAM21 occur if the actual bias voltage Vd has an error.

At step 705 which is executed after step 704b, it is judged whether a value obtained by adding the reference bias voltage V0 to the second intermediate voltage RAM22 that was stored at step 704b is within a designated range, that is, lower than or equal to the maximum output voltage Vb of the multi-channel A/D converter 102 and higher than or equal to a designated output voltage Va that is a little lower than the maximum output voltage Vb. At step 706a which is executed if the judgment result of step 705 is "yes" (i.e., within the designated range), a compensation gain reciprocal H is calculated according to Equation (5) and stored and an update flag (not shown) for indicating that the compensation gain reciprocal H has been calculated is set. At step 707a which is executed after step 706a, the first instruction signal SW1 is generated to close the power shutoff analog switch 111e and the supply of the second instruction signal SW2 is stopped to open the current decrease detection analog switch 112e.

At step 709c which is executed if the judgment result of step 701 is "no" (i.e., the current operation is not the first one), it is judged whether a fuel cutting state (i.e., a state that fuel injection is stopped) is established. At step 708 which is executed if the judgment result of step 709c is "yes" (i.e., fuel cutting state), it is judged whether to perform a calibration again. A judgment result "yes" is produced at step 708 and a transition is made to step 703a repeatedly at a cycle corresponding to a time that is taken for the environment temperature of the control circuit unit to vary.

At step 709a which is executed if the judgment result of step 708 is "no" (i.e., not calibration timing), it is judged whether a compensation gain reciprocal H was calculated and stored at step 706a. If the judgment result of step 709a is "no" (i.e., a compensation gain reciprocal H was not stored), a transition is made to step 703a though the judgment result of step 708 is "no" (i.e., not calibration timing).

At step 710a which is executed if the judgment result of step 709a is "yes" (i.e., a compensation gain reciprocal H was calculated and stored) or when step 707a has just been executed, a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105.

At step 711a which is executed after step 710a, it is judged whether the second present voltage RAM20 is higher than 0 V and lower than the maximum output voltage Vb. At step 712a which is executed if the judgment result of step 711a is "yes" (i.e., the first input voltage V10 is in the intermediate range), a second compensation voltage (212e) is calculated by calculating a second correction voltage (211) by subtracting the second error voltage RAM21 from the second present voltage RAM20, multiplying, by the compensation gain reciprocal H calculated and stored at step 706a, a second increment obtained by subtracting the reference bias voltage V0 from the second correction voltage (211), and then adding the reference bias voltage V0 to the product, and the thus-calculated second compensation voltage (212e) is stored in the RAM memory 105 at the prescribed address RAM00. At step 713a which is executed if the judgment result of step 711a is "no" (i.e., the first input voltage V10 is in an outside range), a first correction voltage (201) obtained by subtracting the first error voltage RAM11 from the first present voltage RAM10 is stored as it is in the RAM memory 105 at the prescribed address RAM00. At step 714 which is executed after step 712a or 713a, the value stored at the address RAM00 is multiplied by a fixed factor N and the product is caused to overwrite the value stored at the address RAM00. Step 715 is an operation end step which is executed after step 714.

At step 706b which is executed if the judgment result of step 705 is "no" (i.e., the sum of the second intermediate voltage RAM22 that was stored at step 704b and the reference voltage V0 is not within the prescribed designated range), the update flag that was set at step 706a is reset. At step 707b which is executed after step 706b, the first instruction signal SW1 is generated to close the power shutoff analog switch 111e and the supply of the second instruction signal SW2 is stopped to open the current decrease detection analog switch 112e. At step 709b which is executed if the judgment result of step 709c is "no" (i.e., a fuel cutting state is not established) or when step 707b has just been executed, it is judged whether a compensation gain reciprocal H was calculated and stored at step 706a. If the judgment result of step 709b is "yes" (a compensation gain reciprocal H is stored), a transition is made to step 710a.

At step 710b which is executed if the judgment result of step 709b is "no" (i.e., a compensation gain reciprocal H has not been calculated and stored yet), a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105. At step 711b which is executed after step 710b, it is judged whether the second present voltage RAM20 is higher than 0 V and lower than the maximum output voltage Vb. At step 712b which is executed if the judgment result of step 711b is "yes" (i.e., the first input voltage V10 is in the intermediate range), a second estimate voltage (213e) that is obtained by calculating a second correction voltage (211) by subtracting the second error voltage RAM21 from the second present voltage RAM20, dividing, by the reference gain R, a second increment obtained by subtracting the reference bias voltage V0 from the second correction voltage (211), and then adding the reference bias voltage V0 to the quotient, is stored in the RAM memory 105 at the prescribed address RAM00. At step 713b which is executed if the judgment result of step 711b is "no" (i.e., the first input voltage V10 is in an outside range), a first correction voltage (201) obtained by subtracting the first error voltage RAM11 from the first present voltage RAM10 is stored as it is in the RAM memory 105 at the prescribed address RAM00. A transition is made to step 714 from step 712b or 713b.

The reference gain R that is used at step 712b is data that was stored in advance in the nonvolatile program memory 104e as a reference gain R and that is a measured average ratio obtained by calculating, for a large number of product samples, the ratio V2/V1 of the measured value V2 of the second increment voltage obtained by subtracting the reference bias voltage Vo from the second correction voltage (211) to the measured value V1 of the first increment voltage obtained by subtracting the reference bias voltage V0 from the first correction voltage (201) in a state that the first input voltage V10 was equal to the intermediate voltage Vs.

Alternatively, step 712b may be such that variable weighted averaging (described above) is performed and a resulting value is stored at the prescribed address RAM00.

If the reciprocal of the reference gain R is stored, the division at step 712b can be replaced by multiplication. This is advantageous because the microprocessor 103e can perform multiplication faster than division.

Another modification is as follows. At step 706a an enlargement factor X (=(fixed factor N)×(compensation gain reciprocal H)) is stored, at step 712a the second increment is multiplied by the enlargement factor X rather than divided by the compensation gain reciprocal H, and at step 713a the first correction voltage (201) is multiplied by the fixed factor N. This is advantageous in that the number of operations performed at step 712a can be reduced.

The same applies to operations performed at step 712b and 713b. Examples of the reference gain R, the compensation gain reciprocal H, and the fixed factor N are 3.05, 0.328, and 32, respectively, in which case the enlargement factor X becomes 10.49. Even if the decimal point is eliminated from a calculation result of step 714, no large error is produced because the decimal point is eliminated from a value that has been multiplied by 32 in advance.

As described above, in the fifth embodiment, the range of the input voltage to be subjected to A/D conversion is divided into the intermediate range and the outside ranges and the entire characteristic is synthesized by using the compensation gain reciprocal H that is calculated by an intermediate voltage supplying means. This has been described above with reference to FIG. 13 (reference numerals are in the 100s), FIGS. 14A and 14B (reference numerals are in the 200s), and FIG. 15 (reference numerals are in the 700s).

The vehicular electronic control unit 100e according to the fifth embodiment of the invention is configured as follows. A voltage generated by the variable analog signal source 101e is input to the multi-channel A/D converter 102 via the analog signal input circuit and a resulting digital value is written to the RAM memory 105 via the microprocessor 103e. The exhaust gas sensor 106 having the oxygen pump device 106a and the oxygen concentration cell device 106b is an exemplary variable analog signal source. A variable analog signal circuit is formed by the pump current supply circuit 114 for supplying a positive or negative pump current to the oxygen pump device 106a, the current detection resistor R31 that is connected to the pump current supply circuit 114, and the bias voltage source 116 for adding a bias voltage to a positive or negative signal voltage obtained by differentially amplifying a voltage across the current detection resistor R31. The variable analog signal circuit is equipped with a full-range input circuit and an enlarged range input circuit (described later). The microprocessor 103e is one capable of handling digital data that is more accurate, that is, longer in bit length, as compared to the resolution of the multi-channel A/D converter 102. The nonvolatile program memory 104e which cooperates with the microprocessor 103e stores programs to serve as an error signal storing means 703b, a gain compensating means 712a, and a selecting and switching means 711a (described later).

The full-range input circuit is an input circuit that is provided between the variable analog signal circuit and the first input terminal CH1 of the multi-channel A/D converter 102 and that produces a first input voltage V10. The input circuit includes the first amplifier 110e and is configured so that the first input voltage V10 becomes approximately equal to a full-scale input voltage Vf of the multi-channel A/D converter 102 when the output voltage of the variable analog signal circuit is at the maximum.

The enlarged range input circuit is an input circuit that is provided between the variable analog signal circuit and the second input terminal CH2 of the multi-channel A/D converter 102 and that produces a second input voltage V20. The input circuit includes the second amplifier 120e and is configured so that the second input voltage V20 becomes approximately equal to the full-scale input voltage Vf of the multi-channel A/D converter 102 when the first input voltage V10 is equal to a prescribed intermediate voltage Vs that is lower than the maximum voltage.

Activated when the voltage across the current detection resistor R31 is zero and both of the first and second input voltages V10 and V20 are equal to a prescribed bias voltage Vd, the error signal storing means 703b determines error voltages as measured from a reference bias voltage V0 that is an intrinsic digital conversion value that corresponds to a normal bias voltage that complies with the specification. The error signal storing means 703b writes, as a first error voltage RAM11, a value obtained by subtracting the reference bias voltage V0 from a digital conversion value of a first input voltage V10 to the RAM memory 105 at a first address, and writes, as a second error voltage RAM21, a value obtained by subtracting the reference bias voltage V0 from a digital conversion value of a second input voltage V20 to the RAM memory 105 at a second address.

The gain compensating means 712a produces a second compensation voltage (212e) by calculating a second correction voltage (211) by subtracting the second error voltage RAM21 from a second present voltage (210) that is a digital conversion value of a second input voltage V20, dividing, by a compensation gain, a second increment voltage obtained by subtracting the reference bias voltage V0 from the second correction voltage (211) or multiplying it by the reciprocal of the compensation gain, and adding the reference bias voltage V0 to the quotient or product. The compensation gain is set so that the second compensation voltage (212e) becomes approximately equal to a first correction voltage (201) (i.e., a value (201b) in the intermediate range) obtained by subtracting the first error voltage RAM11 from a first present voltage (200) that is a digital conversion value of a first input voltage V10.

The selecting and switching means 711a selectively uses the second compensation voltage (212e) if the first input voltage V10 is in the intermediate range 201b (lower than the intermediate voltage Vs), and selectively uses the first correction voltage (201) if the first input voltage V10 is in an outside range, that is, a range other than the intermediate range. And the selecting and switching means 711a issues an instruction to store a digital value corresponding to the selection result to the RAM memory 105 at a prescribed address RAM00.

In the vehicular electronic control unit 100e according to the fifth embodiment of the invention, the variable analog signal circuit is equipped with the power shutoff analog switch 111e. The nonvolatile program memory 104e stores programs to serve as an error signal input means 703a and a fuel cutting state detecting means 709c. The power shutoff analog switch 111e is an opening/closing element that forcibly makes the input signal voltage of the full-range input circuit and the enlarged range input circuit equal to a voltage corresponding to the bias voltage Vd by preventing a current flow through the current detection resistor R31. The error signal input means 703a on/off-controls the power shutoff analog switch 111e in accordance with a first instruction signal SW1 supplied from the microprocessor 103e, and causes the error signal storing means 703b to operate. The fuel cutting detecting means 709c judges that a fuel cutting state is established if fuel supply is not being done though control power is supplied immediately before a drive, during a descending/coasting drive, or during a decelerating/coasting drive. The error signal input means 703a causes the error signal storing means 703b to operate if the judgment result of the fuel cutting detecting means 709c is "yes."

Therefore, as long as a fuel cutting state is established, the microprocessor 103e can compensate for an error in the bias voltage Vd when necessary even if the actual voltage across the current detection resistor R31 is not zero. The error adjustment does not influence the air-fuel ratio control because the output of the exhaust gas sensor 106 is not used in this state.

In the vehicular electronic control unit 100e according to the fifth embodiment of the invention, the nonvolatile program memory 104e stores programs to serve as an intermediate signal storing means 704b and a gain calculating means 706a.

Activated when the first input voltage V10 is forcibly set approximately equal to the intermediate voltage Vs, the intermediate signal storing means 704b writes, as a first intermediate voltage RAM12, a value obtained by subtracting the reference bias voltage V0 from a digital conversion value of a first input voltage V10 to the RAM memory 105 at a third address and writes, as a second intermediate voltage RAM22, a value obtained by subtracting the reference bias voltage V0 from a digital conversion value of a second input voltage V20 to the RAM memory 105 at a fourth address.

The gain calculating means 706a calculates a ratio between a first difference voltage that is the difference between the first intermediate voltage RAM12 and the first error voltage RAM11 and a second difference voltage that is the difference between the second intermediate voltage RAM22 and the second error voltage RAM21, that is, a compensation gain K (=(second difference voltage)/(first difference voltage)) or a compensation gain reciprocal H (=(first difference voltage)/(second difference voltage)), and stores it. The compensation gain that is used by the above-described gain compensating means 712a is the compensation gain K or the compensation gain reciprocal H that was calculated by the gain calculating means 706a.

Since the compensation gain K or the compensation gain reciprocal H is calculated by a learning function using the product itself, no step occurs between digital conversion values in the intermediate range and those in the outside ranges (i.e., continuity is secured) even if circuit resistance values have large variations, which is in contrast to the case of using a reference gain R that is determined on the basis of product sample data or the reciprocal of the reference gain R.

In the vehicular electronic control unit 100e according to the fifth embodiment of the invention, the variable analog signal circuit is equipped with the current decrease detection analog switch 112e and the nonvolatile program memory 104e stores programs to serve as a fuel cutting detecting means 709c and a current decrease detection instructing means 704a.

The current decrease detection analog switch 112e is an opening/closing element that is connected in series to the parallel resistor R39 that is provided parallel with the current detection resistor R31 and that forcibly makes the input signal voltage of the full-range input circuit and the enlarged range input circuit equal to a voltage corresponding to the intermediate voltage Vs by decreasing the combined current detection resistance when a maximum current is flowing. The fuel cutting detecting means 709c judges that a fuel cutting state is established if fuel supply is not being done though control power is supplied immediately before a drive, during a descending/coasting drive, or during a decelerating/coasting drive.

When the fuel cutting detecting means 709c has detected a fuel cutting state, the current decrease detection instructing means 704a causes the intermediate signal storing means 704b to operate by closing the current decrease detection analog switch 112e on the basis of the second instruction signal SW2 that is generated by the microprocessor 103e.

Therefore, as long as a fuel cutting state is established, the microprocessor 103e can perform a compensation gain learning operation when necessary even if the voltage across the current detection resistor R31 is not equal to the voltage corresponding to the intermediate signal voltage Vs.

In particular, the compensation gain learning operation does not influence the air-fuel ratio control because the former is performed in a fuel cutting state and the output of the exhaust gas sensor 106 is not used in this state. Further, since the intermediate voltage Vs is obtained when the oxygen pump current is at the maximum, it is not necessary to prepare a reference voltage source for the intermediate voltage Vs.

In the vehicular electronic control unit 100e according to the fifth embodiment of the invention, the nonvolatile program memory 104e stores a program to serve as an intermediate signal checking means 705. The intermediate signal checking means 705 judges whether the sum of the second intermediate voltage RAM22 that was stored by the intermediate signal storing means 704b and the reference bias voltage V0 is within a designated range, that is, whether it is lower than or equal to a maximum output voltage Vb of the multi-channel A/D converter 102 and higher than or equal to a designated output voltage Va that is a little lower than the maximum output voltage Vb. If the sum is within the designated range, the intermediate signal checking means 705 validates the first and second intermediate voltages RAM12 and RAM22 that were stored by the intermediate signal storing means 704b and causes the gain calculating means 706a to perform a gain calculation.

This provides an advantage that even in a fuel cutting state an erroneous gain calculation is prevented from being performed by invalidating a measured second intermediate voltage if the temperature of the exhaust gas sensor 106 is low and hence a sufficient oxygen pump current Ip cannot be obtained.

In the vehicular electronic control unit 100e according to the fifth embodiment of the invention, the nonvolatile program memory 104e stores reference gain data and programs to serve as a compensation storage judging means 709b, a tentative gain compensating means 712b, a tentative selecting and switching means 711b.

The reference gain data is data that was stored in advance as a reference gain R=V2/V1 or its reciprocal (reference gain reciprocal) and that is a statistical value such as an average or a center value of a plurality of samples obtained by calculating, for a large number of samples, the ratio of the measured value V2 of the second increment voltage obtained by subtracting the reference bias voltage V0 from the second correction voltage (211) to the measured value V1 of the first increment voltage obtained by subtracting the reference bias voltage V0 from the first correction voltage 201 in a state that the first input voltage V10 was approximately equal to the intermediate voltage Vs.

The compensation storage judging means 709b judges whether the gain calculating means 706a calculated and stored a compensation gain K or a compensation gain reciprocal H.

The tentative gain compensating means 712b operates instead of the gain compensating means 712a if the judgment result of the compensation storage judging means 709b is "not stored." The tentative gain compensating means 712b calculates a second estimate voltage (213e) by calculating a second correction voltage (211) by subtracting the second error voltage RAM21 from a second present voltage (210) that is a digital conversion value of a second input voltage V20, dividing, by the reference gain R, a second increment voltage obtained by subtracting the reference bias voltage V0 from the second correction voltage (211) or multiplying the second increment voltage by the reciprocal of the reference gain R, and adding the reference bias voltage V0 to the quotient or product.

The tentative selecting and switching means 711b operates instead of the selecting and switching means 711a if the judgment result of the compensation storage judging means 709b is "not stored." The tentative selecting and switching means 711b selectively uses the second estimate voltage (213e) if the first input voltage V10 is in the intermediate range (lower than the intermediate voltage Vs), and selectively uses a first correction voltage (201) if the first input voltage V10 is in a range other than the intermediate range, that is, in an outside range. And the tentative selecting and switching means 711b issues an instruction to store a digital value proportional to the selection result to the RAM memory 105 at the prescribed address RAM00.

Therefore, when the electronic control unit 100e is in a state that a compensation gain K has not been calculated by the gain calculating means 706a because the environment temperature of the exhaust gas sensor 106 has not reached a prescribed value and hence a proper second intermediate voltage cannot be obtained even if the current decrease detection analog switch 112e is closed, the reference gain R that is based on sample data is used. This prevents occurrence of a large step between digital conversion values in the intermediate range of the input voltage and those in the ranges other than the intermediate range (i.e., outside ranges): continuity is substantially secured.

In the vehicular electronic control unit 100e according to the fifth embodiment of the invention, the nonvolatile program memory 104e stores a program to serve as a variable weighted averaging means 712b. The variable weighted averaging means 712b calculates a weighted average voltage in the range where the curve 213e of the second estimate voltage and the curve 201 of the first correction voltage overlap with each other. The variable weighted averaging means 712b calculates a weighted average in such a manner as to decrease the weight coefficient (1 to 0) of the weighted averaging operation by which to multiply the second estimate voltage (213e) and to increase the weight coefficient (0 to 1) by which to multiply the first correction voltage (201) as the absolute value of the difference between the second estimate voltage (213e) and the first correction voltage (201) increases, and employs the weighted average as a second average voltage (214e). The tentative selecting and switching means 711b selectively uses the second average voltage (214e) instead of the second estimate voltage 213e.

Therefore, even if the continuity between the digital conversion value of the second estimate voltage (213e) and that of the first correction voltage (201) is insufficient before a compensation voltage is calculated and stored, a steep variation of the digital conversion value can be prevented, that is, a gentle transition is attained.

In the vehicular electronic control unit 100e according to the fifth embodiment of the invention, the error signal storing means 703b, the intermediate signal storing means 704b, the intermediate signal checking means 705, and the gain calculating means 706a operate immediately after a start of operation of the electronic control unit 100e. And the nonvolatile program memory 104e stores programs to serve as a regular calibration timing judging means 708 and an irregular calibration timing judging means 709a.

The regular calibration timing judging means 708 causes the error signal storing means 703b, the intermediate signal storing means 704b, the intermediate signal checking means 705, and the gain calculating means 706a to operate repeatedly at a cycle corresponding to a time that is taken for the environment temperature to vary by an amount that would cause a state that a re-calibration is desirable.

Activated if the judgment result of the intermediate signal checking means 705 is "out of the designated range" immediately after a start of operation of the electronic control unit 100e or during a regular calibration, the irregular calibration timing judging means 709a issues an instruction to activate the intermediate signal storing means 704b and the intermediate signal checking means 705 repeatedly in subsequent operation cycles. The irregular calibration timing judging means 709a activates the gain calculating means 706a if the checking result of the intermediate signal checking means 705 is "within the designated range."

An instant when the input signal voltage becomes a voltage corresponding to the intermediate voltage Vs is found quickly and a gain is calculated immediately if the checking result of the intermediate signal checking means 705 is "within the designated range." And the compensation gain that is used by the gain compensating means 712 is changed from the reference gain R to the compensation gain K that has been obtained by the gain calculation; As a result, accurate A/D conversion can be performed over the entire input voltage range.

In the vehicular electronic control unit 100e according to the fifth embodiment of the invention, the nonvolatile program memory 104e stores a program to serve as a conversion-into-integer means 714, which multiplies a digital conversion value of an analog signal voltage by a prescribed fixed factor N and stores the product in the RAM memory 105. The fixed factor N is set so that even a maximum numerical value to be stored in the RAM memory 105 is smaller than or equal to a limit value that is determined by a data bit length that can be handled by the microprocessor 103e. A decimal part of a value that is obtained by multiplying gain-compensated data such as the second compensation voltage (212e), the second estimate voltage (213e), or the second average voltage (214e) by the fixed factor N is discarded.

Since a finally obtained digital conversion value does not have a decimal part, the operation processing speed of the microprocessor 103e can be increased in a subsequent stage of its use.

Embodiment 6

The entire configuration of a vehicular electronic control unit according to a sixth embodiment of the invention will be described below with reference to a circuit block diagram of FIG. 16.

Figure 16:
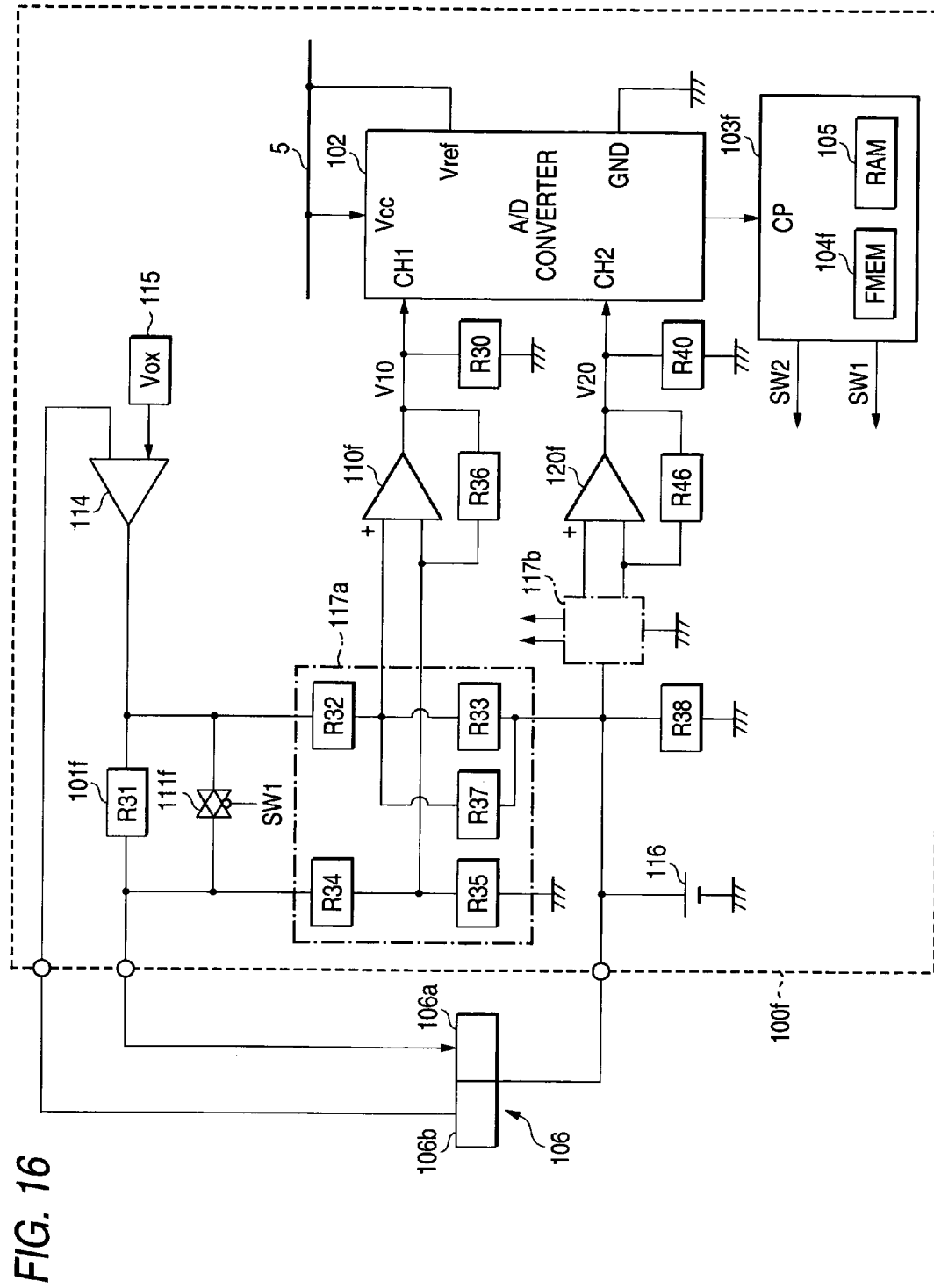
FIG. 16 is a circuit block diagram showing the entire configuration of a vehicular electronic control unit according to a sixth embodiment of the invention.

In FIG. 16, reference symbol 100f denotes a vehicular electronic control unit such as an engine control unit that is mounted on an automobile. An exhaust gas sensor 106 that is one of many analog sensors is connected to the electronic control unit 100f.

Reference numeral 102 denotes a multi-channel A/D converter having a resolution of 10 bits that is provided inside the electronic control unit 100f. A regulated DC voltage 5 V is applied to a voltage source terminal Vcc and a reference voltage terminal Vref of the multi-channel A/D converter 102. A first input voltage V10 of 0 to 5 V and a second input voltage V20 of 0 to 5 V are applied to a first input terminal CH1 and a second input terminal CH2 of the multi-channel A/D converter 102, respectively.

Many other analog signal sources (not shown) are connected to the multi-channel A/D converter 102. Analog voltage values that are input to the respective input channels are sequentially converted into digital values, which are stored in a buffer memory that is provided in the multi-channel A/D converter 102.

Reference symbol 103f denotes a microprocessor capable of processing 32-bit data, for example, simultaneously, and symbol 104f denotes a nonvolatile program memory that is bus-connected to the microprocessor 103f. The program memory 104f stores not only various control programs and control constants for operation as a vehicular electronic control unit but also various programs and control data for various control means of this embodiment.

Reference numeral 105 denotes a RAM memory for computation that is bus-connected to the microprocessor 103f. The RAM memory 105 also serves as a data memory; digital data that are stored in the buffer memory of the multi-channel A/D converter 102 can be read out by the microprocessor 103f and written to the RAM memory 105 when necessary.

Like the one shown in FIG. 10, the exhaust gas sensor 106 has an oxygen pump device 106a and an oxygen concentration cell device 106b and is supplied with power from a pump current supply circuit 114.

Reference numeral 116 denotes a bias voltage source for supplying a negative current to the pump device 106a. Reference symbol 111f denotes a power shutoff analog switch that is connected in parallel to a current detection resistor R31 provided between the pump current supply circuit 114 and the oxygen pump device 106a and that prevents supply of power to the current detection resistor R31 by short-circuiting both ends of the current detection resistor. Reference symbol 101f denotes a variable analog signal source that employs the voltage across the current detection resistor R31 as an analog signal source. A positive pump current Ip is supplied from the pump current supply circuit 114 to the oxygen pump device 106a so as to go through, in order, the current detection resistor R31, the oxygen pump device 106a, and the bias voltage source 116. A negative pump current Ip is supplied from the bias voltage source 116 to the oxygen pump device 106a so as to go through, in order, the oxygen pump device 106a, the current detection resistor R31, and the pump current supply circuit 114.

Reference symbols R32 and R33 denote a series connection of voltage division resistors that is connected to the connecting point of the pump current supply circuit 114 and the current detection resistor R31. A parallel resistor R37 is connected in parallel to the voltage division resistor R33.

Reference symbols R34 and R35 denote a series connection of voltage division resistors to which the voltage at the connecting point of the current detection resistor R31 and the oxygen pump device 106a is applied.

Reference symbol 110f denotes a first amplifier that is connected to a pull-down resistor R30 and that supplies the first input voltage V10 to the first input terminal CH1 of the multi-channel A/D converter 102. The positive-side input terminal of the first amplifier 110f is connected to the connecting point of the voltage division resistors R32 and R33. The negative-side input terminal of the first amplifier 101f is connected to the connecting point of the voltage division resistors R34 and R35, and is also connected to the output terminal of the first amplifier 110f via a feedback resistor R36.

Reference symbol 117a denotes a first voltage divider circuit that consists of the voltage division resistors R32, R33, R34, and R35 and the parallel resistor R37. Reference symbol R38 denotes a low-resistance resistor that is connected in parallel to the bias voltage source 116. The negative side of the voltage division resistor R33 and the parallel resistor R37 is connected to the bias voltage source 116.

The design resistance values of the resistors are set symmetrically, that is, R32=R34, R33=R35, and R36=R37. The first input voltage V10 produced by the first amplifier 101f does not have a negative value because of the addition of the voltage across the current detection resistor R31 as the variable analog signal source 101f and the voltage of the bias voltage source 116.

Reference symbol 120f denotes a second amplifier that is connected to a pull-down resistor R40 and that supplies the second input voltage V20 to the second input terminal CH2 of the A/D converter 102. Reference symbol 117b denotes a second voltage divider circuit that is equivalent to the first voltage divider circuit 117a and that is connected to both terminals of the current detection resistor R31. The negative-side input terminal of the second amplifier 120f is connected to the output terminal of the second amplifier 120f via a feedback resistor R46.

As a result, the ratio of the second input voltage V20 to the first voltage V10, i.e., a prescribed theoretical gain G, is calculated on the basis of the circuit constants of the first voltage divider circuit 117a and the second voltage divider circuit 117b.

Figure 17A:
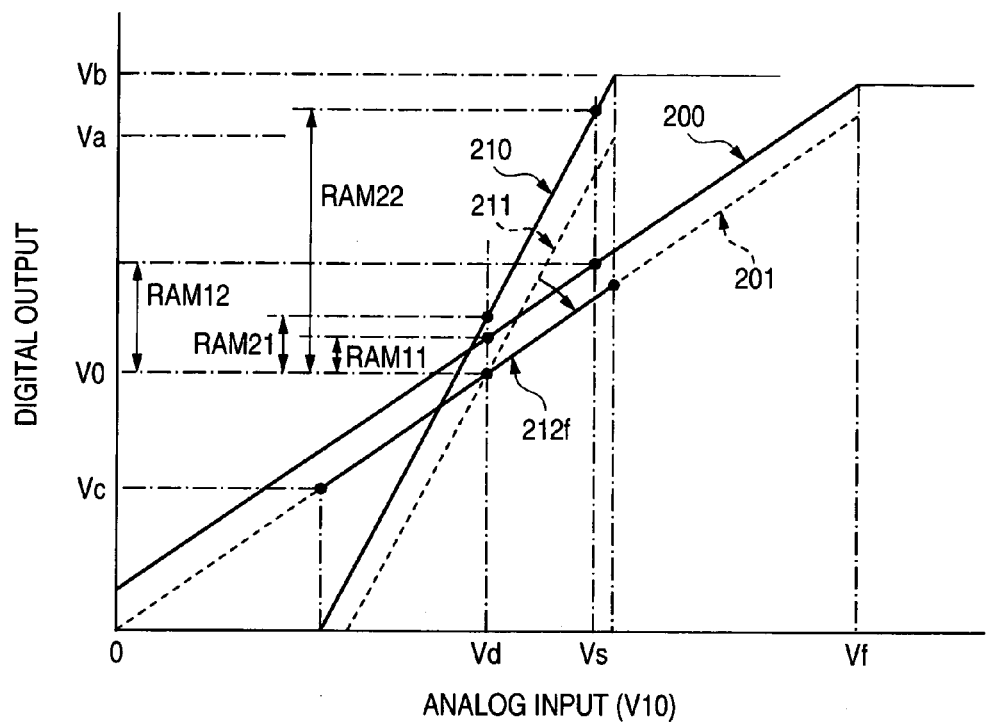
FIGS. 17A and 17B are graphs showing an input/output characteristic of a multi-channel A/D converter shown in FIG. 16.

FIG. 17A is a graph showing an input/output characteristic of the multi-channel A/D converter 102 shown in FIG. 16. The horizontal axis represents the analog input voltage (first input voltage V10) and the vertical axis represents the digital conversion value corresponding to the first input voltage V10 or the second input voltage V20.

A full-scale voltage Vf which is the maximum value of the analog input voltage is the voltage that is applied to the reference voltage terminal Vref of the multi-channel A/D converter 102 and is DC 5V in this embodiment. A maximum output voltage Vb which is the maximum value of the digital conversion value is equal to a digital dedicated value 1,023 in this embodiment.

Reference numeral 200 denotes a curve representing a relationship between the first input voltage V10 and the corresponding digital conversion value, that is, the first present voltage. The first present voltage is equal to a first error voltage RAM11 plus a reference bias voltage V0 that is a digital conversion value of a bias voltage Vd when the first input voltage V10 is equal to the bias voltage Vd. The bias voltage Vd is a first input voltage V10 that is obtained when the voltage across the current detection resistor R31 is zero, that is, a voltage originating from the bias voltage source 116.

Reference numeral 201 denotes a curve representing a relationship between the first input voltage V10 and the first correction voltage that is obtained by digitally subtracting the first error voltage RAM11 from the first present voltage (200). Reference symbol 201b in FIG. 17B denotes an intermediate portion of the curve 201.

Reference symbol 210 denotes a curve representing a relationship between the first input voltage V10 and the digital conversion value (i.e., second present voltage) corresponding to the second input voltage V20. Since the second input voltage V20 is the voltage obtained by amplifying the first input voltage V10 at the theoretical gain G, the digital conversion value reaches a maximum output voltage Vb=1,023 when the first input voltage V10 becomes equal to an intermediate voltage of about 3 V, for example. The second present voltage (210) is equal to a second error voltage RAM21 plus the reference bias voltage V0 when the first input voltage V10 is equal to the bias voltage Vd.

Reference numeral 211 denotes a curve representing a relationship between the first input voltage V10 and the second correction voltage that is obtained by digitally subtracting the second error voltage RAM21 from the second present voltage (210). Reference symbol 212f denotes a curve representing a relationship between the first input voltage V10 and the second compensation voltage that is obtained by multiplying, by a compensation gain reciprocal H, the second increment obtained by subtracting the reference bias voltage V0 from the second correction voltage (211) and then adding the reference bias voltage V0 to the product. The compensation gain reciprocal H is calculated according to the above-mentioned Equation (5).

Figure 17B:
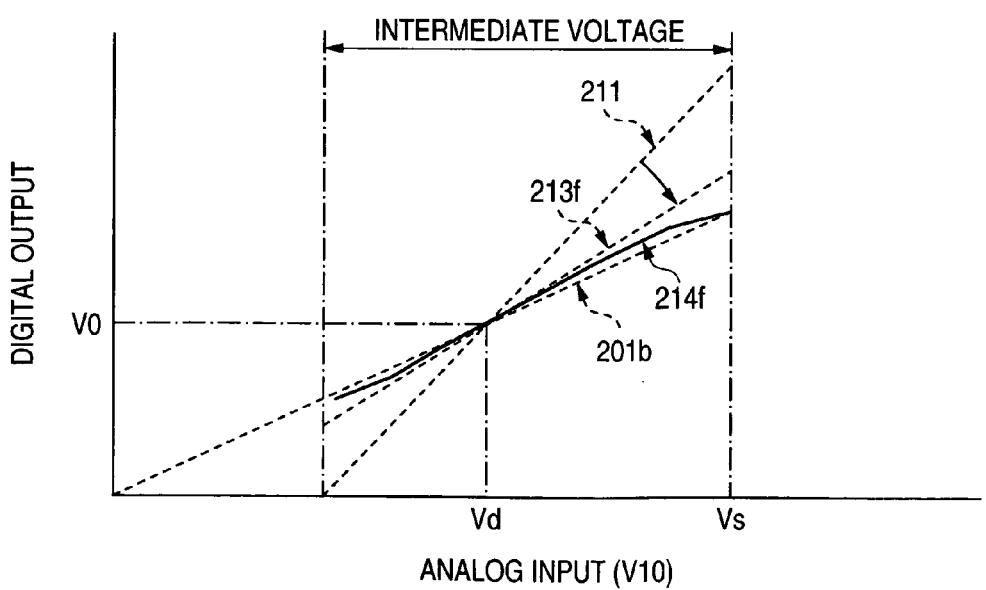

In FIG. 17B showing, in an enlarged manner, the region where the first input voltage V10 is in the intermediate range, reference symbol 201b denotes the intermediate portion of the curve 201 of the first correction voltage. Reference symbol 213f denotes a curve representing a relationship between the first input voltage V10 and the second estimate voltage that is obtained by dividing, by the theoretical gain G, the second increment obtained by subtracting the reference bias voltage V0 from the second correction voltage (211) and then adding the reference bias voltage V0 to the quotient. The second estimate voltage (213f) is used in a state that the above-mentioned compensation gain reciprocal H has not been calculated yet.

If the amplification factors of the first and second amplifiers 110f and 120f are correct and the ratio between the amplification factors for the voltage across the current detection resistor R31 is equal to the theoretical gain G, the curve 213f of the second estimate voltage coincides with the intermediate portion 201b of the curve 201 of the first correction voltage.

However, the following problem exists. The resistance values of the resistors of the first and second voltage divider circuits 117a and 117b and the feedback resistors R36 and R46 shown in FIG. 16 have variations. For example, slight deviations occur even if they are high-accuracy resistors whose errors are within 0.1%, for example. Such errors are on the same level as the resolution of the multi-channel A/D converter 102. It is unlikely that the curve 213f of the second estimate voltage exactly coincides with the intermediate portion 201b of the curve 201 of the first correction voltage.

However, in practice, the error between the curve 213f and the intermediate portion 201b is reduced by using, instead of the theoretical gain G, a reference gain R that is a measured average based on a large number of product samples.

Reference numeral 214f denotes a curve representing a relationship between the first input voltage V10 and the second average voltage, which is the weighted average voltage of the second estimate voltage (213f) and the first correction voltage (201, 201b) in the intermediate range. The weighted average as the second average voltage is calculated in such a manner that the weight coefficient (1 to 0) of the weighted averaging operation by which to multiply the second estimate voltage (213f) is decreased and the weight coefficient (0 to 1) by which to multiply the first correction voltage (201) is increased as the absolute value of the difference between the second estimate voltage (213f) and the first correction voltage (201) increases.

Therefore, weight is attached to the second estimate voltage (213f) in the vicinity of the reference point where both of the first input voltage V10 and the second input voltage V20 are equal to the bias voltage Vd, and greater weight is attached to the first correction voltage (201) as the position concerned goes away from the reference point. In this manner, a stepwise variation is prevented when the position concerned moves from the intermediate region to an outside region.

The intermediate range of the first input voltage V10 is a range lower than or equal to the intermediate voltage Vs where the second present voltage (210) is approximately equal to the maximum output voltage Vb, the second present voltage becomes 0 V and higher than or equal to a voltage where the second estimate voltage (213f) is equal to a lower limit output voltage Vc.

The operation of the vehicular electronic control unit 100*f* according to the sixth embodiment that is configured as shown in FIG. 16 will be described below with reference to a flowchart of FIG. 18.

Figure 18:
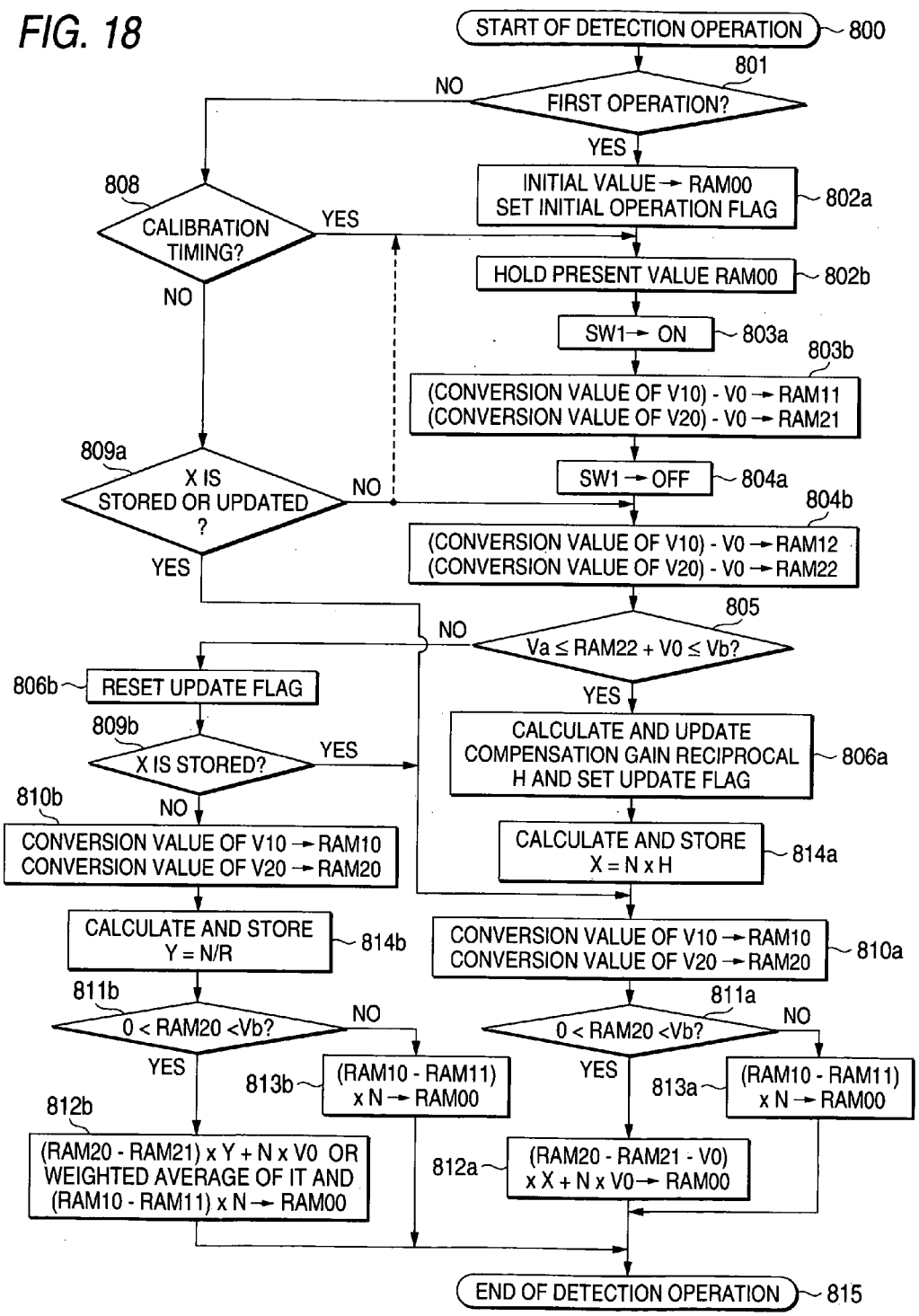
FIG. 18 is a flowchart showing the operation of the vehicular electronic control unit according to the sixth embodiment.

In FIG. 18, at a start step 800, a calibration operation of the microprocessor 103*f* is started. The start step 800 is activated repeatedly, that is, every time an operation end step 815 (described later) is executed.

At step 801 which is executed after step 800, it is judged whether the current operation is the first one by monitoring whether an initial operation flag (not shown) was set at the next step 802*a*. At step 802*a* which is executed if the judgment result of step 801 is "yes," (i.e., the current operation is the first one), an initial value is written to the RAM memory 105 at a prescribed address RAM00 and the initial operation flag is set. The set state of the initial operation flag is maintained until power-off of the electronic control unit 100*f*.

The address RAM00 is an address where a digital conversion value that is proportional to an addition voltage of a voltage generated by the variable analog signal source 101*f* and the bias voltage is written. When the microprocessor 103*f* needs a digital conversion value that is proportional to an addition voltage, the microprocessor 103*f* reads out and uses the data stored at the address RAM00 when necessary.

At step 802*b* which is executed after step 802*a*, writing to the area having the address RAM00 is prohibited to prevent the data at the address RAM00 from being changed. At step 803*a* which is executed after step 802*b*, the first instruction signal SW1 is generated to close the power shutoff analog switch 111*f*. At step 803*b* which is executed after step 803*a*, a value obtained by subtracting the reference bias voltage V0 from a digital conversion value corresponding to a first input voltage V10 is written, as a first error voltage RAM11, to the RAM memory 105 at a first address and a value obtained by subtracting the reference bias voltage V0 from a digital conversion value corresponding to a second input voltage V20 is written, as a second error voltage RAM21, to the RAM memory 105 at a second address. At step 804*a* which is executed after step 803*b*, the supply of the first instruction signal SW1 is stopped to open the power shutoff analog switch 111*f*. At step 804*b* which is executed after step 804*a*, a value obtained by subtracting the reference bias voltage V0 from a digital conversion value corresponding to a first input voltage V10 is written, as a first intermediate voltage RAM12, to the RAM memory 105 at a third address and a value obtained by subtracting the reference bias voltage V0 from a digital conversion value corresponding to a second input voltage V20 is written, as a second intermediate voltage RAM22, to the RAM memory 105 at a fourth address.

The reference bias voltage V0 is an intrinsic digital conversion value that should be obtained when the normal bias voltage Vd is applied. The first and second error voltages RAM11 and RAM21 occur if the actual bias voltage Vd has an error.

At step 805 which is executed after step 804*b*, it is judged whether a value obtained by adding the reference bias voltage V0 to the second intermediate voltage RAM22 that was stored at step 804*b* is within a designated range, that is, lower than or equal to the maximum output voltage Vb of the multi-channel A/D converter 102 and higher than or equal to a designated output voltage Va that is a little lower than the maximum output voltage Vb. At step 806*a* which is executed if the judgment result of step 805 is "yes" (i.e., within the designated range), a compensation gain reciprocal H is calculated according to Equation (5) and stored and an update flag (not shown) for indicating that the compensation gain reciprocal H has been calculated is set. At step 814*a* which is executed after step 806*a*, an enlargement factor X (=(fixed factor N)×(compensation gain reciprocal H)) is calculated and stored.

At step 808 which is executed if the judgment result of step 801 is "no" (i.e., the current operation is not the first one), it is judged whether to perform a calibration again. A judgment result "yes" is produced at step 808 and a transition is made to step 802*b* repeatedly at a cycle corresponding to a time that is taken for the environment temperature of the control circuit unit to vary.

At step 809*a* which is executed if the judgment result of step 808 is "no" (i.e., not calibration timing), it is judged whether an enlargement factor X was calculated and stored at step 814*a*. If the judgment result of step 809*a* is "no" (i.e., an enlargement factor X was not stored), a transition is made to step 804*b* or 802*b* though the judgment result of step 808 is "no" (i.e., not calibration timing).

At step 810*a* which is executed if the judgment result of step 809*a* is "yes" (i.e., an enlargement factor X was calculated and stored) or when step 814*a* has just been executed, a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105.

At step 811*a* which is executed after step 810*a*, it is judged whether the second present voltage RAM20 is higher than 0 V and lower than the maximum output voltage Vb. At step 812*a* which is executed if the judgment result of step 812*a* is "yes" (i.e., the first input voltage V10 is in the intermediate range), a value that is N times a second compensation voltage (212*f*) is calculated by calculating a second correction voltage (211) by subtracting the second error voltage RAM21 from the second present voltage RAM20, multiplying, by the enlargement factor X calculated and stored at step 814*a*, a second increment obtained by subtracting the reference bias voltage V0 from the second correction voltage (211), and then adding the reference bias voltage V0 multiplied by the fixed factor N to the product, and the thus-calculated value is stored in the RAM memory 105 at the prescribed address RAM00. At step 813*a* which is executed if the judgment result of step 811*a* is "no" (i.e., the first input voltage V10 is in an outside range), a first correction voltage (201) obtained by subtracting the first error voltage RAM11 from the first present voltage RAM10 is multiplied by the fixed factor N and the product is stored in the RAM memory 105 at the prescribed address RAM00.

At step 806*b* which is executed if the judgment result of step 805 is "no" (i.e., the sum of the second intermediate voltage RAM22 that was stored at step 804*b* and the reference voltage V0 is not within the prescribed designated range), the update flag that was set at step 806*a* is reset. At step 809*b* which is executed after step 806*b*, it is judged whether an enlargement factor X was calculated and stored at step 814*a*. If the judgment result of step 809*b* is "yes" (an enlargement factor X was calculated and stored), a transition is made to step 810*a*.

At step 810*b* which is executed if the judgment result of step 809*b* is "no" (i.e., an enlargement factor X has not been calculated and stored yet), a digital conversion value corresponding to a first input voltage V10 is written, as a first present voltage RAM10, to a first tentative area of the RAM memory 105 and a digital conversion value corresponding to a second input voltage V20 is written, as a second present voltage RAM20, to a second tentative area of the RAM memory 105. At step 814b which is executed after step 810b, an enlargement factor Y (=(fixed factor N)/(reference gain R)) is calculated and stored. At step 811b which is executed after step 814b, it is judged whether the second present voltage RAM20 is higher than 0 V and lower than the maximum output voltage Vb. At step 812b which is executed if the judgment result of step 811b is "yes" (i.e., the first input voltage V10 is in the intermediate range), a value that is N times a second estimate voltage (213f) is calculated by calculating a second correction voltage (211) by subtracting the second error voltage RAM21 from the second present voltage RAM20, multiplying, by the enlargement factor Y, a second increment obtained by subtracting the reference bias voltage V0 from the second correction voltage (211), and then adding the reference bias voltage V0 multiplied by the fixed factor N to the product, and the thus-calculated value is stored in the RAM memory 105 at the prescribed address RAM00. At step 813b which is executed if the judgment result of step 811b is "no" (i.e., the first input voltage V10 is in an outside range), a first correction voltage (201) obtained by subtracting the first error voltage RAM11 from the first present voltage RAM10 is multiplied by the fixed factor N and the product is stored as it is in the RAM memory 105 at the prescribed address RAM00. Step 815 is an operation end step which is executed after step 812a, 813a, 812b, or 813b.

The reference gain R that is used at step 814b is data that was stored in advance in the nonvolatile program memory 104f as a reference gain R and that is a measured average ratio obtained by calculating, for a large number of product samples, the ratio V2/V1 of the measured value V2 of the second increment voltage obtained by subtracting the reference bias voltage Vo from the second correction voltage (211) to the measured value V1 of the first increment voltage obtained by subtracting the reference bias voltage V0 from the first correction voltage (201) in a state that the first input voltage V10 was equal to the intermediate voltage Vs.

Alternatively, step 812b may be such that variable weighted averaging (described above) is performed and a resulting value is stored at the prescribed address RAM00.

Examples of the reference gain R, the compensation gain reciprocal H, and the fixed factor N are 3.05, 0.34, and 32, respectively, in which case the enlargement factors X and Y become 10.88 and 10.49, respectively. Even if the decimal point is eliminated from a calculation result of step 812a or 812b, no large error is produced because the decimal point is eliminated from a value that has been multiplied by 32 in advance.

As described above, in the sixth embodiment, the range of the input voltage to be subjected to A/D conversion is divided into the intermediate range and the outside ranges and the entire characteristic is synthesized by using the compensation gain reciprocal H that is calculated without using an intermediate voltage supplying means. This has been described above with reference to FIG. 16 (reference numerals are in the 100s), FIGS. 17A and 17B (reference numerals are in the 200s), and FIG. 18 (reference numerals are in the 800s).

The vehicular electronic control unit 100f according to the sixth embodiment of the invention is configured as follows. A voltage generated by the variable analog signal source 101f is input to the multi-channel A/D converter 102 via the analog signal input circuit and a resulting digital value is written to the RAM memory 105 via the microprocessor 103f. The exhaust gas sensor 106 having the oxygen pump device 106a and the oxygen concentration cell device 106b is an exemplary variable analog signal source. A variable analog signal circuit is formed by the pump current supply circuit 114 for supplying a positive or negative pump current to the oxygen pump device 106a, the current detection resistor R31 that is connected to the pump current supply circuit 114, and the bias voltage source 116 for adding a bias voltage to a positive or negative signal voltage obtained by differentially amplifying a voltage across the current detection resistor R31. The variable analog signal circuit is equipped with a full-range input circuit and an enlarged range input circuit (described later). The microprocessor 103f is one capable of handling digital data that is more accurate, that is, longer in bit length, as compared to the resolution of the multi-channel A/D converter 102. The nonvolatile program memory 104f which cooperates with the microprocessor 103f stores programs to serve as an error signal storing means 803b, a gain compensating means 812a, and a selecting and switching means 811a (described later).

The full-range input circuit is an input circuit that is provided between the variable analog signal circuit and the first input terminal CH1 of the multi-channel A/D converter 102 and that produces a first input voltage V10. The input circuit includes the first amplifier 100f and is configured so that the first input voltage V10 becomes approximately equal to a full-scale input voltage Vf of the multi-channel A/D converter 102 when the output voltage of the variable analog signal circuit is at the maximum.

The enlarged range input circuit is an input circuit that is provided between the variable analog signal circuit and the second input terminal CH2 of the multi-channel A/D converter 102 and that produces a second input voltage V20. The input circuit includes the second amplifier 120f and is configured so that the second input voltage V20 becomes approximately equal to the full-scale input voltage Vf of the multi-channel A/D converter 102 when the first input voltage V10 is equal to a prescribed intermediate voltage Vs that is lower than the maximum voltage.

Activated when the voltage across the current detection resistor R31 is zero and both of the first and second input voltages V10 and V20 are equal to a prescribed bias voltage Vd, the error signal storing means 803b determines error voltages as measured from a reference bias voltage V0 that is an intrinsic digital conversion value that corresponds to a normal bias voltage that complies with the specification. The error signal storing means 803b writes, as a first error voltage RAM11, a value obtained by subtracting the reference bias voltage V0 from a digital conversion value of a first input voltage V10 to the RAM memory 105 at a first address, and writes, as a second error voltage RAM21, a value obtained by subtracting the reference bias voltage V0 from a digital conversion value of a second input voltage V20 to the RAM memory 105 at a second address.

The gain compensating means 812a produces a second compensation voltage (212f) by calculating a second correction voltage (211) by subtracting the second error voltage RAM21 from a second present voltage (210) that is a digital conversion value of a second input voltage V20, dividing, by a compensation gain, a second increment voltage obtained by subtracting the reference bias voltage V0 from the second correction voltage (211) or multiplying it by the reciprocal of the compensation gain, and adding the reference bias voltage V0 to the quotient or product. The compensation gain is set so that the second compensation voltage (212f) becomes approximately equal to a first correction voltage (201) (i.e., a value (201b) in the intermediate range)

obtained by subtracting the first error voltage RAM11 from a first present voltage (200) that is a digital conversion value of a first input voltage V10.

The selecting and switching means 811a selectively uses the second compensation voltage (212f) if the first input voltage V10 is in the intermediate range 201b (lower than the intermediate voltage Vs), and selectively uses the first correction voltage (201) if the first input voltage V10 is in an outside range, that is, a range other than the intermediate range. And the selecting and switching means 811a issues an instruction to store a digital value proportional to the selection result to the RAM memory 105 at a prescribed address RAM00.

In the vehicular electronic control unit 100f according to the sixth embodiment of the invention, the variable analog signal circuit is equipped with the power shutoff analog switch 111f. The nonvolatile program memory 104f stores programs to serve as an error signal input means 803a and a present status holding means 802b. The power shutoff analog switch 111f is an opening/closing element that forcibly makes the input signal voltage of the full-range input circuit and the enlarged range input circuit equal to a voltage corresponding to the bias voltage Vd by short-circuiting the current detection resistor R31. The error signal input means 803a on/off-controls the power shutoff analog switch 111f in accordance with a first instruction signal SW1 supplied from the microprocessor 103f, and causes the error signal storing means 803b to operate. The present status holding means 802b prevents data that was selected and stored in the RAM memory 105 by the selecting and switching means 811a from being changed, that is, keeps the data at the value that was in storage immediately before the start of operation of the error signal input means 803a, while the error signal input means 803a is in operation. The error signal input means 803a causes the error signal storing means 803b to operate while the present status holding means 802b is in operation.

Therefore, the microprocessor 103f can compensate for an error in the bias voltage Vd when necessary even if the actual voltage across the current detection resistor R31 is not zero. Occurrence of an erroneous digital conversion value can be prevented because a preceding digital conversion value is held during error adjustment processing.

In particular, if performed in a fuel cutting state, an error adjustment does not influence an air-fuel ratio control because the output of the exhaust gas sensor 106 is not used in that state. Another advantage is that it is possible to continue the supply of a pump current during an error adjustment.

In the vehicular electronic control unit 100f according to the sixth embodiment of the invention, the nonvolatile program memory 104f stores programs to serve as an intermediate signal storing means 804b, a gain calculating means 806a, and an intermediate signal checking means 805.

Activated when the first input voltage V10 is approximately equal to the intermediate voltage Vs, the intermediate signal storing means 804b writes, as a first intermediate voltage RAM12, a value obtained by subtracting the reference bias voltage V0 from a digital conversion value of a first input voltage V10 to the RAM memory 105 at a third address and writes, as a second intermediate voltage RAM22, a value obtained by subtracting the reference bias voltage V0 from a digital conversion value of a second input voltage V20 to the RAM memory 105 at a fourth address.

The gain calculating means 806a calculates a ratio between a first difference voltage that is the difference between the first intermediate voltage RAM12 and the first error voltage RAM11 and a second difference voltage that is the difference between the second intermediate voltage RAM22 and the second error voltage RAM21, that is, a compensation gain K (=(second difference voltage)/(first difference voltage)) or a compensation gain reciprocal H (=(first difference voltage)/(second difference voltage)), and stores it.

The intermediate signal checking means 805 judges whether the sum of the second intermediate voltage RAM22 that was stored by the intermediate signal storing means 804b and the reference bias voltage V0 is within a designated range, that is, whether the sum is lower than or equal to a maximum output voltage Vb of the multi-channel A/D converter 102 and higher than or equal to a designated output voltage Va that is a little lower than the maximum output voltage Vb. If the sum is within the designated range, the intermediate signal checking means 805 validates the first and second intermediate voltages RAM12 and RAM22 that were stored by the intermediate signal storing means 804b and causes the gain calculating means 806a to perform a gain calculation. The compensation gain that is used by the above-described gain compensating means 812a is the compensation gain K or the compensation gain reciprocal H that was calculated by the gain calculating means 806a.

Since the compensation gain K or the compensation gain reciprocal H is calculated by a learning function using the product itself, no step occurs between digital conversion values in the intermediate range (lower than the intermediate voltage Vs) and those in the outside ranges (i.e., continuity is secured) even if circuit resistance values have large variations, which is in contrast to the case of using a reference gain R that is determined on the basis of product sample data or the reciprocal of the reference gain R.

In addition, no special reference voltage source needs to be prepared to obtain a second intermediate voltage, which makes it possible to construct an analog signal input circuit that is compact and inexpensive.

Another advantage is that the measured second intermediate voltage RAM22 being low prevents occurrence of a large error in the gain calculation.

In the vehicular electronic control unit 100f according to the sixth embodiment of the invention, the nonvolatile program memory 104f stores reference gain data and programs to serve as a compensation storage judging means 809b, a tentative gain compensating means 812b, a tentative selecting and switching means 811b.

The reference gain data is data that was stored in advance as a reference gain R=V2/V1 or its reciprocal (reference gain reciprocal) and that is a statistical value such as an average or a center value of a plurality of samples obtained by calculating, for a large number of samples, the ratio of the measured value V2 of the second increment voltage obtained by subtracting the reference bias voltage V0 from the second correction voltage (211) to the measured value V1 of the first increment voltage obtained by subtracting the reference bias voltage V0 from the first correction voltage 201 in a state that the first input voltage V10 was approximately equal to the intermediate voltage Vs.

The compensation storage judging means 809b judges whether the gain calculating means 806a calculated and stored a compensation gain K or a compensation gain reciprocal H.

The tentative gain compensating means 812b operates instead of the gain compensating means 812a if the judgment result of the compensation storage judging means 809b is "not stored." The tentative gain compensating means 812b calculates a second estimate voltage (213f) by calculating a second correction voltage (211) by subtracting the second error voltage RAM21 from a second present voltage (210) that is a digital conversion value of a second input voltage V20, dividing, by the reference gain R, a second increment voltage obtained by subtracting the reference bias voltage V0 from the second correction voltage (211) or multiplying the second increment voltage by the reciprocal of the reference gain R, and adding the reference bias voltage V0 to the quotient or product.

The tentative selecting and switching means 811b operates instead of the selecting and switching means 811a if the judgment result of the compensation storage judging means 809b is "not stored." The tentative selecting and switching means 811b selectively uses the second estimate voltage (213f) if the first input voltage V10 is in the intermediate range 201b (lower than the intermediate voltage Vs), and selectively uses a first correction voltage (201) if the first input voltage V10 is in a range other than the intermediate range, that is, in an outside range. And the tentative selecting and switching means 811b issues an instruction to store a digital value proportional to the selection result to the RAM memory 105 at the prescribed address RAM00.

Therefore, when the electronic control unit 100f is in a state that a compensation gain has not been calculated because the input signal voltage has not happened to have a value that is suitable for calculation of a second intermediate voltage, the reference gain R that is based on sample data is used. This prevents occurrence of a large step between digital conversion values in the intermediate range of the input voltage and those in the ranges other than the intermediate range (i.e., outside ranges): continuity is substantially secured. After a second intermediate voltage in the designated range has been measured and a compensation gain has been calculated and stored, the continuity between digital conversion values in the intermediate range of the input voltage and those in the outside ranges is improved and the accuracy of A/D conversion is further increased as a whole.

In the vehicular electronic control unit 100f according to the sixth embodiment of the invention, the nonvolatile program memory 104f stores a program to serve as a variable weighted averaging means 812b. The variable weighted averaging means 812b calculates a weighted average voltage in the range where the curve 213f of the second estimate voltage and the curve 201 of the first correction voltage overlap with each other. The variable weighted averaging means 812b calculates a weighted average in such a manner as to decrease the weight coefficient (1 to 0) of the weighted averaging operation by which to multiply the second estimate voltage (213f) and to increase the weight coefficient (0 to 1) by which to multiply the first correction voltage (201) as the absolute value of the difference between the second estimate voltage (213f) and the first correction voltage (201) increases, and employs the weighted average as a second average voltage (214f). The tentative selecting and switching means 811b selectively uses the second average voltage (214f) instead of the second estimate voltage 213f.

Therefore, even if the continuity between the digital conversion value of the second estimate voltage (213f) and that of the first correction voltage (201) is insufficient in an actual product, a steep variation of the digital conversion value can be prevented, that is, a gentle transition is attained.

In the vehicular electronic control unit 100f according to the sixth embodiment of the invention, the error signal storing means 803b, the intermediate signal storing means 804b, the intermediate signal checking means 805, and the gain calculating means 806a operate immediately after a start of operation of the electronic control unit 100f. And the nonvolatile program memory 104f stores programs to serve as a regular calibration timing judging means 808 and an irregular calibration timing judging means 809a.

The regular calibration timing judging means 808 causes the error signal storing means 803b, the intermediate signal storing means 804b, the intermediate signal checking means 805, and the gain calculating means 806a to operate repeatedly at a cycle corresponding to a time that is taken for the environment temperature to vary by an amount that would cause a state that a re-calibration is desirable.

Activated if the judgment result of the intermediate signal checking means 805 is "out of the designated range" immediately after a start of operation of the electronic control unit 100f or during a regular calibration, the irregular calibration timing judging means 809a issues an instruction to activate the intermediate signal storing means 804b and the intermediate signal checking means 805 repeatedly in subsequent operation cycles. The irregular calibration timing judging means 809a activates the gain calculating means 806a if the checking result of the intermediate signal checking means 805 is "within the designated range."

An instant when the input signal voltage happens to have a value corresponding to the intermediate voltage Vs is found quickly and a gain is calculated immediately if the checking result of the intermediate signal checking means 805 is "within the designated range." And the compensation gain that is used by the gain compensating means is changed from the reference gain R to the compensation gain K that has been obtained by the gain calculation. As a result, accurate A/D conversion can be performed over the entire input voltage range.

In the vehicular electronic control unit 100f according to the sixth embodiment of the invention, the nonvolatile program memory 104f stores a program to serve as conversion-into-integer means 814a and 814b, each of which multiplies a digital conversion value of an analog signal voltage by a prescribed fixed factor N and stores the product in the RAM memory 105. The fixed factor N is set so that even a maximum numerical value to be stored in the RAM memory 105 is smaller than or equal to a limit value that is determined by a data bit length that can be handled by the microprocessor 103f. A decimal part of a value that is obtained by multiplying gain-compensated data such as the second compensation voltage (212f), the second estimate voltage (213f), or the second average voltage (214f) by the fixed factor N is discarded.

Since a finally obtained digital conversion value does not have a decimal part, the operation processing speed of the microprocessor 103f can be increased in a subsequent stage of its use.

The invention can be applied to vehicular electronic control units of automobiles etc., in particular, to various vehicular electronic control units for many analog signals using a multi-channel A/D converter having an ordinary resolution.

What is claimed is:

1. A vehicular electronic control unit comprising:
an analog signal input circuit for producing voltages corresponding to a voltage generated by a variable analog signal source;
a multi-channel A/D converter for converting the voltages produced by the analog signal input circuit into a conversion digital value;

a data memory;

a microprocessor for writing a digital conversion value produced by the multi-channel A/D converter to the data memory, the microprocessor having a capability of handling digital data having a longer bit length than a bit length corresponding to a resolution of the multi-channel A/D converter; and a nonvolatile program memory that cooperates with the microprocessor, the analog signal input circuit comprising:

a full-range input circuit that is an input circuit provided between the variable analog signal source and a first input terminal of the multi-channel A/D converter, for producing a first input voltage, the full-range input circuit being configured so that the first input voltage becomes approximately equal to a full-scale input voltage of the multi-channel A/D converter when the voltage generated by the variable analog signal source has a maximum value; and an enlarged range input circuit that is an input circuit provided between the variable analog signal source and a second input terminal of the multi-channel A/D converter, for producing a second input voltage, the enlarged range input circuit being configured so that the second input voltage becomes approximately equal to the full-scale input voltage of the multi-channel A/D converter when the first input voltage is equal to a prescribed intermediate voltage that is lower than a maximum voltage, wherein the nonvolatile program memory stores programs to serve as:

error signal storing means activated when the voltage generated by the variable analog signal source is zero, for writing, as a first error voltage, a digital conversion value of a first input voltage to the data memory at a first address, and for writing, as a second error voltage, a digital conversion value of a second input voltage to the data memory at a second address;

gain compensating means for producing a second compensation voltage by calculating a second correction voltage by subtracting the second error voltage from a second present voltage that is a digital conversion value of a second input voltage and dividing the second correction voltage by a compensation gain or multiplying the second correction voltage by a compensation gain reciprocal, the compensation gain being set so that the second compensation voltage becomes approximately equal to a first correction voltage in a low voltage range obtained by subtracting the first error voltage from a first present voltage that is a digital conversion value of a first input voltage, the low voltage range being a range that is lower than the intermediate voltage; and selecting and switching means for selectively using the second compensation voltage if the first input voltage is in the low voltage range, selectively using the first correction voltage if the first input voltage is in a high voltage range that is a range higher than or equal to the intermediate voltage, and issuing an instruction to store a digital conversion value that is proportional to a selection result to the data memory at a prescribed address.

2. The vehicular electronic control unit according to claim 1, wherein:

the analog signal input circuit further comprises a first analog switch provided in the full-range input circuit and the enlarged range input circuit, for disconnecting the multi-channel A/D converter from the variable analog signal source or short-circuiting an input circuit between the variable analog signal source and the multi-channel A/D converter to thereby forcibly establish the same state as the voltage generated by the variable analog signal source is zero; and the nonvolatile program memory further store programs to serve as:

error signal input means for on/off-controlling the first analog switch in accordance with a first instruction signal supplied from the microprocessor, and for causing the error signal storing means to operate; and present status holding means for preventing data that was selected and stored in the data memory by the selecting and switching means from being changed and keeping the data at a value that was in storage immediately before a start of operation of the error signal input means while the error signal input means is in operation.

3. The vehicular electronic control unit according to claim 1, wherein:

the nonvolatile program memory further stores reference gain data that was stored in advance as a reference gain or a reference gain reciprocal and that is a statistical value such as an average or a center value of a plurality of samples obtained by calculating, for a large number of samples, a ratio of a measured value of the second correction voltage to a measured value of the first correction voltage in a state that the first input voltage was approximately equal to the intermediate voltage; and the compensation gain that is used by the gain compensating means is the reference gain.

4. A vehicular electronic control unit comprising:

an analog signal input circuit for producing voltages corresponding to a voltage generated by a variable analog signal source that is an exhaust gas sensor having an oxygen pump device and an oxygen concentration cell device;

a multi-channel A/D converter for converting the voltages produced by the analog signal input circuit into a conversion digital value;

a data memory;

a microprocessor for writing a digital conversion value produced by the multi-channel A/D converter to the data memory, the microprocessor having a capability of handling digital data having a longer bit length than a bit length corresponding to a resolution of the multi-channel A/D converter; and a nonvolatile program memory that cooperates with the microprocessor, the analog signal input circuit comprising:

a variable analog signal circuit comprising:

a pump current supply circuit for supplying a positive or negative pump current to the oxygen pump device;

a current detection resistor connected to the pump current supply circuit; and a bias voltage source for adding a bias voltage to a positive or negative signal voltage produced by differentially amplifying a voltage across the current detection resistor;

a full-range input circuit that is an input circuit provided between the variable analog signal source and a first input terminal of the multi-channel A/D converter, for producing a first input voltage, the full-range input circuit being configured so that the first input voltage becomes approximately equal to a full-scale input voltage of the multi-channel A/D converter when the voltage generated by the variable analog signal source has a maximum value; and an enlarged range input circuit that is an input circuit provided between the variable analog signal source and a second input terminal of the multi-channel A/D converter, for producing a second input voltage, the enlarged range input circuit being configured so that the second input voltage becomes approximately equal to the full-scale input voltage of the multi-channel A/D converter when the first input voltage is equal to a prescribed intermediate voltage that is lower than a maximum voltage, wherein the nonvolatile program memory stores programs to serve as:

error signal storing means activated when the voltage across the current detection resistor is zero and both of the first and second input voltages are equal to a prescribed bias voltage, for determining error voltages with respect to a reference bias voltage that is an intrinsic digital conversion value corresponding to a normal bias voltage that complies with a standard, the error signal storing means writing, as a first error voltage, a value obtained by subtracting the reference bias voltage from a digital conversion value of a first input voltage to the data memory at a first address, and writing, as a second error voltage, a value obtained by subtracting the reference bias voltage from a digital conversion value of a second input voltage to the data memory at a second address;

gain compensating means for producing a second compensation voltage by calculating a second correction voltage by subtracting the second error voltage from a second present voltage that is a digital conversion value of a second input voltage, dividing a second increment voltage obtained by subtracting the reference bias voltage from the second correction voltage by a compensation gain or multiplying the second increment voltage by a compensation gain reciprocal, and adding the reference bias voltage to a resulting product or quotient, the compensation gain being set so that the second compensation voltage becomes approximately equal to a first correction voltage in an intermediate range obtained by subtracting the first error voltage from a first present voltage that is a digital conversion value of a first input voltage, the intermediate range being a range that is lower than the intermediate voltage; and selecting and switching means for selectively using the second compensation voltage if the first input voltage is in the intermediate range, selectively using the first correction voltage if the first input voltage is in one of outside ranges that are outside the intermediate range, and issuing an instruction to store a digital conversion value that is proportional to a selection result to the data memory at a prescribed address.

5. The vehicular electronic control unit according to claim 4, wherein:

the variable analog signal circuit further comprises a power shutoff analog switch for forcibly making an input signal voltage of the full-range input circuit and the enlarged range input circuit equal to a voltage corresponding to the prescribed bias voltage by preventing a current flow between the pump current supply circuit and the current detection resistor or short-circuiting the current detection resistor;

the nonvolatile program memory further store programs to serve as:

error signal input means for on/off-controlling the power shutoff analog switch in accordance with a first instruction signal supplied from the microprocessor, and for causing the error signal storing means to operate; and a fuel cutting detecting means for judging that a fuel cutting state is established if fuel supply is not being done though control power is supplied immediately before a start of a drive, during a descending/coasting drive, or a decelerating/coasting drive or present status holding means for preventing data that was selected and stored in the data memory by the selecting and switching means from being changed and keeping the data at a value that was in storage immediately before a start of operation of the error signal input means while the error signal input means is in operation; and the error signal input means causes the error signal storing means to operate if the fuel cutting detecting means is detecting a fuel cutting state or if the present status holding means is in operation.

6. The vehicular electronic control unit according to claim 4, wherein:

the nonvolatile program memory further stores reference gain data that was stored in advance as a reference gain or a reference gain reciprocal and that is a statistical value such as an average or a center value of a plurality of samples obtained by calculating, for a large number of samples, a ratio of a measured value of a second increment voltage obtained by subtracting the reference bias voltage from the second correction voltage to a measured value of a first increment voltage obtained by subtracting the reference bias voltage from the first correction voltage in a state that the first input voltage was approximately equal to the intermediate voltage; and the compensation gain that is used by the gain compensating means is the reference gain.

7. The vehicular electronic control unit according to claim 3, wherein:

the nonvolatile program memory further stores a program to serve as variable weighted averaging means for calculating a weighted average voltage in a range where a curve of the second compensation voltage and a curve of the first correction voltage overlap with each other in such a manner as to decrease a weight coefficient ranging from 1 to 0 by which to multiply the second compensation voltage and to increase the weight coefficient ranging from 0 to 1 by which to multiply the first correction voltage as an absolute value of a difference between the second compensation voltage and the first correction voltage increases, and for employing the weighted average voltage as a second average voltage; and the selecting and switching means selectively uses the second average voltage instead of the second compensation voltage.

8. The vehicular electronic control unit according to claim 6, wherein:

the nonvolatile program memory further stores a program to serve as variable weighted averaging means for calculating a weighted average voltage in a range where a curve of the second compensation voltage and a curve of the first correction voltage overlap with each other in such a manner as to decrease a weight coefficient ranging from 1 to 0 by which to multiply the second compensation voltage and to increase the weight coefficient ranging from 0 to 1 by which to multiply the first correction voltage as an absolute value of a difference between the second compensation voltage and the first correction voltage increases, and for employing the weighted average voltage as a second average voltage; and the selecting and switching means selectively uses the second average voltage instead of the second compensation voltage.

9. The vehicular electronic control unit according to claim 1, wherein:

the nonvolatile program memory further stores programs to serve as:

intermediate signal storing means activated when the first input voltage is forcibly set at a value that is approximately equal to the intermediate voltage, for writing, as a first intermediate voltage, a digital conversion value of the first input voltage to the data memory at a third address, and for writing, as a second intermediate voltage, a digital conversion value of a second input voltage to the data memory at a fourth address; and gain calculating means for calculating and storing a compensation gain K that is a ratio of a difference between the second intermediate voltage and the second error voltage to a difference between the first intermediate voltage and the first error voltage or a compensation gain reciprocal H that is a reciprocal of the compensation gain K; and the compensation gain that is used by the gain compensating means is the compensation gain K or the compensation gain reciprocal H calculated by the gain calculating means.

10. The vehicular electronic control unit according to claim 9, wherein:

the analog signal input circuit further comprises:

intermediate voltage generation circuit for generating a prescribed intermediate signal voltage that is lower than the maximum value of the voltage generated by the variable analog signal source; and a second analog switch provided in the full-range input circuit and the enlarged range input circuit, for applying the intermediate signal voltage generated by the intermediate voltage generation circuit to the first and second input terminals of the multi-channel A/D converter via the full-range input circuit and the enlarged range input circuit instead of the voltage generated by the variable analog signal source; and the nonvolatile program memory further stores programs to serve as:

intermediate signal input means for on/off-controlling the second analog switch in accordance with a second instruction signal supplied from the microprocessor, for and causing the intermediate signal storing means to operate; and present status holding means for preventing data that was selected and stored in the data memory by the selecting and switching means from being changed and keeps the data at a value that was in storage immediately before a start of operation of the intermediate signal input means while the intermediate signal input means is in operation.

11. The vehicular electronic control unit according to claim 4, wherein:

the nonvolatile program memory further stores programs to serve as:

intermediate signal storing means activated when the first input voltage is forcibly set at a value that is approximately equal to the intermediate voltage, for writing, as a first intermediate voltage, a value obtained by subtracting the reference bias voltage from a digital conversion value of the first input voltage to the data memory at a third address, and for writing, as a second intermediate voltage, a value obtained by subtracting the reference bias voltage from a digital conversion value of a second input voltage to the data memory at a fourth address; and gain calculating means for calculating and storing a compensation gain K (second difference voltage/first difference voltage) that is a ratio of second difference voltage between the second intermediate voltage and the second error voltage to first difference voltage between the first intermediate voltage and the first error voltage or a compensation gain reciprocal H (first difference voltage/second difference voltage) that is a reciprocal of the compensation gain K; and the compensation gain that is used by the gain compensating means is the compensation gain K or the compensation gain reciprocal H calculated by the gain calculating means.

12. The vehicular electronic control unit according to claim 11, wherein:

the variable analog signal circuit further comprises a current reduction detection analog switch connected in series to a resistor that is parallel with the current detection resistor, for forcibly making an input signal voltage of the full-range input circuit and the enlarged range input circuit equal to a voltage corresponding to the intermediate voltage by decreasing a combined current detection resistance when a maximum current is flowing; and the nonvolatile program memory further stores a program to serve as:

a fuel cutting detecting means for judging that a fuel cutting state is established if fuel supply is not being done though control power is supplied immediately before a start of a drive, during a descending/coasting drive, or a decelerating/coasting drive; and current decrease detection instructing means for closing the current decrease detection analog switch using a second instruction signal supplied from the microprocessor and causing the intermediate signal storing means to operate when the fuel cutting detecting means is detecting a fuel cutting state.

13. The vehicular electronic control unit according to claim 12, wherein the nonvolatile program memory further stores a program to serve as intermediate signal checking means for judging whether a sum of the second intermediate voltage stored by the intermediate signal storing means and the reference bias voltage is within a designated range that is lower than or equal to a maximum output voltage of the multi-channel A/D converter and higher than or equal to a designated output voltage that is a little lower than the maximum output voltage, and for validating the first and second intermediate voltages stored by the intermediate signal storing means and causing the gain calculating means to calculate a gain if the sum is within the designated range.

14. The vehicular electronic control unit according to claim 1, wherein:

the nonvolatile program memory further stores programs to serve as:

intermediate signal storing means activated when the first input voltage is approximately equal to the intermediate voltage, for writing, as a first intermediate voltage, a digital conversion value of the first input voltage to the data memory at a third address, and for writing, as a second intermediate voltage, a digital conversion value of a second input voltage to the data memory at a fourth address;

gain calculating means for calculating and storing a compensation gain K (second difference voltage/first difference voltage) that is a ratio of second difference voltage between the second intermediate voltage and the second error voltage to first difference voltage between the first intermediate voltage and the first error voltage or a compensation gain reciprocal H (first difference voltage/second difference voltage) that is a reciprocal of the compensation gain K; and intermediate signal checking means for judging whether the second intermediate voltage that was stored by the intermediate signal storing means is within a designated range that is lower than or equal to a maximum output voltage of the multi-channel A/D converter and higher than or equal to a designated output voltage that is a little lower than the maximum output voltage, and for validating the first and second intermediate voltages that were stored by the intermediate signal storing means and causing the gain calculating means to calculate a gain if the second intermediate voltage is within the designated range; and the compensation gain that is used by the gain compensating means is the compensation gain K or the compensation gain reciprocal H calculated by the gain calculating means.

15. The vehicular electronic control unit according to claim 14, wherein:

the nonvolatile program memory further stores reference gain data that was stored in advance as a reference gain or a reference gain reciprocal and that is a statistical value such as an average or a center value of a plurality of samples obtained by calculating, for a large number of samples, a ratio of a measured value of the second correction voltage to a measured value of the first correction voltage in a state that the first input voltage was approximately equal to the intermediate voltage; and the nonvolatile program memory further stores programs to serve as:

compensation storage judging means for judging whether the gain calculating means calculated and stored a compensation gain K or a compensation gain reciprocal H;

tentative gain compensating means activated instead of the gain compensating means if a judgment result of the compensation storage judging means is negative, for calculating a second estimate voltage by subtracting the second error voltage from a second present voltage that is a digital conversion value of a second input voltage and dividing a resulting second correction voltage by the reference gain or multiplying the difference by the reference gain reciprocal; and tentative selecting and switching means activated instead of the selecting and switching means if the judgment result of the compensation storage judging means is negative, for selectively using the second estimate voltage if the first input voltage is in the low voltage range, and selectively using a first correction voltage obtained by subtracting the first error voltage from a first present voltage that is a digital conversion value of a first input voltage if the first input voltage is in the high voltage range, and for issuing an instruction to store a digital value that is proportional to a selection result to the data memory at the prescribed address.

16. The vehicular electronic control unit according to claim 4, wherein:

the nonvolatile program memory further stores programs to serve as:

intermediate signal storing means activated when the first input voltage is approximately equal to the intermediate voltage, for writing, as a first intermediate voltage, a value obtained by subtracting the reference bias voltage from a digital conversion value of the first input voltage to the data memory at a third address, and for writing, as a second intermediate voltage, a value obtained by subtracting the reference bias voltage from a digital conversion value of a second input voltage to the data memory at a fourth address;

gain calculating means for calculating and storing a compensation gain K (second difference voltage/first difference voltage) that is a ratio of second difference voltage between the second intermediate voltage and the second error voltage to first difference voltage between the first intermediate voltage and the first error voltage or a compensation gain reciprocal H (first difference voltage/second difference voltage) that is a reciprocal of the compensation gain K; and intermediate signal checking means for judging whether a sum of the second intermediate voltage stored by the intermediate signal storing means and the reference bias voltage is within a designated range that is lower than or equal to a maximum output voltage of the multi-channel A/D converter and higher than or equal to a designated output voltage that is a little lower than the maximum output voltage, and for validating the first and second intermediate voltages that were stored by the intermediate signal storing means and causing the gain calculating means to calculate a gain if the sum is within the designated range; and the compensation gain that is used by the gain compensating means is the compensation gain K or the compensation gain reciprocal H calculated by the gain calculating means.

17. The vehicular electronic control unit according to claim 13, wherein:

the nonvolatile program memory further stores reference gain data that was stored in advance as a reference gain or a reference gain reciprocal and that is a statistical value such as an average or a center value of a plurality of samples obtained by calculating, for a large number of samples, a ratio of a measured value of a second increment voltage obtained by subtracting the reference bias voltage from the second correction voltage to a measured value of a first increment value obtained by subtracting the reference bias voltage from the first correction voltage in a state that the first input voltage was approximately equal to the intermediate voltage; and the nonvolatile program memory further stores programs to serve as:

compensation storage judging means for judging whether the gain calculating means calculated and stored a compensation gain K or a compensation gain reciprocal H;

tentative gain compensating means activated instead of the gain compensating means if a judgment result of the compensation storage judging means is negative, for calculating a second estimate voltage by calculating a second correction voltage by subtracting the second error voltage from a second present voltage that is a digital conversion value of a second input voltage, dividing, by the reference gain, a second increment voltage obtained by subtracting the reference bias voltage from the second correction voltage or multiplying the second increment voltage by the reference gain reciprocal, and adding the reference bias voltage to a resulting quotient or product; and tentative selecting and switching means activated instead of the selecting and switching means if the judgment result of the compensation storage judging means is negative, for selectively using the second estimate voltage if the first input voltage is in the intermediate range, and selectively using a first correction voltage obtained by subtracting the first error voltage from a first present voltage that is a digital conversion value of a first input voltage if the first input voltage is in one of the outside ranges, and for issuing an instruction to store a digital value that is proportional to a selection result to the data memory at the prescribed address, selection-using the first correction voltage.

18. The vehicular electronic control unit according to claim 16, wherein:

the nonvolatile program memory further stores reference gain data that was stored in advance as a reference gain or a reference gain reciprocal and that is a statistical value such as an average or a center value of a plurality of samples obtained by calculating, for a large number of samples, a ratio of a measured value of a second increment voltage obtained by subtracting the reference bias voltage from the second correction voltage to a measured value of a first increment value obtained by subtracting the reference bias voltage from the first correction voltage in a state that the first input voltage was approximately equal to the intermediate voltage; and the nonvolatile program memory further stores programs to serve as:

compensation storage judging means for judging whether the gain calculating means calculated and stored a compensation gain K or a compensation gain reciprocal H;

tentative gain compensating means activated instead of the gain compensating means if a judgment result of the compensation storage judging means is negative, for calculating a second estimate voltage by calculating a second correction voltage by subtracting the second error voltage from a second present voltage that is a digital conversion value of a second input voltage, dividing, by the reference gain, a second increment voltage obtained by subtracting the reference bias voltage from the second correction voltage or multiplying the second increment voltage by the reference gain reciprocal, and adding the reference bias voltage to a resulting quotient or product; and tentative selecting and switching means activated instead of the selecting and switching means if the judgment result of the compensation storage judging means is negative, for selectively using the second estimate voltage if the first input voltage is in the intermediate range, and selectively using a first correction voltage obtained by subtracting the first error voltage from a first present voltage that is a digital conversion value of a first input voltage if the first input voltage is in one of the outside ranges, and for issuing an instruction to store a digital value that is proportional to a selection result to the data memory at the prescribed address, selection-using the first correction voltage.

19. The vehicular electronic control unit according to claim 16, wherein:

the nonvolatile program memory further stores a program to serve as variable weighted averaging means for calculating a weighted average voltage in a range where a curve of the second estimate voltage and a curve of the first correction voltage overlap with each other in such a manner as to decrease a weight coefficient ranging from 1 to 0 by which to multiply the second estimate voltage and to increase the weight coefficient ranging from 0 to 1 by which to multiply the first correction voltage as an absolute value of a difference between the second estimate voltage and the first correction voltage increases, and for employing the weighted average voltage as a second average voltage; and the tentative selecting and switching means selectively uses the second average voltage instead of the second estimate voltage.

20. The vehicular electronic control unit according to claim 18, wherein:

the nonvolatile program memory further stores a program to serve as variable weighted averaging means for calculating a weighted average voltage in a range where a curve of the second estimate voltage and a curve of the first correction voltage overlap with each other in such a manner as to decrease a weight coefficient ranging from 1 to 0 by which to multiply the second estimate voltage and to increase the weight coefficient ranging from 0 to 1 by which to multiply the first correction voltage as an absolute value of a difference between the second estimate voltage and the first correction voltage increases, and for employing the weighted average voltage as a second average voltage; and the tentative selecting and switching means selectively uses the second average voltage instead of the second estimate voltage.

* * * * *